United States Patent
Okamoto

(10) Patent No.: US 8,487,375 B2
(45) Date of Patent: Jul. 16, 2013

(54) SEMICONDUCTOR DEVICE AND METHOD OF MANUFACTURING SEMICONDUCTOR DEVICE

(75) Inventor: Naoya Okamoto, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 390 days.

(21) Appl. No.: 12/911,213

(22) Filed: Oct. 25, 2010

(65) Prior Publication Data
US 2011/0115025 A1 May 19, 2011

(30) Foreign Application Priority Data
Nov. 17, 2009 (JP) .................................. 2009-261830

(51) Int. Cl.
*H01L 51/00* (2006.01)

(52) U.S. Cl.
USPC ........... 257/335; 257/194; 257/205; 257/392; 257/E21.293; 257/E21.403; 257/E21.576; 257/E21.631; 257/E29.027; 257/E29.252

(58) Field of Classification Search
USPC ................. 257/294, 205, 335, 392, E21.293, 257/403, 576, 631, 29.027, 252
See application file for complete search history.

(56) References Cited

U.S. PATENT DOCUMENTS

| | | | | |
|---|---|---|---|---|
| 5,514,605 | A * | 5/1996 | Asai et al. | 438/172 |
| 6,207,486 | B1 * | 3/2001 | Nishiyama | 438/216 |
| 6,787,462 | B2 * | 9/2004 | Iijima et al. | 438/680 |
| 7,829,957 | B2 * | 11/2010 | Kato et al. | 257/392 |
| 2006/0255403 | A1 * | 11/2006 | Asano et al. | 257/335 |
| 2009/0001478 | A1 | 1/2009 | Okamoto | |
| 2009/0061576 | A1 * | 3/2009 | Okamoto | 438/191 |
| 2009/0108357 | A1 | 4/2009 | Takagi | |
| 2009/0189205 | A1 | 7/2009 | Ohki | |
| 2011/0241074 | A1 * | 10/2011 | Okamoto | 257/194 |

FOREIGN PATENT DOCUMENTS

| | | |
|---|---|---|
| CN | 101335247 | 12/2008 |
| JP | 2009-33097 A1 | 2/2009 |
| JP | 2009-111016 A1 | 5/2009 |
| JP | 2009-164301 A1 | 7/2009 |
| JP | 2009-182069 A1 | 8/2009 |

OTHER PUBLICATIONS

First Office Action issued in counterpart application No. 201010552511.6 by The State Intellectual Property Office of the People's Republic of China, issued Sep. 24, 2012 with English translation (14 pages).

* cited by examiner

Primary Examiner — Michael Lebentritt
(74) Attorney, Agent, or Firm — Kratz, Quintos & Hanson, LLP

(57) ABSTRACT

A semiconductor device includes a compound semiconductor layer provided over a substrate, a plurality of source electrodes and a plurality of drain electrodes provided over the compound semiconductor layer, a plurality of first vias each of which is configured to pass through the compound semiconductor layer and be coupled to a corresponding one of the plurality of source electrodes, a plurality of second vias each of which is configured to pass through the compound semiconductor layer and be coupled to a corresponding one of the plurality of drain electrodes, a common source wiring line configured to be coupled to the plurality of first vias and be buried in the substrate, and a common drain wiring line configured to be coupled to the plurality of second vias and be buried in the substrate.

14 Claims, 54 Drawing Sheets

SEMICONDUCTOR DEVICE AND METHOD OF MANUFACTURING SEMICONDUCTOR DEVICE

CROSS-REFERENCE TO RELATED APPLICATION

The present application is based upon and claims the benefit of priority of the prior Japanese Patent Application No. 2009-261830, filed on Nov. 17, 2009, the entire contents of which are incorporated herein by reference.

FIELD

The embodiments discussed herein are related to a semiconductor device and a method of manufacturing the semiconductor device.

BACKGROUND

GaN, which is a nitride semiconductor, has a band gap that causes blue light to be emitted. The band gap of the GaN may be controlled by forming a mixed crystal of the GaN using InN or AlN, for example. The GaN is therefore used as a semiconductor device for light emission, such as a blue light emitting diode or a laser diode.

Since the GaN has a dielectric strength higher than the dielectric strength of Si or GaAs, applicability of the GaN as a high-voltage semiconductor device, such as a high electron mobility transistor (HEMT), is also expected.

SUMMARY

According to an aspect of an embodiment, a semiconductor device includes a compound semiconductor layer provided over a substrate, a plurality of source electrodes and a plurality of drain electrodes provided over the compound semiconductor layer, a plurality of first vias each of which is configured to pass through the compound semiconductor layer and be coupled to a corresponding one of the plurality of source electrodes, a plurality of second vias each of which is configured to pass through the compound semiconductor layer and be coupled to a corresponding one of the plurality of drain electrodes, a common source wiring line configured to be coupled to the plurality of first vias and be buried in the substrate, and a common drain wiring line configured to be coupled to the plurality of second vias and be buried in the substrate.

According to another aspect of an embodiment, a method of manufacturing a semiconductor device includes forming a compound semiconductor layer over a substrate, forming a plurality of source electrodes and a plurality of drain electrodes over the compound semiconductor layer, forming a plurality of through-holes and a wiring trench in the substrate, the plurality of through-holes being configured to pass through the compound semiconductor layer, the wiring trench being configured to be coupled to the plurality of through-holes, and forming a plurality of first vias, a common source wiring line, a plurality of second vias, and a common drain wiring line by burying the plurality of through-holes and the wiring trench with a metal, each of the plurality of first vias being configured to be coupled to a corresponding one of the plurality of source electrodes, the common source wiring line being configured to be coupled to the plurality of first vias, each of the plurality of second vias being configured to be coupled to a corresponding one of the plurality of drain electrodes, the common drain wiring line being configured to be coupled to the plurality of second vias.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of the present application are described in detail below with reference to the accompanying drawings.

A first embodiment of the present application is described below with reference to FIGS. 1, 2A and 2B, 3AA to 3AZ, 3BA to 3BK, 4, 5A and 5B, 6, and 7.

Figure 1:
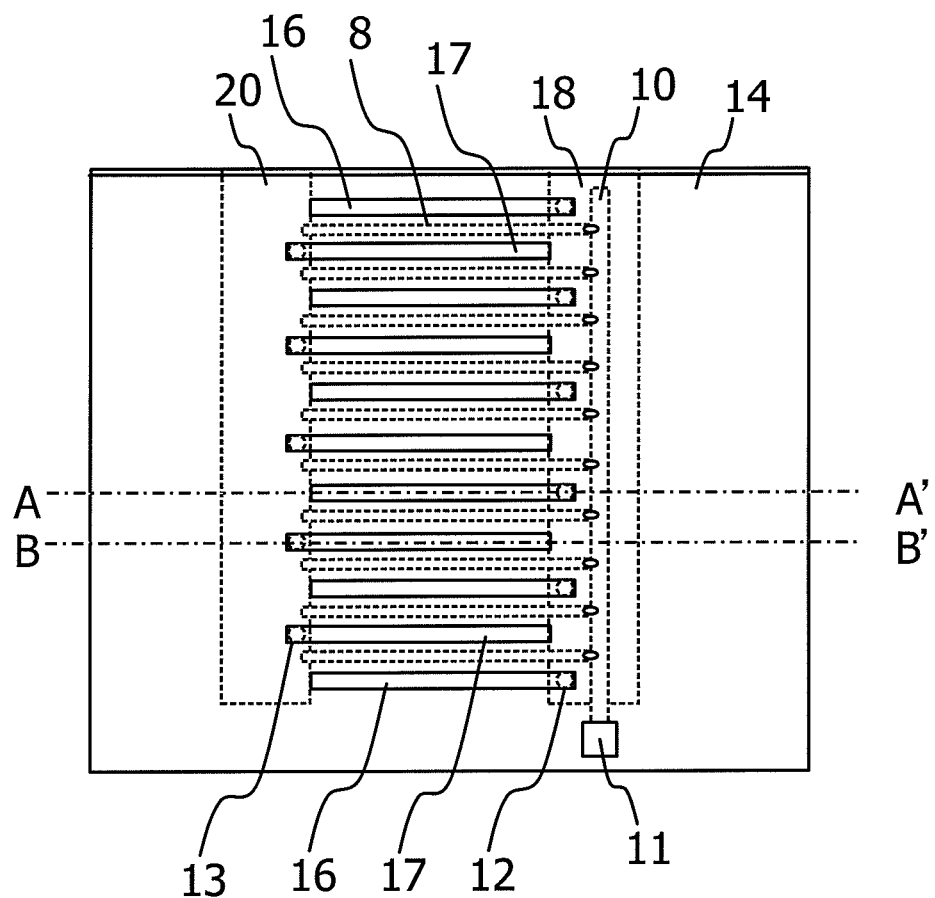
FIG. 1 is a plane view illustrating an example of a semiconductor device according to a first embodiment.
Figure 2A:
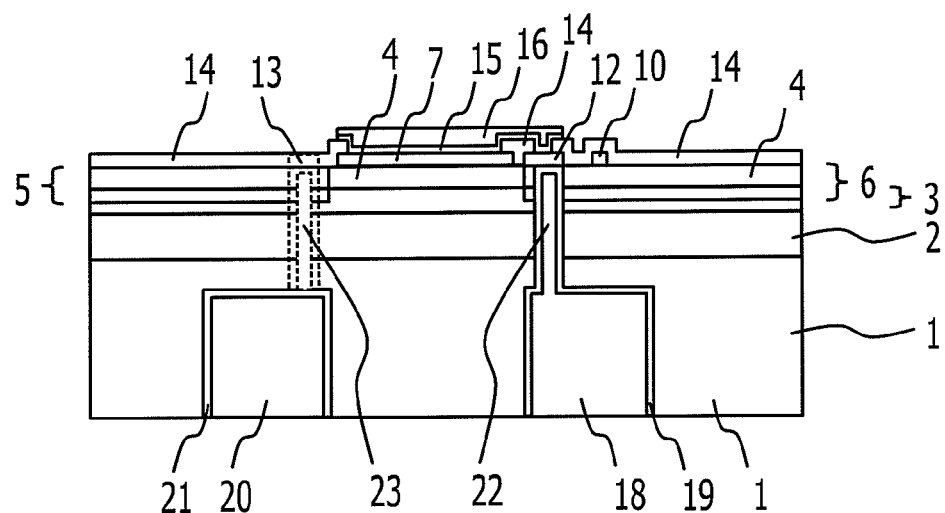
FIGS. 2A and 2B are sectional views illustrating the example of the semiconductor device according to the first embodiment.
Figure 2B:
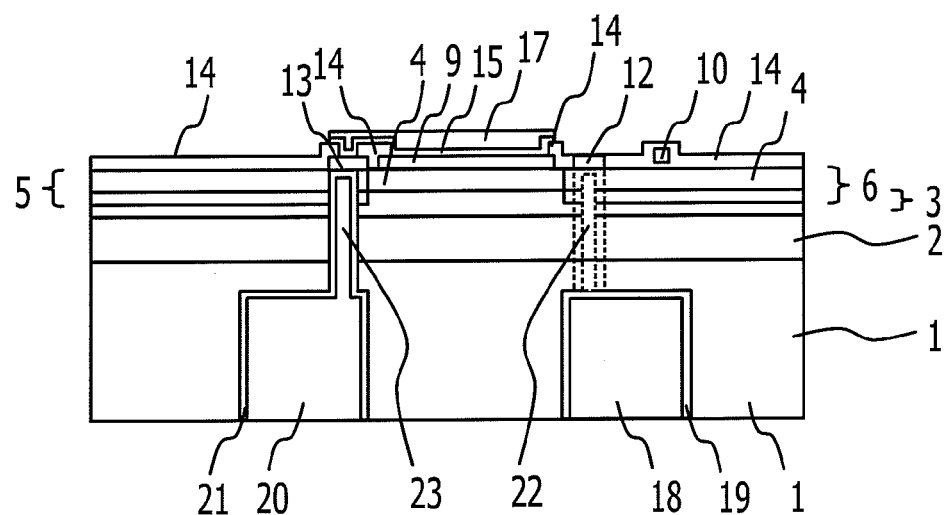

FIGS. 1, 2A, and 2B illustrate an example of a semiconductor device according to the first embodiment. FIG. 1 is a plane view of the semiconductor device. FIG. 2A illustrates a cross section taken along a dashed-dotted line A-A' in FIG. 1 (hereinafter referred to as a section A-A'). FIG. 2B illustrates a cross section taken along a dashed-dotted line B-B' in FIG. 1 (hereinafter referred to as a section B-B'). Dashed lines in FIG. 1 indicate regions that may not be seen when looking downward from above the semiconductor device. Dashed lines in FIG. 2A indicate portions that may not appear in the section A-A'. Dashed lines in FIG. 2B indicate portions that may not appear in the section B-B'.

In the first embodiment, as illustrated in FIGS. 2A and 2B, a buffer layer 2, a non-doped GaN layer 3, and an n-type AlGaN layer 4 doped with Si are sequentially formed over a semi-insulating SiC substrate 1 with a thickness of approximately 150 μm so that the buffer layer 2 has a thickness of approximately 1 μm, the non-doped GaN layer 3 has a thickness of approximately 0.5 μm, and the n-type AlGaN layer 4 has a thickness of approximately 25 nm, for example.

The non-doped GaN layer 3 and the n-type AlGaN layer 4 include inactive regions 5 and 6 for inactivating a two-dimensional electron gas (2DEG). In the first embodiment, the buffer layer 2, the non-doped GaN layer 3, and the n-type AlGaN layer 4 are referred to as a compound semiconductor layer.

A source electrode 7, a drain electrode 9, a common gate wiring line 10, and etching stoppers 12 and 13 are formed on the n-type AlGaN layer 4.

For example, a SiN layer is formed over the n-type AlGaN layer 4 as a passivation film 14.

The source electrode 7 and the etching stopper 12 are electrically coupled to a source wiring line 16 through a seed metal layer 15. The drain electrode 9 and the etching stopper 13 are electrically coupled to a drain wiring line 17 through the seed metal layer 15.

The semiconductor device according to the first embodiment includes a plurality of sets of the elements described above. As illustrated in FIG. 1, the source wiring lines 16 and the drain wiring lines 17 are alternately arranged over the compound semiconductor layer. Each of gate electrodes 8 covered with the passivation film 14 is provided between each of the source wiring lines 16 and each of the drain wiring lines 17 and coupled to the common gate wiring line 10 covered with the passivation film 14. The common gate wiring line 10 is coupled to a gate terminal 11 exposed through the passivation film 14.

In the back surface of the semi-insulating SiC substrate 1, a common source wiring line 18 is formed to be buried through a seed metal layer 19, and a common drain wiring line 20 is formed to be buried through a seed metal layer 21. The common source wiring line 18 is electrically coupled to the source electrodes 7 through vias 22. The common drain wiring line 20 is electrically coupled to the drain electrodes 9 through vias 23. The via 22 is formed to be buried in a via hole that passes through the seed metal layer 19, the buffer layer 2, the non-doped GaN layer 3, and the n-type AlGaN layer 4. The via 23 is formed to be buried in a via hole that passes through the seed metal layer 21, the buffer layer 2, the non-doped GaN layer 3, and the n-type AlGaN layer 4.

Due to the configuration described above, a sum total of current that flows through the source wiring lines 16 is applied to the common source wiring line 18, and a sum total of current that flows through the drain wiring lines 17 is applied to the common drain wiring line 20. To reduce the resistances of the common source wiring line 18 and the common drain wiring line 20, it is preferable that the common source wiring line 18 has a cross-sectional area larger than the cross-sectional area of the source wiring line 16 and that the common drain wiring line 20 has a cross-sectional area larger than the cross-sectional area of the drain wiring line 17.

In the first embodiment, the common source wiring line 18 and the common drain wiring line 20 are formed in the back surface of the semi-insulating SiC substrate 1 so that the common source wiring line 18 and the common drain wiring line 20 are buried in the semi-insulating SiC substrate 1. This configuration may prevent the evenness of the semiconductor device from being damaged when the cross-sectional areas of the source wiring line 16 and the drain wiring line 17 increase. When the evenness of the semiconductor device may be maintained, possible cracks caused in handling the semiconductor device in a manufacturing process, a testing process, or the like, may be reduced or prevented from occurring. As a result, the manufacturing yield may be increased.

An example of a method of manufacturing the semiconductor device according to the first embodiment is described below with reference to FIGS. 3AA to 3AZ, and 3BA to 3BK.

Figure 3A:
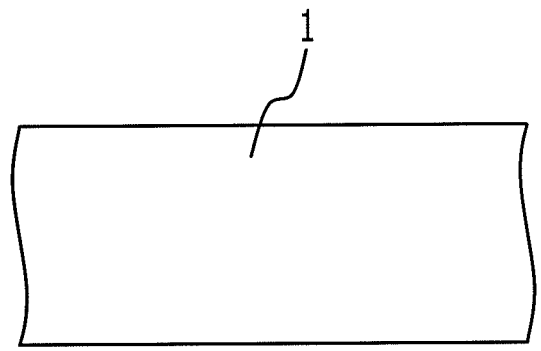
FIGS. 3AA to 3AZ, and 3BA to 3BK are sectional process views illustrating an example of a method of manufacturing the semiconductor device according to the first embodiment.
Figure 3A:
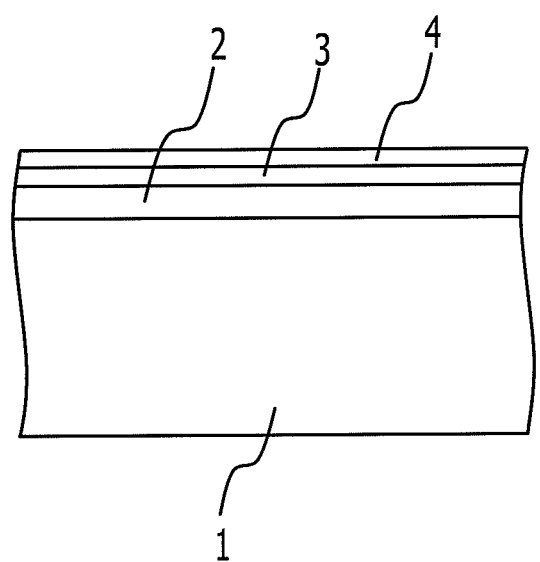
Figure 3A:
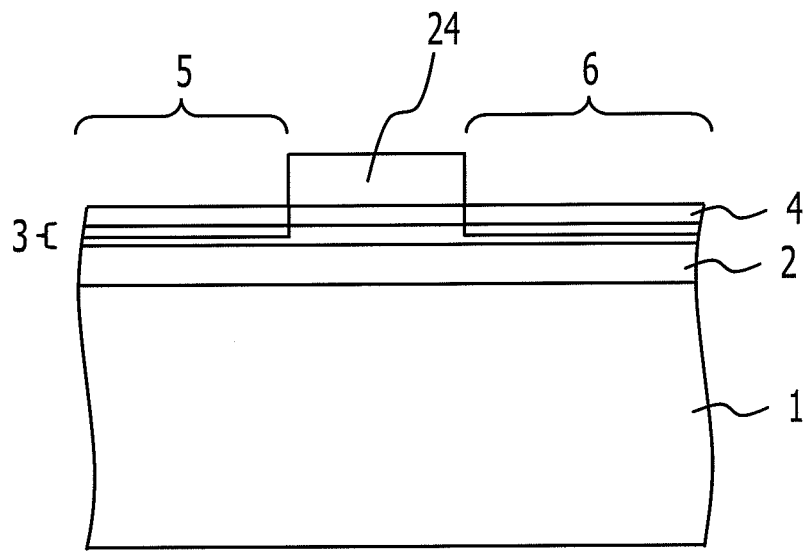
Figure 3A:
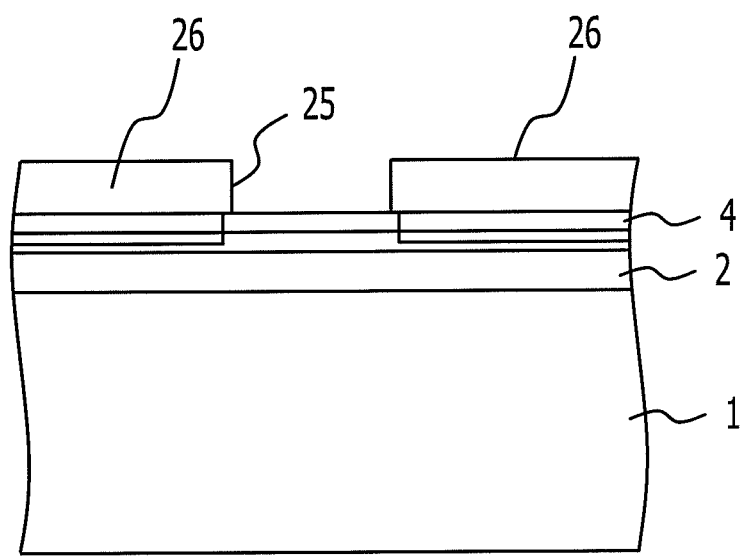
Figure 3A:
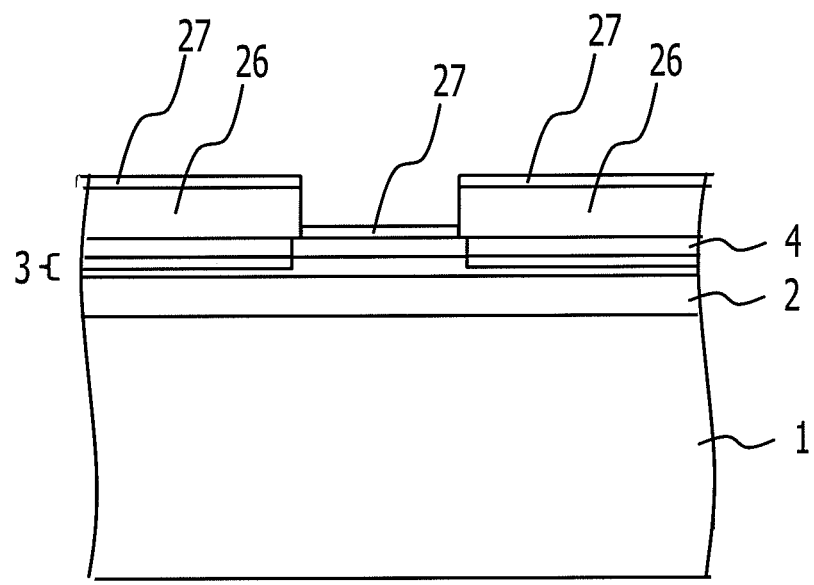
Figure 3A:
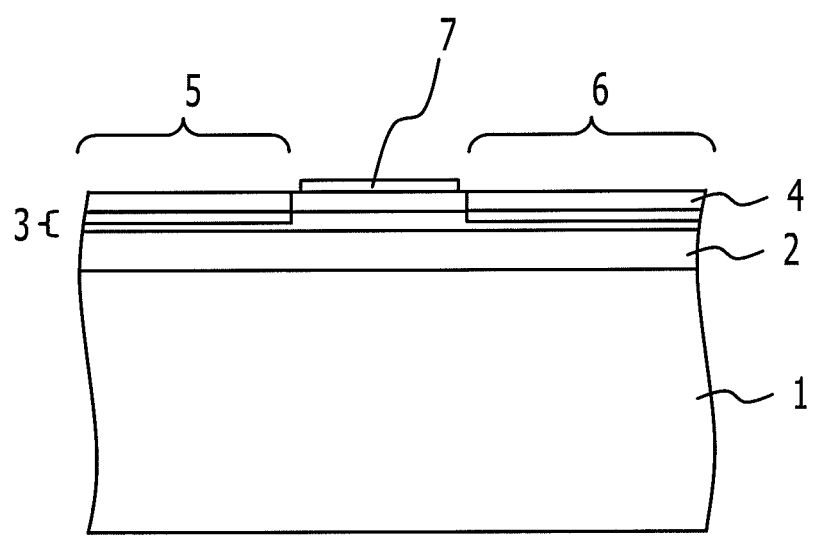
Figure 3A:
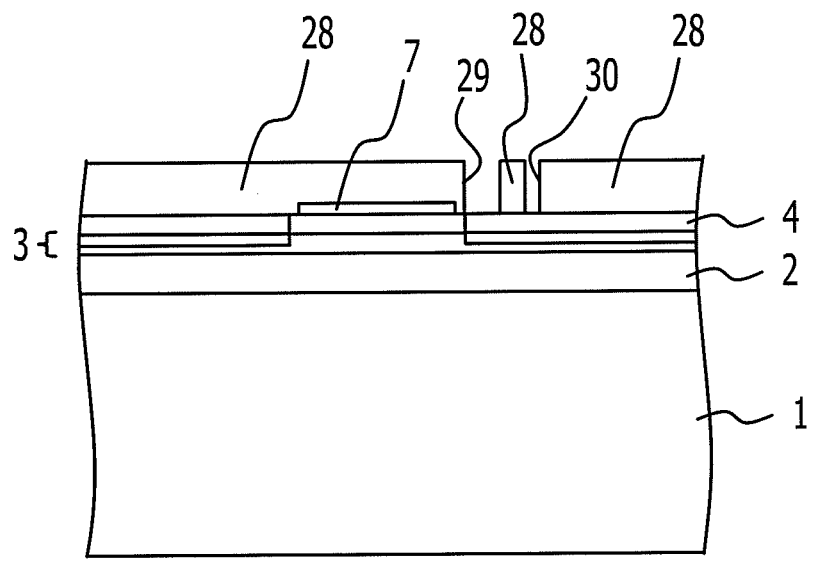
Figure 3A:
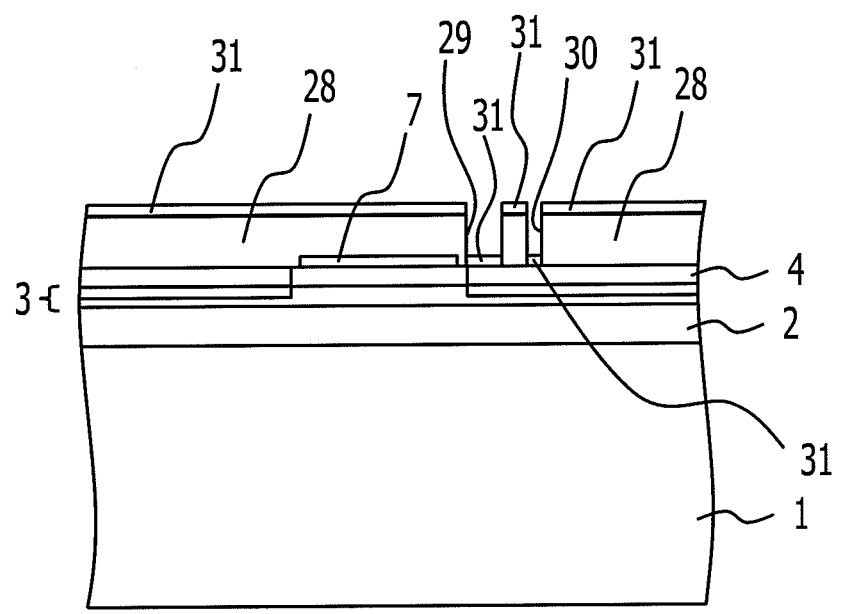
Figure 3A:
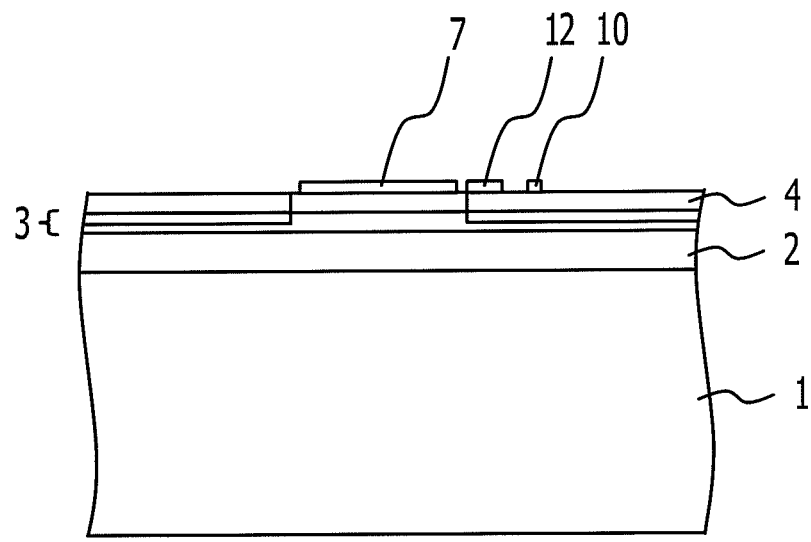
Figure 3A:
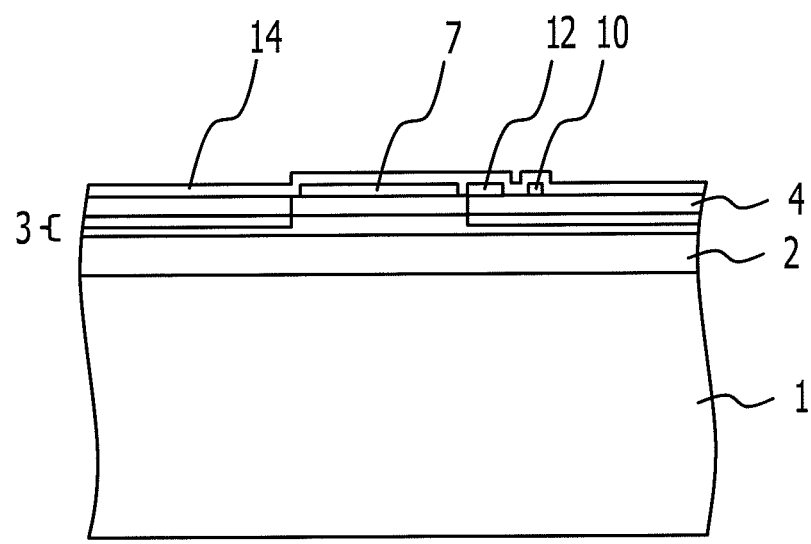
Figure 3A:
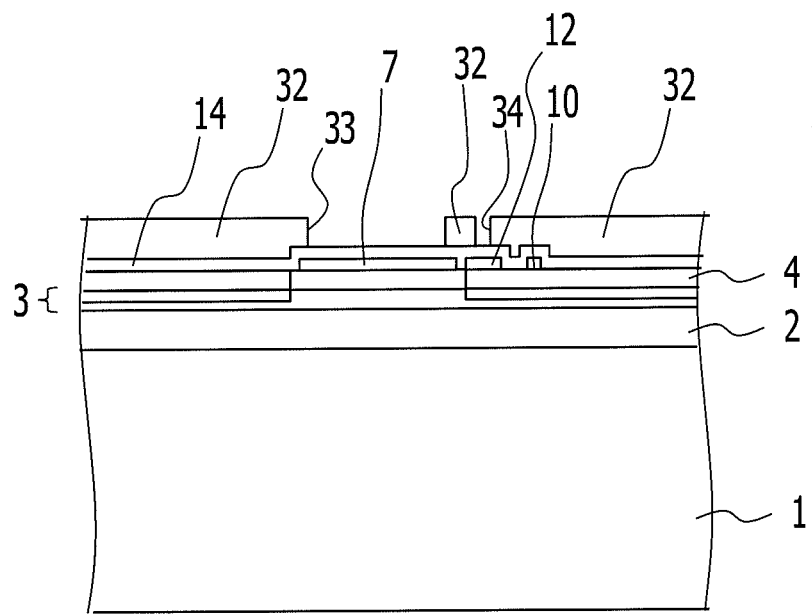
Figure 3A:
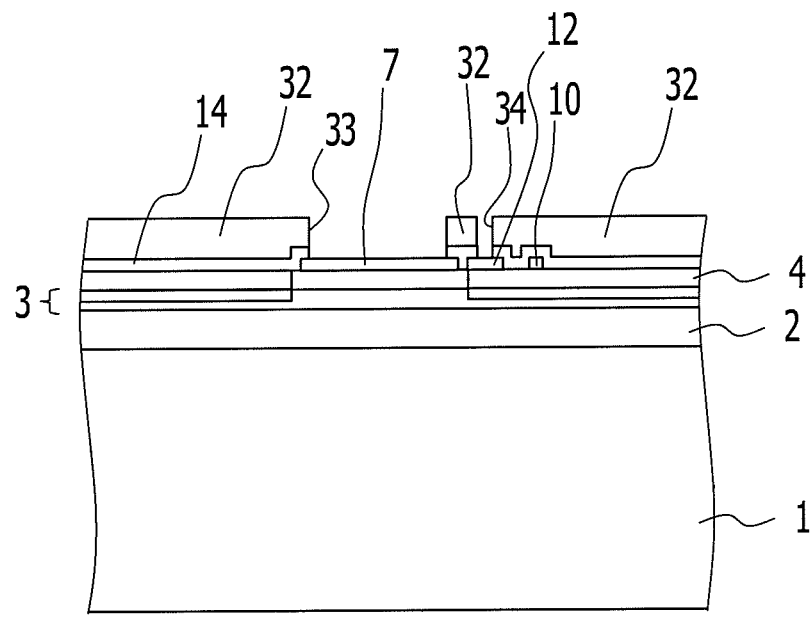
Figure 3A:
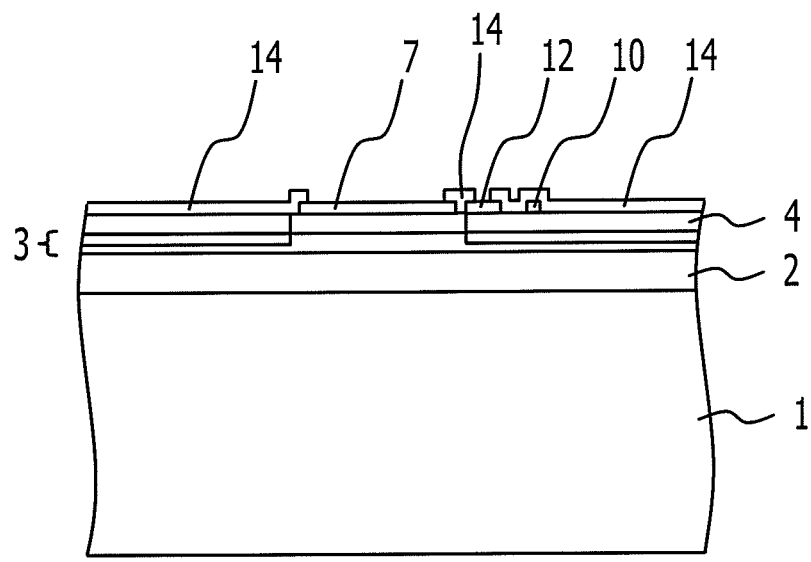
Figure 3A:
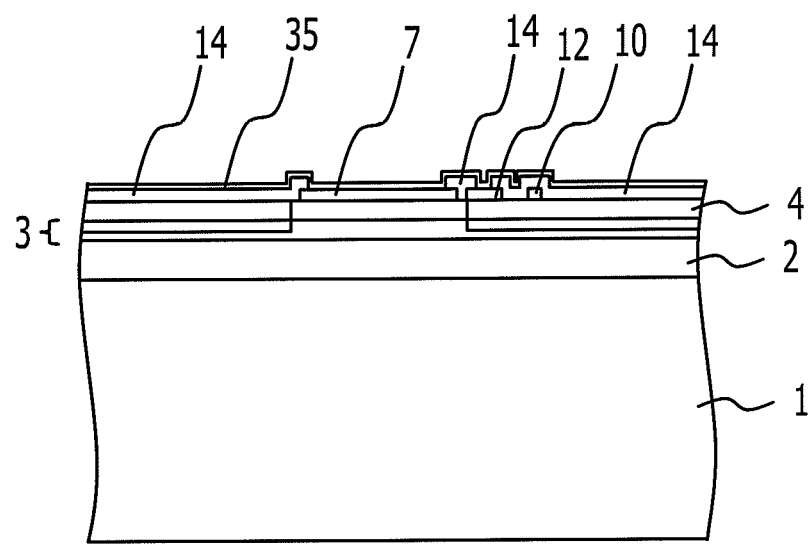
Figure 3A:
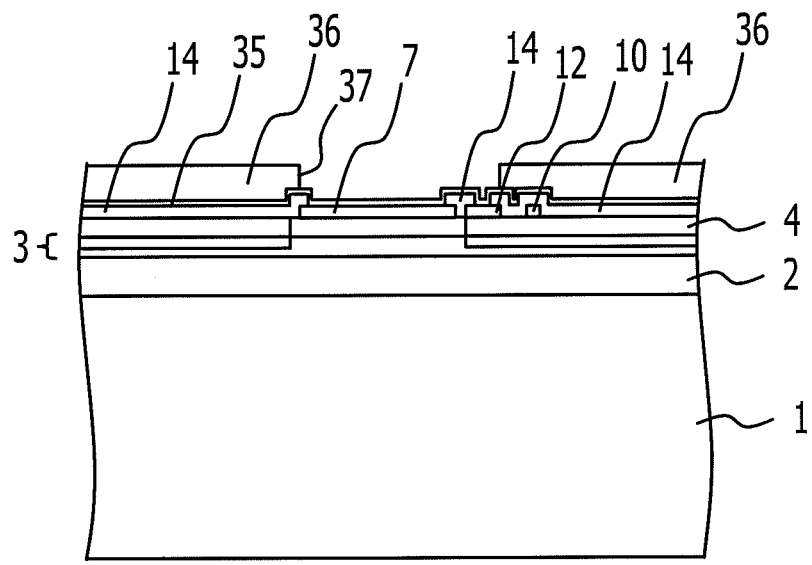
Figure 3A:
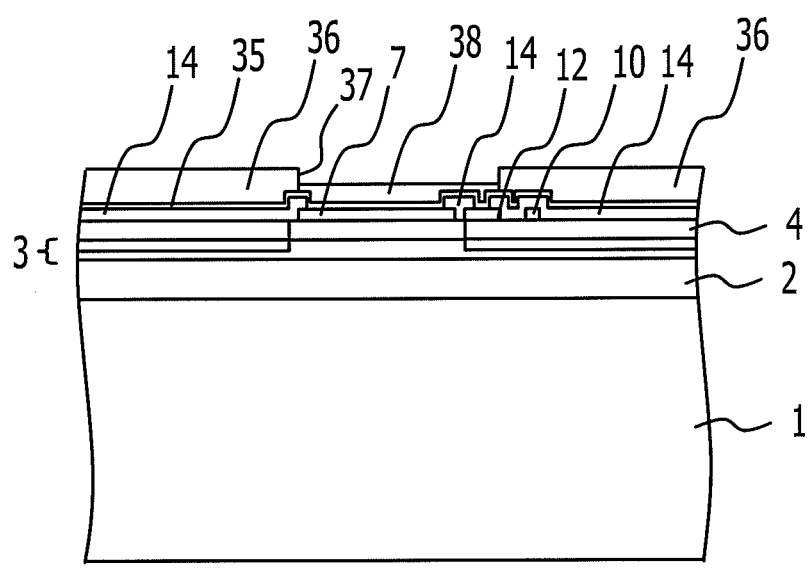
Figure 3A:
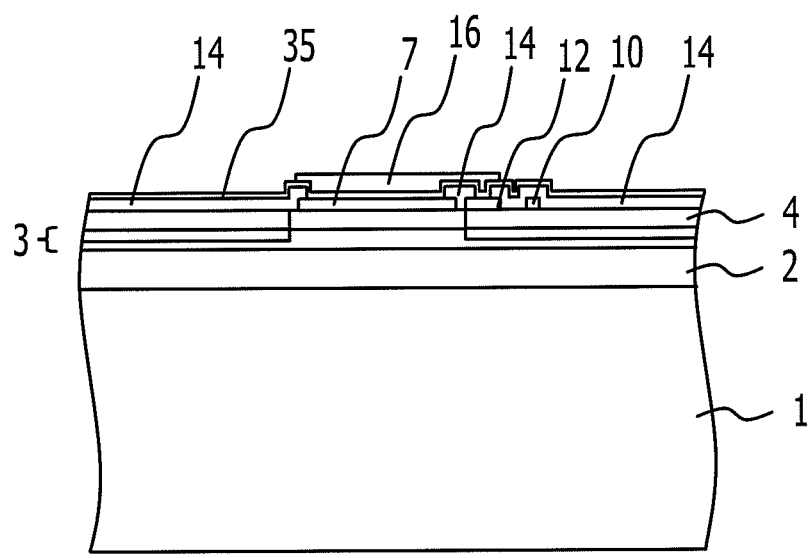
Figure 3A:
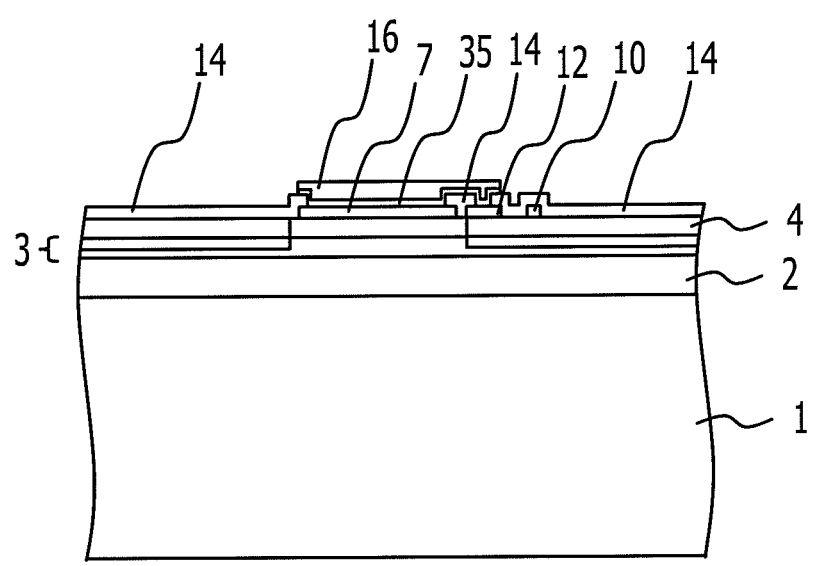
Figure 3A:
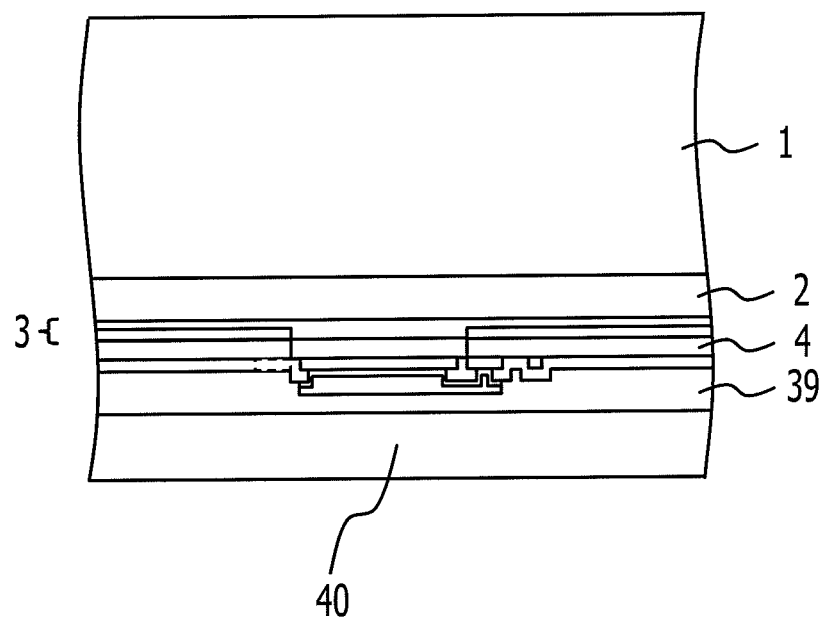
Figure 3A:
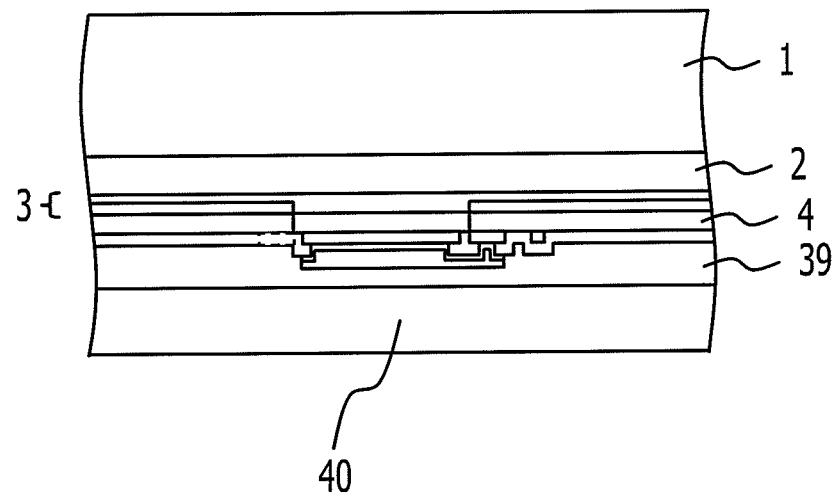
Figure 3A:
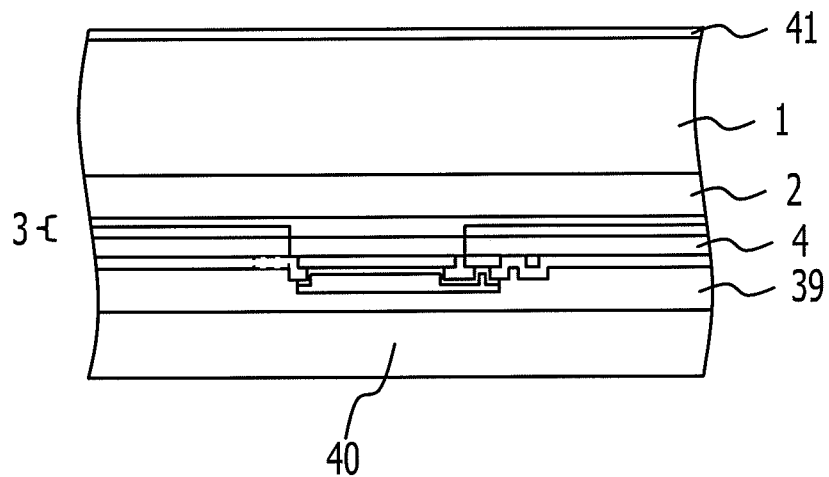
Figure 3A:
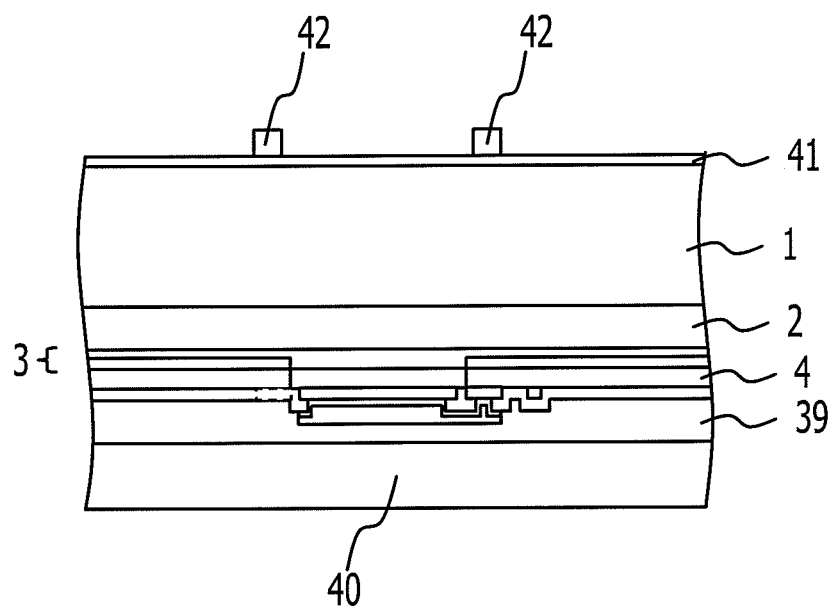
Figure 3A:
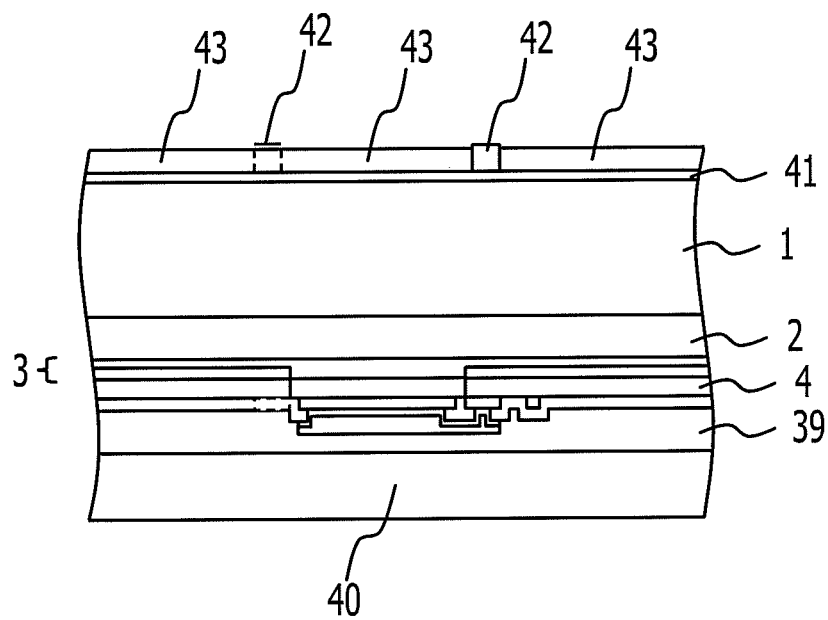
Figure 3A:
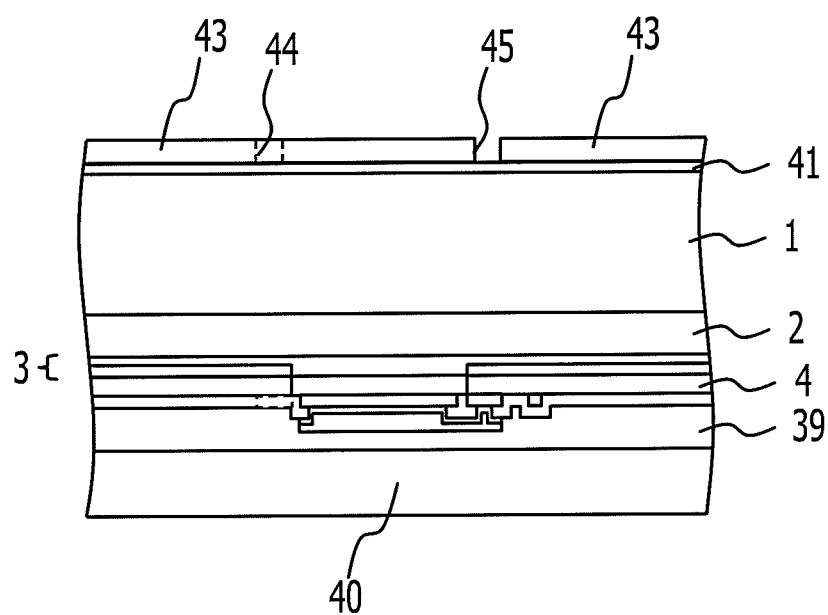
Figure 3A:
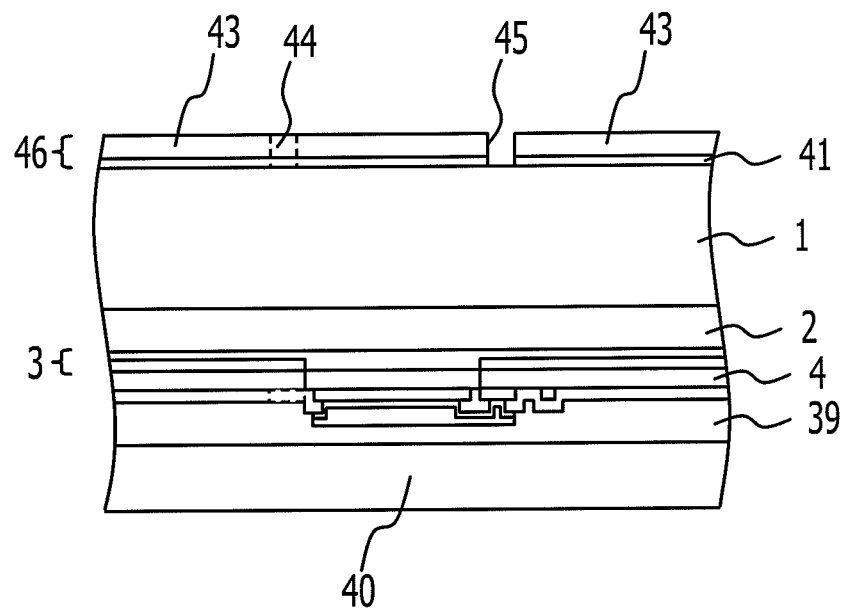
Figure 3A:
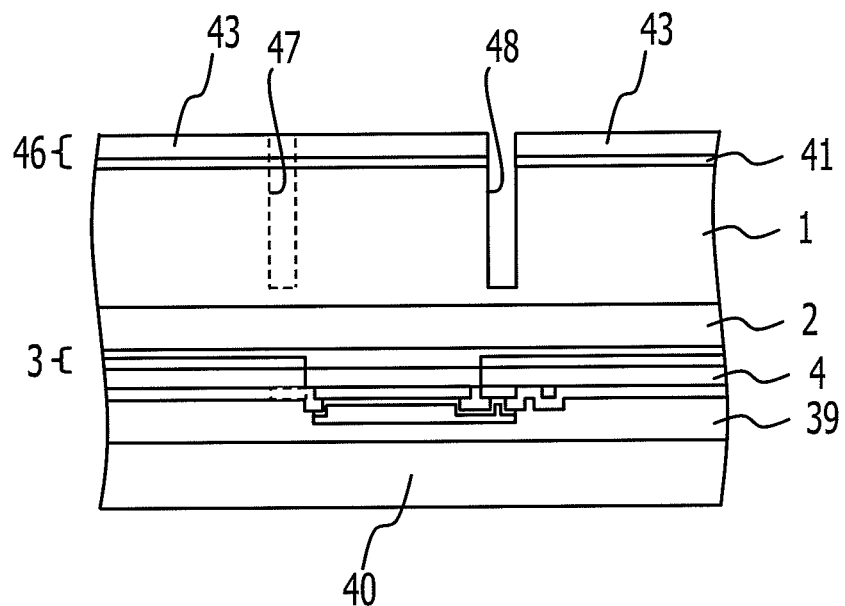

FIGS. 3AA to 3AZ, and 3BA to 3BK are illustrated based on the section A-A' in FIG. 2A. Elements that may not appear on the section A-A' due to the locations of the elements, such as the gate electrode 8, the drain electrode 9, the gate terminal 11, the etching stopper 13, and the drain wiring line 17, are not depicted in FIGS. 3AA to 3AZ, and 3BA to 3BK.

For example, the semi-insulating SiC substrate 1 with a thickness of approximately 350 μm is prepared as a substrate as illustrated in FIG. 3AA.

As illustrated in FIG. 3AB, a non-doped GaN layer is formed on the semi-insulating SiC substrate 1 as the buffer layer 2 so that the buffer layer 2 has a thickness of approximately 1 μm, for example. After that, the non-doped GaN layer 3 is formed on the buffer layer 2 as a channel layer so that the non-doped GaN layer 3 has a thickness of approximately 0.5 μm, and the n-type AlGaN layer 4 is formed on the non-doped GaN layer 3 as a barrier layer so that the n-type AlGaN layer 4 has a thickness of approximately 25 nm, for example. The buffer layer 2, the non-doped GaN layer 3, and the n-type AlGaN layer 4 may, for example, be formed by metal organic vapor phase epitaxy (MOVPE).

After that, as illustrated in FIG. 3AC, a resist mask 24 is formed on the n-type AlGaN layer 4, and ion implantation using the resist mask 24 is performed to form the inactive regions 5 and 6 for inactivating the 2DEG present on the interface of the non-doped GaN layer 3 and the n-type AlGaN layer 4. For example, B, Ar, or the like may be used for the ion implantation. The resist mask 24 is removed after forming the inactive regions 5 and 6.

After that, as illustrated in FIG. 3AD, a resist mask 26 that includes an opening 25 is formed on the n-type AlGaN layer 4 and in locations corresponding to the source electrode 7 and the drain electrode 9. The opening 25 is provided in the location corresponding to the source electrode 7.

After that, as illustrated in FIGS. 3AE and 3AF, a deposition film 27 is formed on the resist mask 26 and on the bottom surface of the opening 25 by applying Ti and Al using deposition and lift-off techniques so that the Ti layer of the deposition film 27 has a thickness of approximately 30 nm and the Al layer of the deposition film 27 has a thickness of approximately 300 nm, for example. When the resist mask 26 is removed, the deposition film 27 formed on the bottom surface of the opening 25 is left as the source electrode 7 or the drain electrode 9. The source electrode 7 and the drain electrode 9 have wiring patterns. Each of the widths of the source electrode 7 and the drain electrode 9 is approximately 30 μm, for example.

After that, heating treatment is performed in an atmosphere of nitrogen at, for example, a temperature of 600 degrees C. so that ohmic contact of the source electrode 7 and the drain electrode 9 may be established.

After that, as illustrated in FIG. 3AG, a resist mask 28 that includes openings 29 and 30 is formed on the n-type AlGaN layer 4 and in locations corresponding to the gate electrode 8, the common gate wiring line 10, the gate terminal 11, and the etching stoppers 12 and 13. The opening 29 is provided in the location corresponding to the etching stopper 12. The opening 30 is provided in the location corresponding to the common gate wiring 10.

After that, as illustrated in FIGS. 3AH and 3AI, a deposition film 31 is formed on the resist mask 28 and on the bottom surfaces of the openings 29 and 30 by applying Ni and Au using deposition and lift-off techniques so that, for example, the Ni layer of the deposition film 31 has a thickness of approximately 100 nm and the Au layer of the deposition film 31 has a thickness of approximately 400 nm. When the resist mask 28 is removed, the deposition film 31 formed on the bottom surfaces of the openings 29 and 30 is left as the gate electrode 8, the common gate wiring line 10, the gate terminal 11, and the etching stoppers 12 and 13. Each of the diameters of the etching stoppers 12 and 13 is approximately 30 µm, for example.

After that, as illustrated in FIG. 3AJ, a SiN layer is formed on the n-type AlGaN layer 4 as the passivation film 14 by plasma chemical vapor deposition (CVD) for example, so that the passivation film 14 has a thickness of approximately 500 nm and covers the source electrode 7, the gate electrode 8, the drain electrode 9, the common gate wiring line 10, and the gate terminal 11.

After that, as illustrated in FIG. 3AK, a resist mask 32 that includes openings 33 and 34 is formed on the passivation film 14 and in locations corresponding to the source electrode 7, the drain electrode 9, and the etching stoppers 12 and 13. The opening 33 is provided in the location corresponding to an exposed region of the source electrode 7. The opening 34 is provided in the location corresponding to an exposed region of the etching stopper 12.

After that, as illustrated in FIG. 3AL, part of the passivation film 14, which is exposed through the openings 33 and 34, is removed by dry etching using the resist mask 32 so that the source electrode 7, the drain electrode 9, and the etching stoppers 12 and 13 are exposed. For example, a mixed gas of $SF_6$ and $CHF_3$ may be used for the dry etching.

After that, as illustrated in FIG. 3AM, the resist mask 32 is removed.

After that, as illustrated in FIG. 3AN, a seed metal layer 35 is formed on the remaining passivation film 14, and on the exposed surfaces of the source electrode 7, the drain electrode 9, the etching stoppers 12 and 13, and an electrode pad by applying Ti, Pt, and Au by sputtering so that the Ti layer of the seed metal layer 35 has a thickness of approximately 10 nm, the Pt layer of the seed metal layer 35 has a thickness of approximately 50 nm, and the Au layer of the seed metal layer 35 has a thickness of approximately 200 nm, for example.

After that, as illustrated in FIG. 3AO, a resist mask 36 that includes an opening 37 is formed on the seed metal layer 35 and in regions corresponding to the source wiring line 16 and the drain wiring line 17. The opening 37 is provided in the location corresponding to the source wiring line 16.

After that, as illustrated in FIG. 3AP, an Au film 38 is formed by plating so that the Au film 38 has a thickness of approximately 6 µm, for example.

After that, as illustrated in FIG. 3AQ, when the resist mask 36 is removed, the Au film 38 formed on the bottom surface of the opening 37 is left as the source wiring line 16 or the drain wiring line 17.

After that, as illustrated in FIG. 3AR, part of the seed metal layer 35, which is exposed, is removed, for example, by ion milling.

As described above, the semi-insulating SiC substrate 1 that includes the source wiring line 16 and the drain wiring line 17 may be manufactured.

For example, as illustrated in FIG. 3AS, the semi-insulating SiC substrate 1 is then attached to a support substrate 40 with an adhesive 39 so that the surface on which the compound semiconductor layer is formed faces the support substrate 40. For example, the support substrate 40 may be a sapphire substrate. Since the semiconductor device is separated from the support substrate 40 after being manufactured, it is preferable to employ a thermoplastic adhesive as the adhesive 39. Examples of the thermoplastic adhesive include polyamide resin, polyester resin, polyolefin resin, and polyurethane resin.

After that, as illustrated in FIG. 3AT, the back surface of the semi-insulating SiC substrate 1, that is, the surface opposite to the surface on which the compound semiconductor layer is formed, is polished to be thinned. For example, the polishing may be performed by employing a grinder suitable for polishing the back surface of a wafer, and rotating a grindstone provided in the grinder. The thickness of the semi-insulating SiC substrate 1 after being thinned may be approximately 150 µm for example.

After that, as illustrated in FIG. 3AU, a seed metal layer 41 is formed on the back surface of the semi-insulating SiC substrate 1 by applying Ti and Cu by sputtering so that the Ti layer of the seed metal layer 41 has a thickness of 20 nm and the Cu layer of the seed metal layer 41 has a thickness of 300 nm, for example. After that, as illustrated in FIG. 3AV, a resist mask 42 is formed so that regions corresponding to the vias 22 and 23 are covered.

After that, as illustrated in FIG. 3AW, a Ni layer 43 is formed on the seed metal layer 41 by plating, for example, so that the Ni layer 43 has a thickness of approximately 2 µm. When the resist mask 42 is removed, openings 44 and 45 are formed as illustrated in FIG. 3AX.

After that, when part of the seed metal layer 41, which is exposed through the openings 44 and 45, is removed by ion milling for example, a metal mask 46 for forming via holes 47 and 48 is formed as illustrated in FIG. 3AY.

After that, as illustrated in FIG. 3AZ, the metal mask 46 is used to form the via holes 47 and 48 by dry etching using, for example, a mixed gas of $SF_6$ and $O_2$ so that each of the depths of the via holes 47 and 48 from the back surface of the semi-insulating SiC substrate 1 is approximately 110 µm. For example, each of the diameters of the via holes 47 and 48 is approximately 20 µm.

Figure 3B:
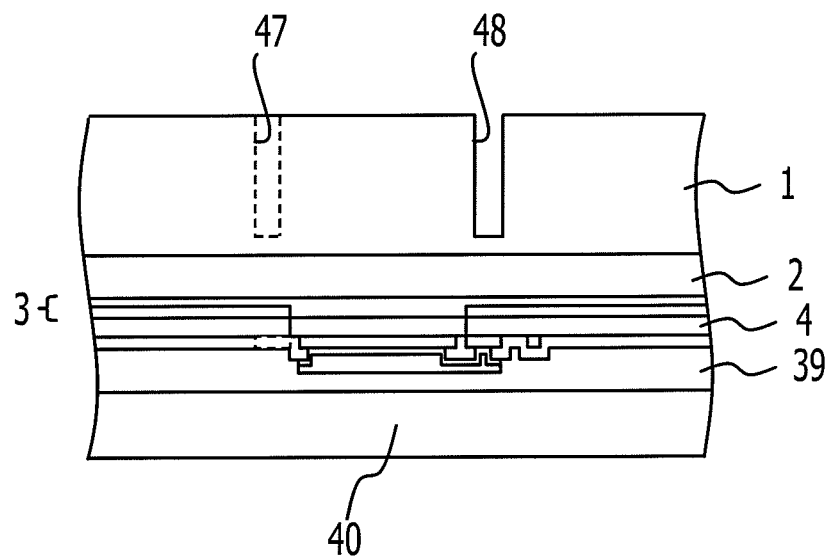
Figure 3B:
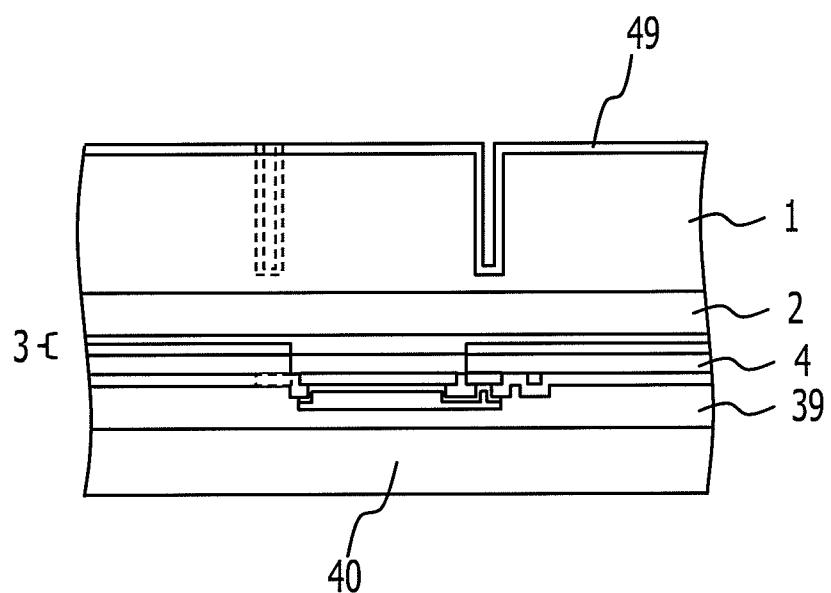
Figure 3B:
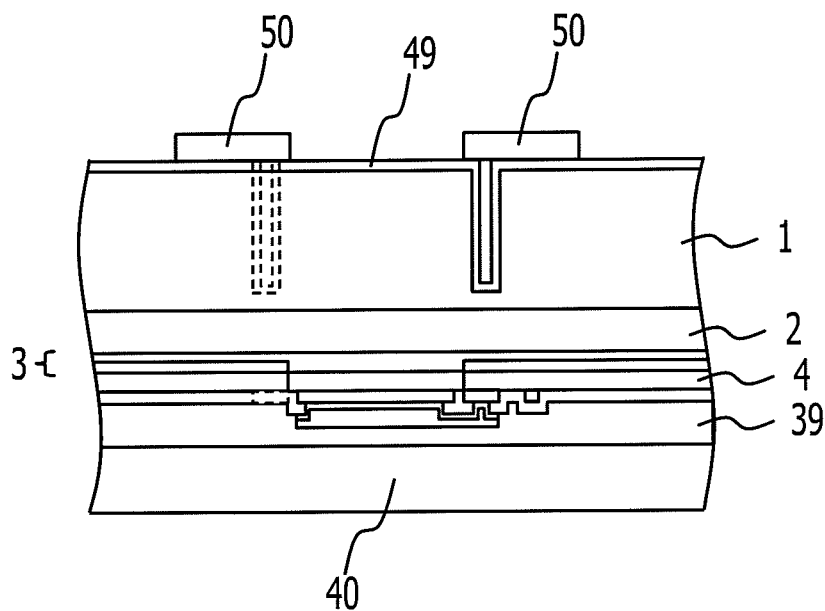
Figure 3B:
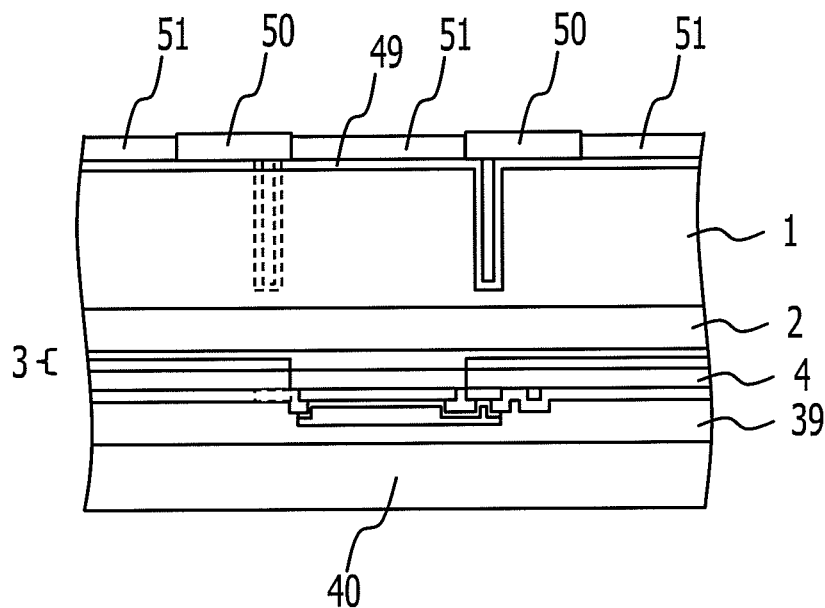
Figure 3B:
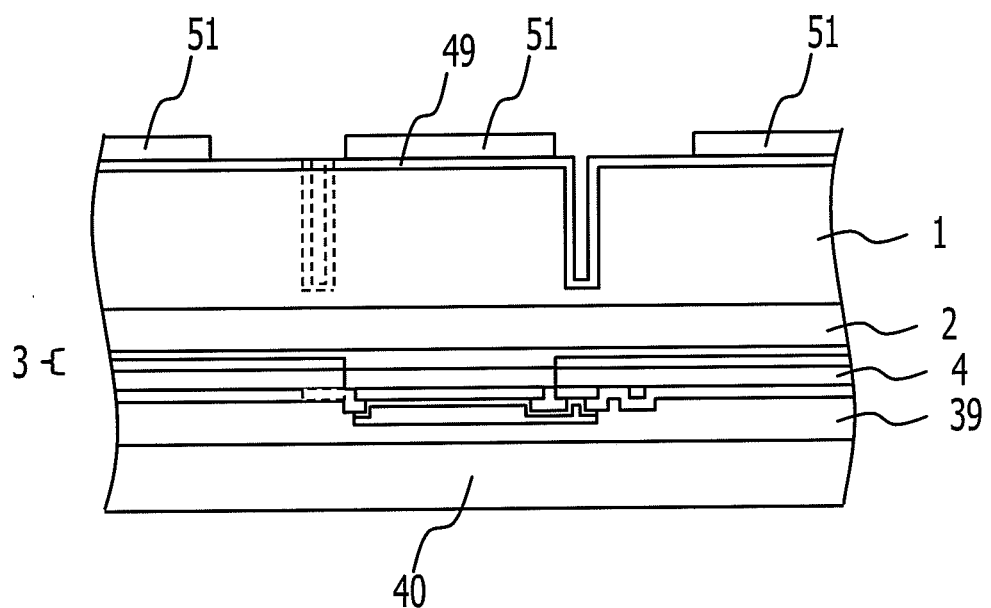
Figure 3B:
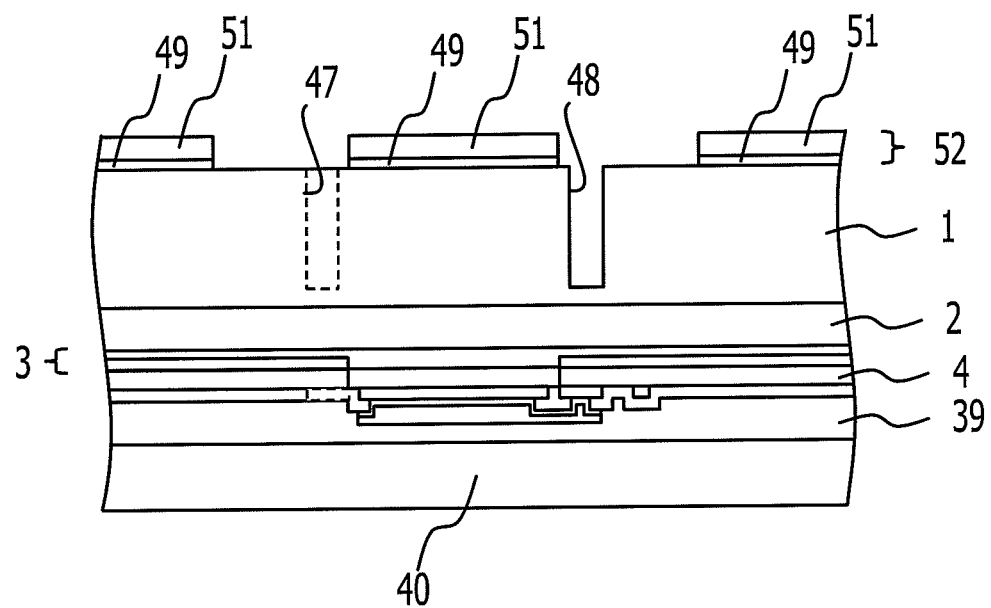
Figure 3B:
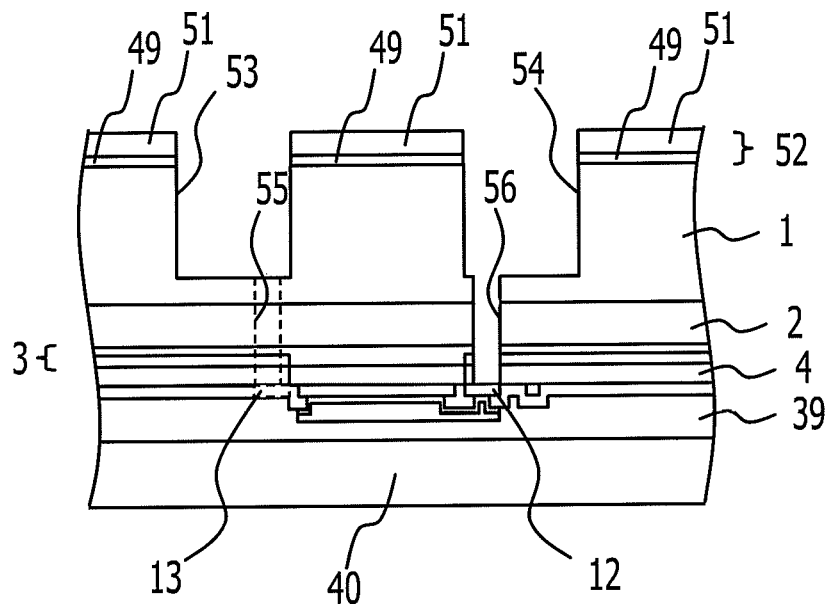
Figure 3B:
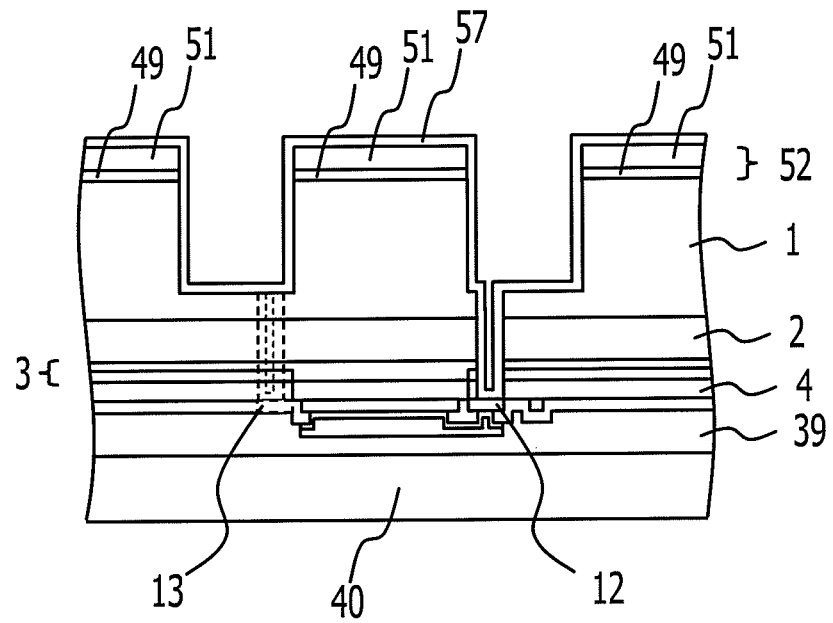
Figure 3B:
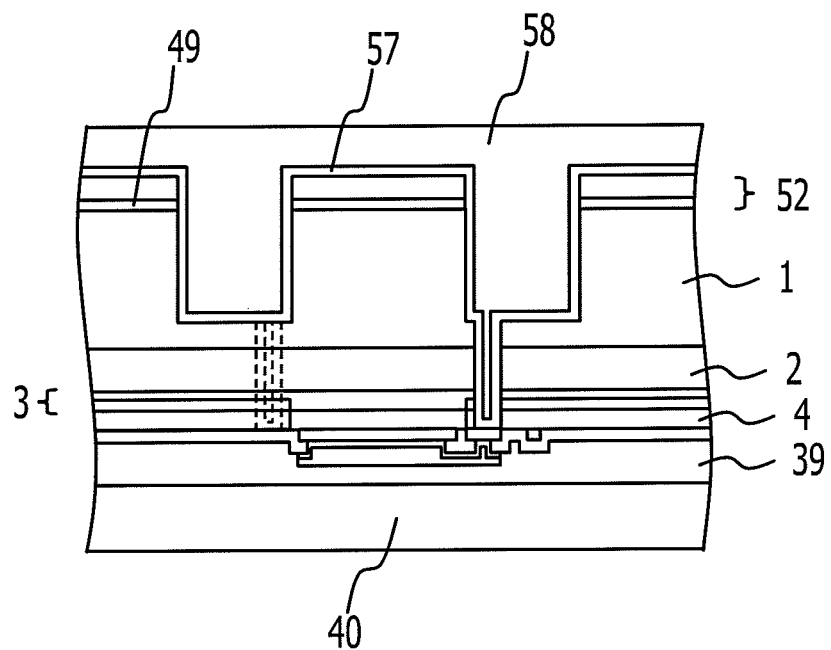
Figure 3B:
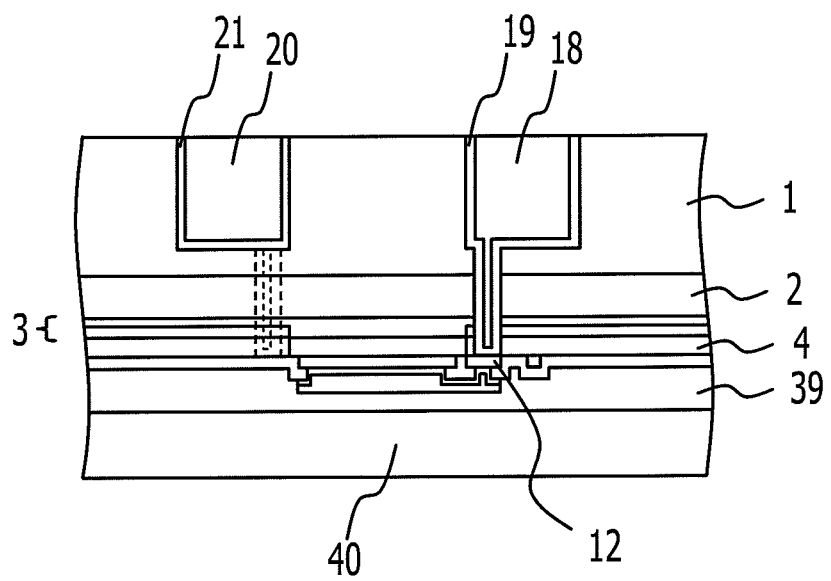
Figure 3B:
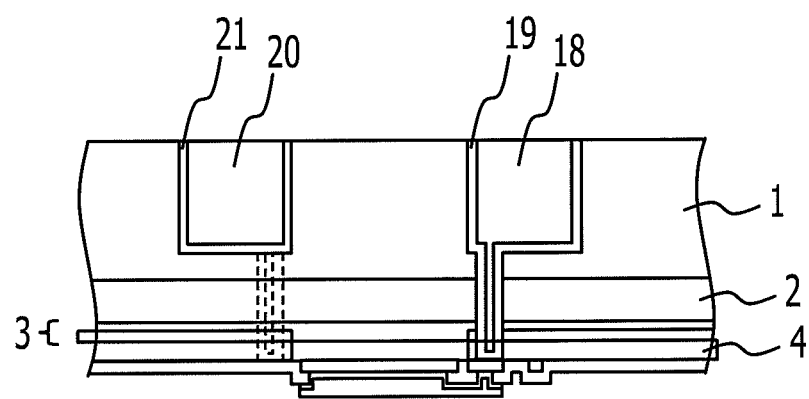

After that, as illustrated in FIG. 3BA, the metal mask 46 is removed using a mixture of sulfuric acid and hydrogen peroxide solution for example.

After that, as illustrated in FIG. 3BB, a seed metal layer 49 is formed on the back surface of the semi-insulating SiC substrate 1 and on the inner walls of the via holes 47 and 48 by applying Ti and Cu by sputtering so that, for example, the Ti layer of the seed metal layer 49 has a thickness of approximately 20 nm and the Cu layer of the seed metal layer 49 has a thickness of approximately 300 nm.

After that, as illustrated in FIG. 3BC, a resist mask 50 is formed so that regions corresponding to the common source wiring line 18 and the common drain wiring line 20 are covered.

After that, as illustrated in FIG. 3BD, a Ni layer 51 is formed on the seed metal layer 49 by plating for example, so that the Ni layer 51 has a thickness of approximately 2 µm. After that, the resist mask 50 is removed as illustrated in FIG. 3BE.

After that, the Cu layer of the seed metal layer 49 is removed by wet etching using ammonium persulfate solution, for example. Since the chemical solution used for the wet etching may readily permeate the inner wall of the via hole 42, the wet etching may remove the Cu layer on the inner wall of the via hole 42 more effectively than the ion milling.

After that, the Ti layer of the seed metal layer 49 is removed by dry etching using a $SF_6$ gas, for example. When the Ti layer is removed, a metal mask 52 used for forming the common source wiring line 18 and the common drain wiring line 20 is formed as illustrated in FIG. 3BF. The dry etching using the $SF_6$ gas may selectively remove the Ti layer while suppressing etching of the Ni layer.

After that, as illustrated in FIG. 3BG, the metal mask 52 is used to form trenches 53 and 54 by dry etching using a mixed gas of $SF_6$ and $O_2$. For example, each of the widths of the trenches 53 and 54 is approximately 100 µm, and each of the lengths of the trenches 53 and 54 is approximately 5.2 mm. Each of the depths of the trenches 53 and 54 from the back surface of the semi-insulating SiC substrate 1 is approximately 100 µm, for example.

When the trenches 53 and 54 are formed, the bottom surfaces of the via holes 47 and 48 that have been formed in advance are etched. As a result, the via hole 47 becomes a via hole 55 and the etching stopper 13 serves as the bottom surface of the via hole 55, and the via hole 48 becomes a via hole 56 and the etching stopper 12 serves as the bottom surface of the via hole 56. When the thickness of the semi-insulating SiC substrate 1 is approximately 150 μm, both the depth of the via hole 55 from the bottom surface of the trench 53 and the depth of the via hole 56 from the bottom surface of the trench 54, which are obtained after forming the trenches 53 and 54, are approximately 51 μm to 53 μm.

After that, as illustrated in FIG. 3BH, a seed metal layer 57 is formed on the metal mask 52, on the inner walls of the trenches 53 and 54, and on the inner walls of the via holes 55 and 56 by applying Ti and Cu by sputtering so that the Ti layer of the seed metal layer 57 has a thickness of approximately 50 nm and the Cu layer of the seed metal layer 57 has a thickness of approximately 1 μm, for example.

After that, as illustrated in FIG. 3BI, a Cu layer 58 is formed on the seed metal layer 57 by plating, for example.

After that, as illustrated in FIG. 3BJ, the surface of the semi-insulating SiC substrate 1 on which the Cu layer 50 is formed is polished, for example, by chemical mechanical polishing (CMP) so that the semi-insulating SiC substrate 1 may be exposed. As a result of the CMP, the common drain wiring line 20 is formed to be buried in the trench 53, and the common source wiring line 18 is formed to be buried in the trench 54.

After that, the support substrate 40 is heated and the compound semiconductor layer is separated from the support substrate 40. When the adhesive 39 left on the compound semiconductor layer is removed using an organic solvent or the like, the semiconductor device illustrated in FIG. 3BK may be obtained.

A method of obtaining separate semiconductor devices by performing a singulation process on the semi-insulating SiC substrate 1 is described below.

Figure 4:
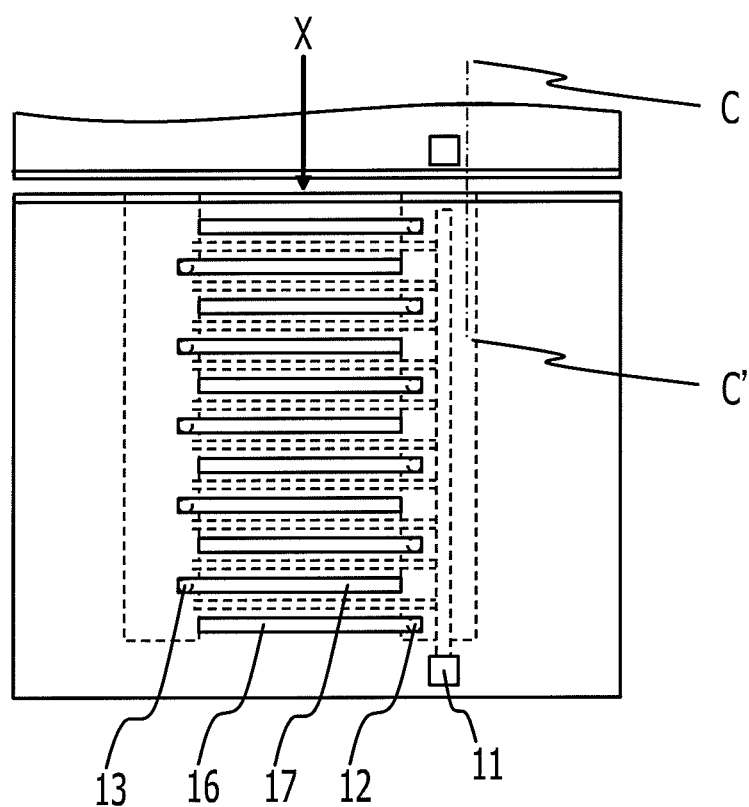
FIG. 4 is a plane view illustrating the semiconductor device according to the first embodiment, which is obtained after the singulation process.

FIG. 4 is a plane view illustrating the semiconductor device according to the first embodiment, which is obtained after the singulation process. Each of FIGS. 5A and 5B illustrates a cross section of semiconductor devices for explaining the separation process, which is taken along a dashed-dotted line C-C in FIG. 4.

Figure 5A:
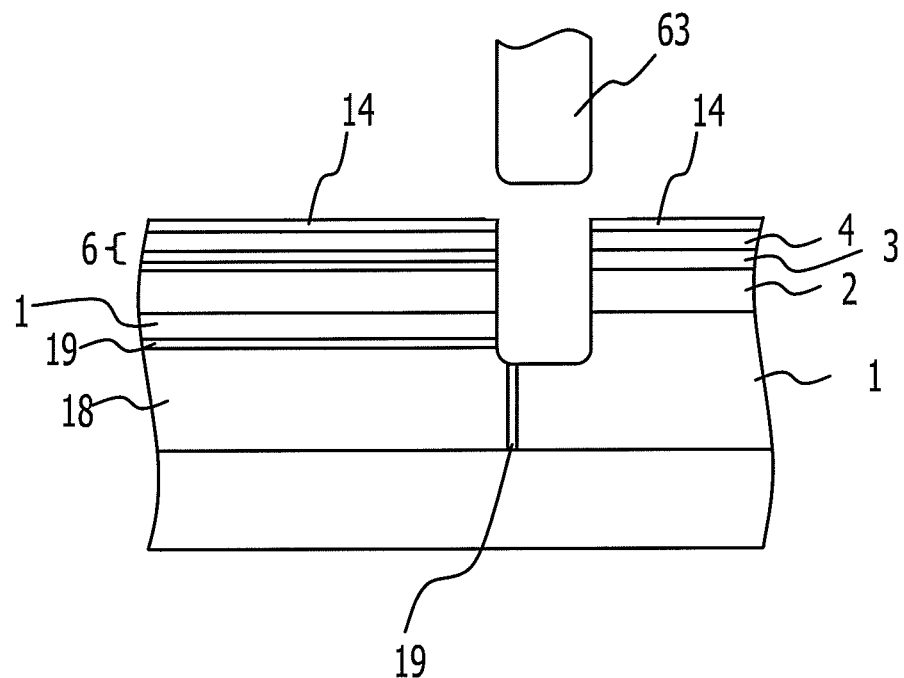
FIGS. 5A and 5B are sectional views illustrating an example of the singulation process according to the first embodiment.

As illustrated in FIG. 5A, so-called half-cut dicing is performed using a dicing blade 63 that has, for example, a width of approximately 150 μm so that the dicing blade 63 reaches the common source wiring line 18.

Figure 5B:
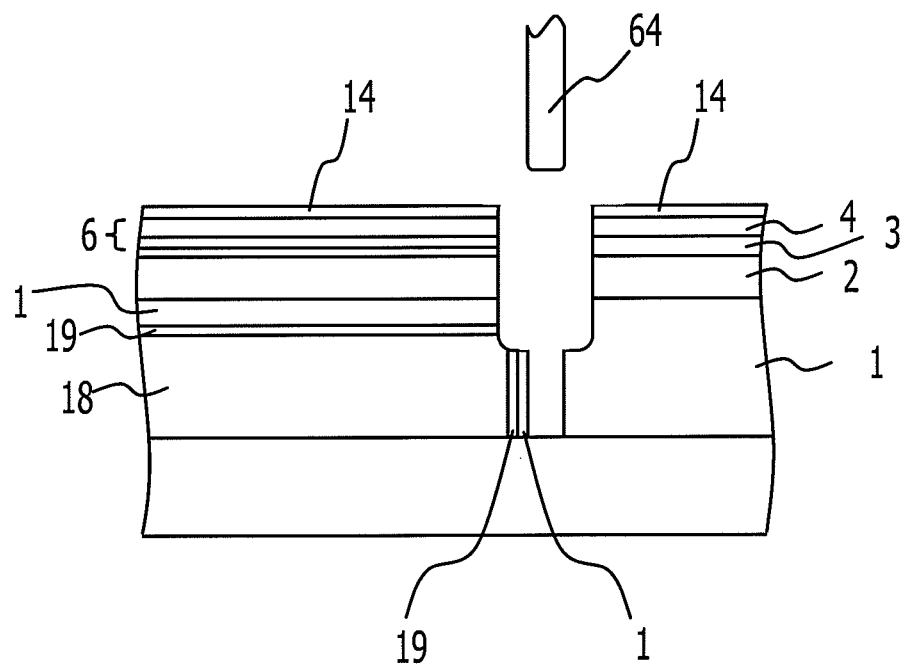

After that, as illustrated in FIG. 5B, so-called full-cut dicing is performed on part of the semi-insulating SiC substrate 1, where neither the common source wiring line 18 nor the seed metal layer 19 is provided, using a dicing blade 64 that has, for example, a width of approximately 50 μm. The full-cut dicing enables the semiconductor devices to be completely separated.

When the two-step separation described above is performed, conditions for the separation of the semi-insulating SiC substrate 1 and conditions for the separation of the common source wiring line 18 or the common drain wiring line 20, which includes Cu, may be selected individually. As a result, the occurrence of burrs in the common source wiring line 18 or the common drain wiring line 20, which is exposed after the separation, may be suppressed, and the frequency of clogging of the dicing blades may be reduced.

Referring to FIG. 4, the above-described separation is performed on one of the four sides of the semiconductor device viewed in a plane, which is indicated by an arrow X. When no wiring layers that include Cu are present in locations where the separation is performed, it is preferable to perform the singulation by one-time full-cut dicing to improve manufacturing efficiency. Depending on the object to be separated, the singulation may be conducted by combining the two separation processes.

Thus, the compound semiconductor device according to the first embodiment may be manufactured.

Mounting examples of the semiconductor device according to the first embodiment are described below with reference to FIGS. 6 and 7.

Figure 6:
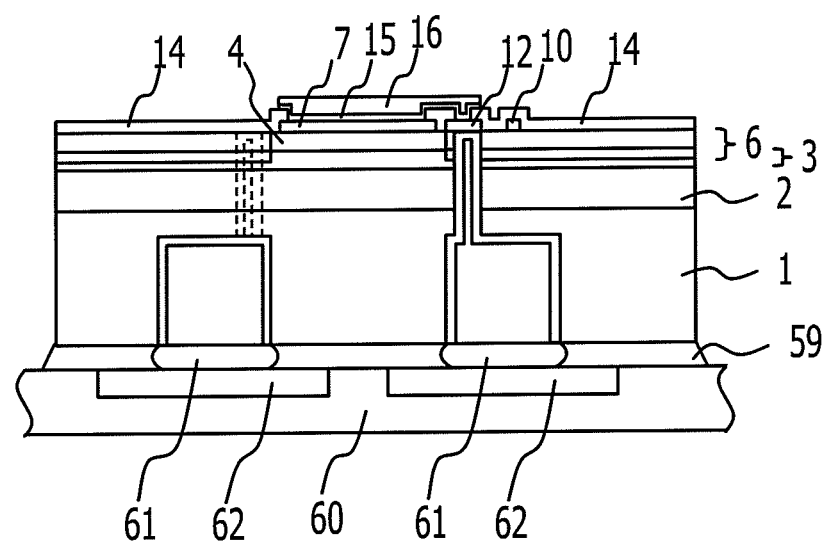
FIG. 6 is a sectional view illustrating a mounting example of the semiconductor device according to the first embodiment.

FIG. 6 is a sectional view illustrating a mounting example of the semiconductor device according to the first embodiment.

As illustrated in FIG. 6, the semiconductor device is mounted over a ceramic substrate 60. The common source wiring line 18 and the common drain wiring line 20 of the semiconductor device are electrically coupled through a conductive adhesive 61 to wiring lines 62 on the ceramic substrate 60. Examples of materials for the conductive adhesive 61 include solder, and resin in which Ag particles are dispersed.

Underfill resin 59 is filled in a gap between the semiconductor device and the ceramic substrate 60. The ceramic substrate 60 is preferably made from a material that may release heat well enough to transfer heat generated by the semiconductor device. For example, AlN may be used as the material.

In the first embodiment, the common source wiring line 18 and the common drain wiring line 20 are buried in the trenches 53 and 54 provided in the back surface of the semi-insulating SiC substrate 1. Thus, the heat generated by the semiconductor device may be released not only from the common source wiring line 18 and the common drain wiring line 20, but also from the semi-insulating SiC substrate 1.

Figure 7:
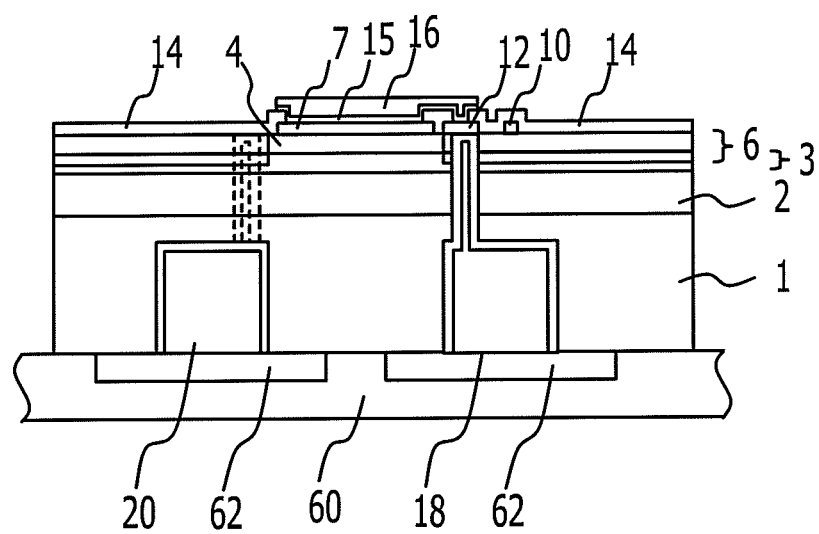
FIG. 7 is a sectional view illustrating another mounting example of the semiconductor device according to the first embodiment.

FIG. 7 is a sectional view illustrating another mounting example of the semiconductor device according to the first embodiment.

As illustrated in FIG. 7, the semiconductor device is mounted on the ceramic substrate 60. The common source wiring line 18 and the common drain wiring line 20 of the semiconductor device are directly bonded to the wiring lines 62 on the ceramic substrate 60.

For example, the above-described direct bonding may be achieved by a room-temperature bonding method. In the room-temperature bonding method, the back surface of the semiconductor device and the upper surface of the ceramic substrate 60, which faces the back surface of the semiconductor device, are polished and planarized by CMP for example.

After that, a so-called clean surface is formed by removing impurities present on the back surface of the semiconductor device and the upper surface of the ceramic substrate 60 in a vacuum. For example, irradiation of argon ion, or the like, is performed to form the clean surface.

After that, in a vacuum or in an inert gas atmosphere, the common source wiring line 18 and the common drain wiring line 20, which are provided in the back surface of the semiconductor device, and the wiring lines 62, which are provided on the upper surface of the ceramic substrate 60, are caused to face and contact each other by being applied with pressure. Due to the contact, the common source wiring line 18 and the wiring line 62, and the common drain wiring line 20 and the wiring line 62 may be bonded in a solid phase and may be electrically coupled to each other, respectively.

Thus, the semiconductor device may be mounted on the ceramic substrate 60.

The common source wiring line 18 and the common drain wiring line 20 are buried in the trenches 53 and 54 provided in the back surface of the semi-insulating SiC substrate 1. In the mounting examples illustrated in FIGS. 6 and 7, since the heat generated by the semiconductor device may be released not only from the common source wiring line 18 and the common drain wiring line 20 but also from the semi-insulating SiC substrate 1, favorable heat release performance may be obtained.

A second embodiment of the present application is described below with reference to FIGS. 8A to 8E.

In the second embodiment, for example, a GaN substrate 71 with a thickness of approximately 350 μm is prepared as a substrate.

Figure 8A:
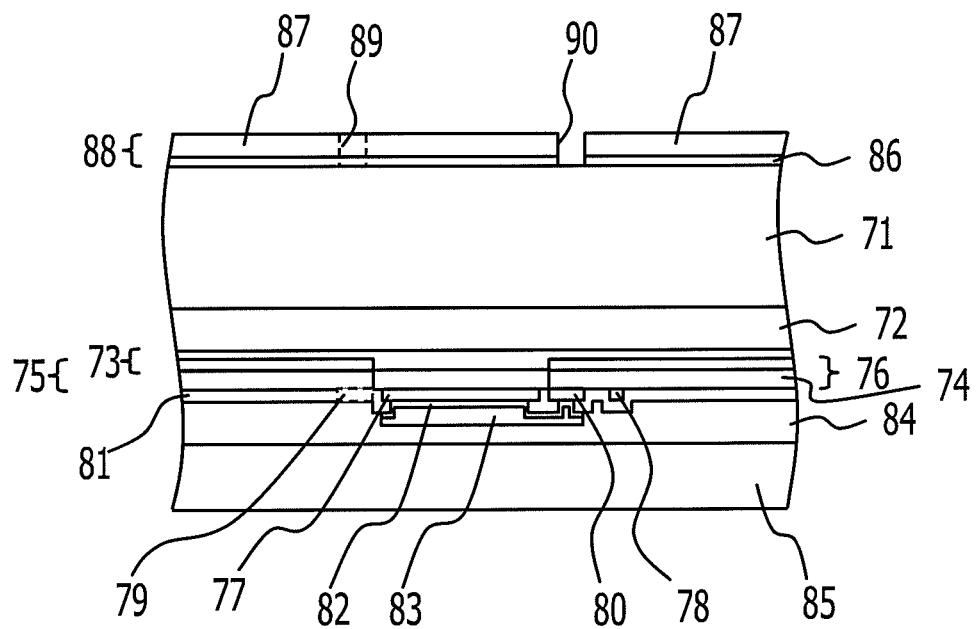
FIGS. 8A to 8E are sectional process views illustrating an example of a method of manufacturing a semiconductor device according to a second embodiment.

As illustrated in FIG. 8A, for example, the processes illustrated in FIGS. 1, 2A, 2B, and 3AA to 3AW of the first embodiment are performed before a metal mask 88 that includes openings 89 and 90 is formed on the back surface of the GaN substrate 71. For example, the thickness of a Ni layer 87 used for the metal mask 88 is approximately 5 μm. In the second embodiment, layers from a buffer layer 72 to an n-type AlGaN layer 74 are referred to as a compound semiconductor layer.

Figure 8B:
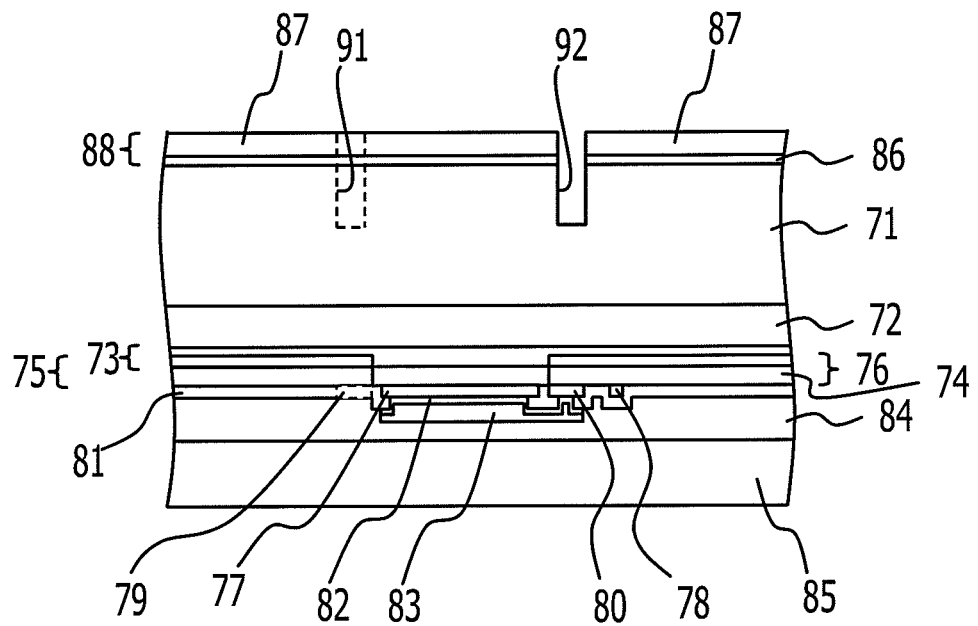

After that, as illustrated in FIG. 8B, the metal mask 88 is used to form via holes 91 and 92 by dry etching using, for example, a $Cl_2$ gas so that each of the depths of the via holes 91 and 92 from the back surface of the GaN substrate 71 is approximately 60 μm. For example, each of the diameters of the via holes 91 and 92 is approximately 20 μm.

Figure 8C:
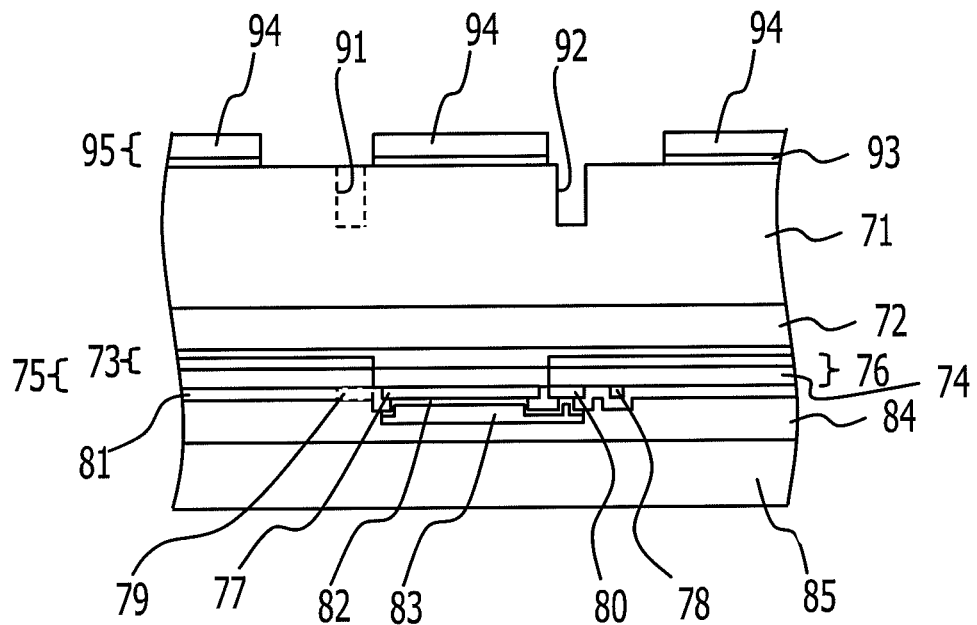

After that, as illustrated in FIG. 8C, the processes illustrated in FIGS. 3BA to 3BF of the first embodiment are used to perform the processes from the removal of the metal mask 88 to the formation of a common drain wiring line 102 and a common source wiring line 100. For example, a seed metal layer 93 used for the metal mask 95 may be formed by applying Ti and Cu so that the Ti layer of the seed metal layer 93 has a thickness of approximately 20 nm and the Cu layer of the seed metal layer 93 has a thickness of approximately 300 nm. For example, the thickness of a Ni layer 94 is approximately 5 μm.

Figure 8D:
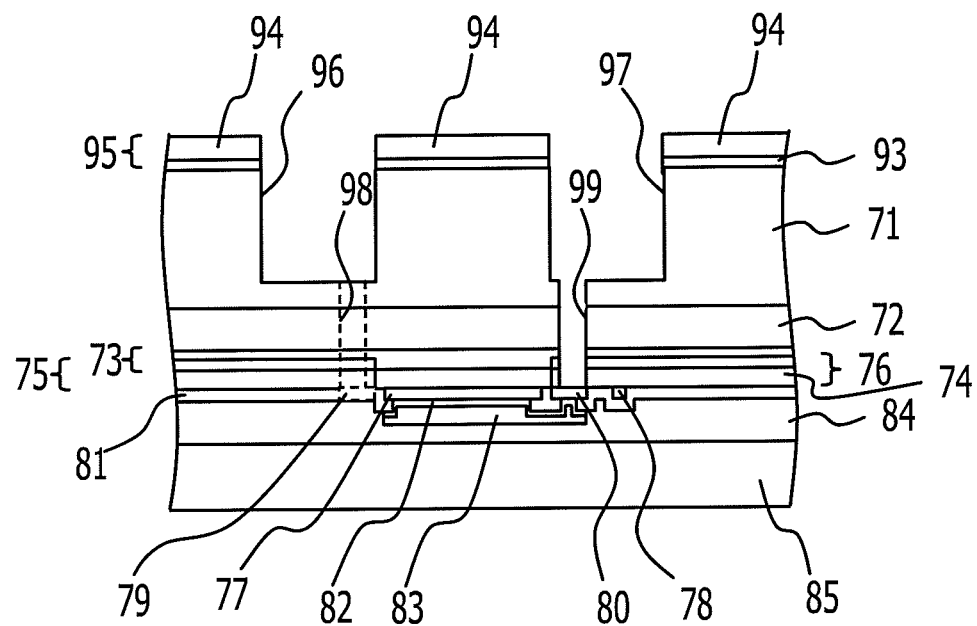

After that, as illustrated in FIG. 8D, the metal mask 95 is used to form trenches 96 and 97 by dry etching using a $Cl_2$ gas for example. Each of the depths of the trenches 96 and 97 from the back surface of the GaN substrate 71 is approximately 100 μm.

When the trenches 96 and 97 are formed, the bottom surfaces of the via holes 91 and 92 that have been formed in advance are etched. The via hole 92 becomes a via hole 99 and an etching stopper 80 serves as the bottom surface of the via hole 99. The via hole 91 becomes a via hole 98 and an etching stopper 79 serves as the bottom surface of the via hole 98.

When the thickness of the semi-insulating SiC substrate 1 is approximately 150 μm, both the depth of the via hole 98 from the bottom surface of the trench 96 and the depth of the via hole 99 from the bottom surface of the trench 97, which are obtained after forming the trenches 96 and 97, are approximately 51 μm to 53 μm.

Figure 8E:
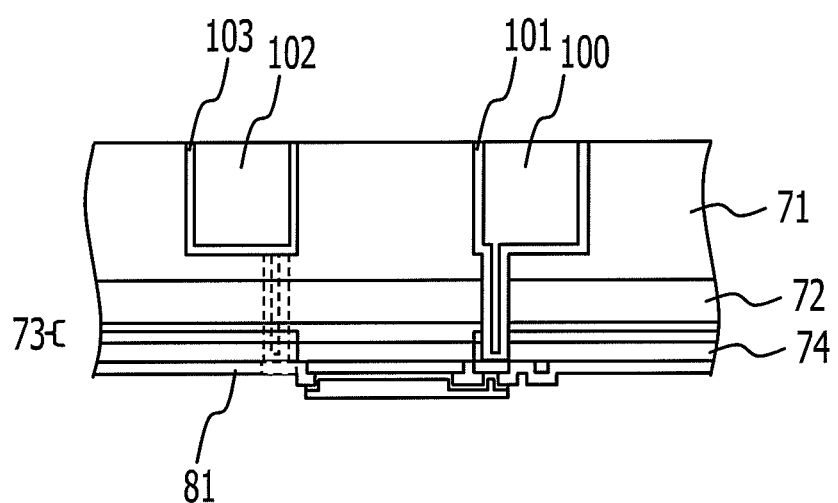

After that, as illustrated in FIG. 8E, the processes illustrated in FIGS. 3BH to 3BK, 4, 5A, and 5B of the first embodiment are used to perform the processes from the formation of a seed metal layer (not illustrated) on the metal mask 95, on the inner walls of the trenches 96 and 97, and on the inner walls of the via holes 98 and 99, to the singulation for the semiconductor device.

Thus, the semiconductor device according to the second embodiment may be manufactured.

According to the second embodiment, since both the substrate and the compound semiconductor layer are made from a material that includes GaN, a difference between the etching speed of the substrate and the etching speed of the compound semiconductor layer may be smaller than the case in which SiC is used as the material for the substrate. Thus, when the substrate and the compound semiconductor layer are dry etched, the etching may be readily controlled, and the manufacturing yield obtained in forming the trenches and the via holes may be improved.

The reactivity of GaN against Cu is much smaller than the reactivity of GaN against Si. Therefore, when GaN is used as a substrate, Cu wiring may be resistant to corrosion caused by mutual diffusion of the GaN and Cu. Thus, the reliability of a common source wiring line and a common drain wiring line that include Cu may be improved.

In the second embodiment, GaN is used as a material for the substrate. However, even when AlN is used as the material for the substrate, there may be little difference between the etching speed of the substrate and the etching speed of the compound semiconductor layer, and the dry etching may be readily controlled. Since the corrosion of the Cu wiring caused by mutual diffusion of the AlN and Cu may be suppressed, the reliability of the common source wiring line and the common drain wiring line that include Cu may be improved.

Furthermore, in the second embodiment, for example, the surfaces of the semiconductor device in which the common source wiring line 100 and the common drain wiring line 102 are buried may be covered with an insulation film, such as AlN, or SiC.

A third embodiment of the present application is described below with reference to FIGS. 9A to 9F.

In the third embodiment, for example, a Si substrate 111 with a thickness of approximately 350 μm is prepared as a substrate.

Figure 9A:
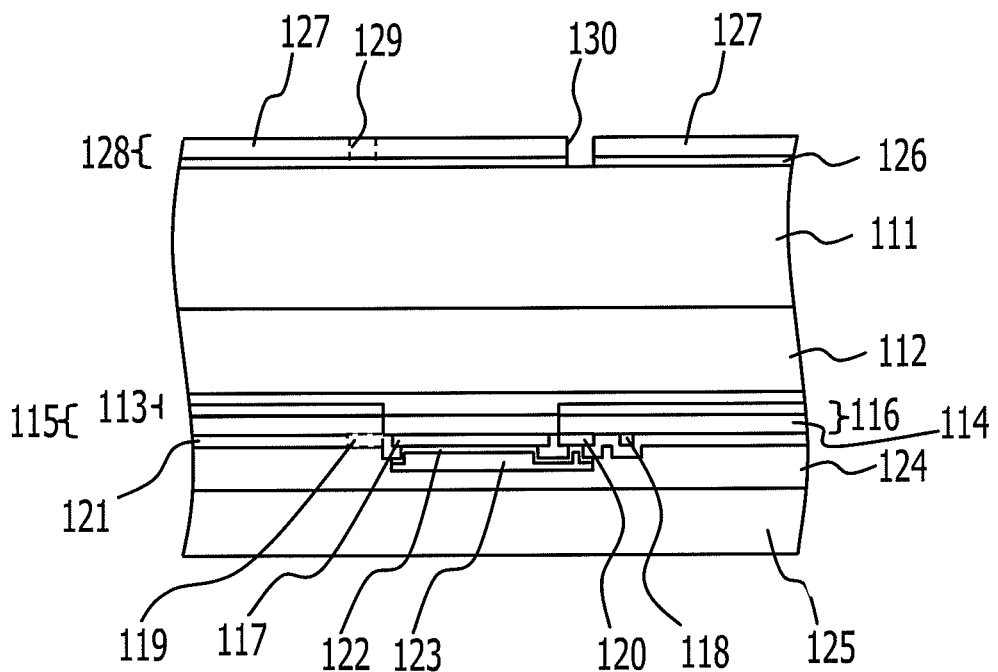
FIGS. 9A to 9F are sectional process views illustrating an example of a method of manufacturing a semiconductor device according to a third embodiment.

As illustrated in FIG. 9A, for example, the processes illustrated in FIGS. 1, 2A, 2B, and FIGS. 3AA to 3AW of the first embodiment are performed before a metal mask 128 that includes openings 129 and 130 is formed on the back surface of the Si substrate 111. In the third embodiment, layers from a buffer layer 112 to an n-type AlGaN layer 114 are referred to as a compound semiconductor layer.

Since a difference between the lattice constants of Si and GaN is large, the buffer layer 112 is desirably formed as thick as possible when using Si as a substrate material. In the third embodiment, the thickness of the buffer layer 112 is approximately 3 μm, and the thickness of the compound semiconductor layer is approximately 4.5 μm. For example, the thickness of a Ni layer 127 used for the metal mask 128 is approximately 1 μm.

Figure 9B:
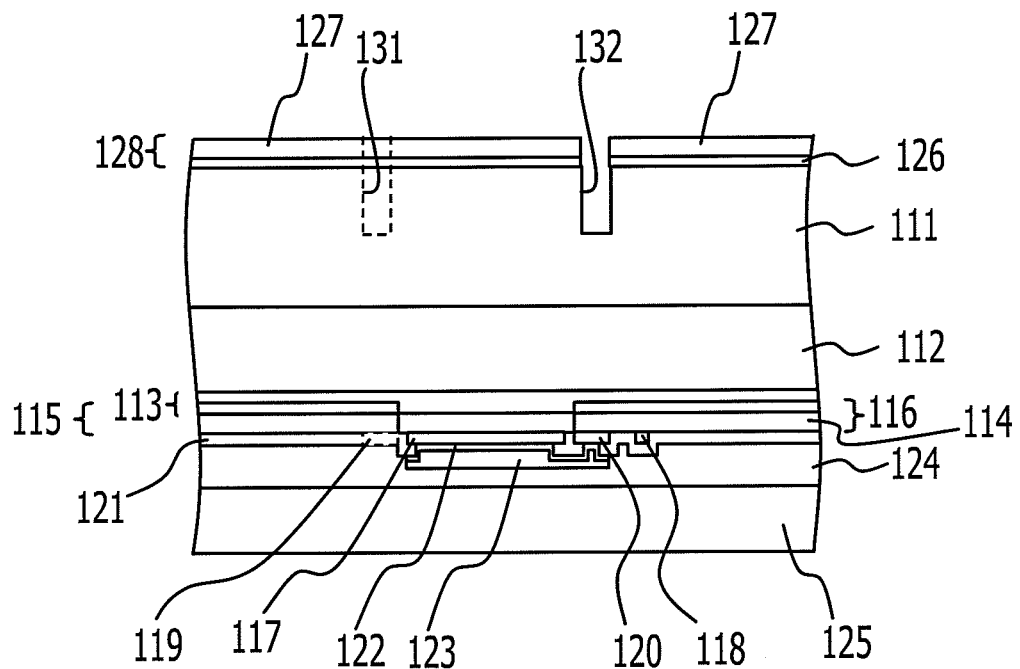

After that, as illustrated in FIG. 9B, the metal mask 128 is used to form via holes 131 and 132 by Bosch processes in which the etching using an $SF_6$ gas and sidewall protection using a $C_4F_8$ gas are alternately performed, for example.

Since the Bosch processes enable the etching to be performed while not changing the diameters of the via holes, a Si substrate 111 may be etched as desired. For example, each of the depths of the thus formed via holes 131 and 132 from the back surface of the Si substrate 111 is approximately 65 μm, and each of the diameters of the via holes 131 and 132 is approximately 20 μm.

Figure 9C:
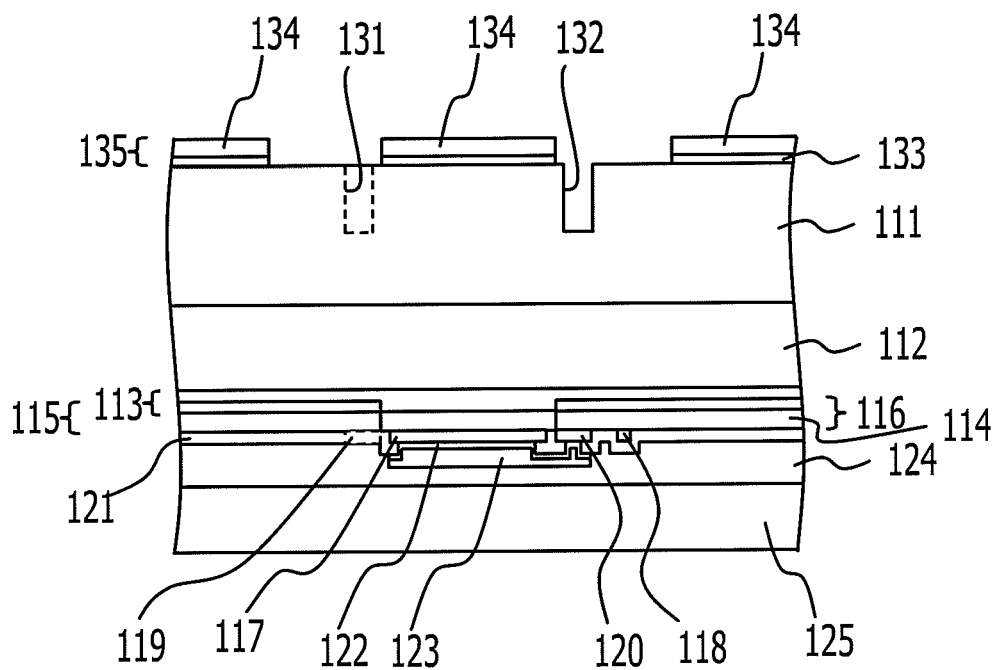

After that, as illustrated in FIG. 9C, the processes illustrated in FIGS. 3BA to 3BF of the first embodiment are used to perform the processes from the removal of the metal mask 128 to the formation of a metal mask 135 used for forming a common drain wiring line 146 and a common source wiring line 144. For example, a seed metal layer 133 used for the metal mask 135 may be formed by applying Ti and Cu so that the Ti layer of the seed metal layer 133 has a thickness of 20 nm and the Cu layer of the seed metal layer 133 has a thickness of 300 nm. For example, the thickness of a Ni layer 134 is approximately 1.5 μm.

Figure 9D:
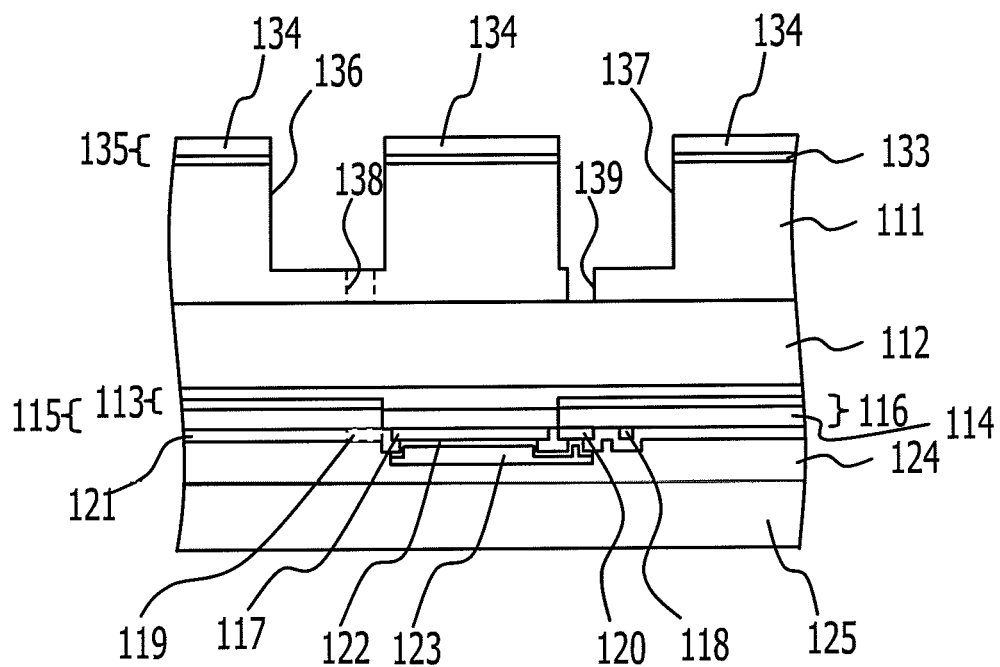

After that, as illustrated in FIG. 9D, trenches 136 and 137 are formed using the metal mask 135, for example, by the above described Bosch processes. Each of the depths of the trenches 136 and 137 from the back surface of the Si substrate 111 is approximately 95 μm.

When the trenches 136 and 137 are formed, the via holes 131 and 132 that have been formed in advance are etched so that the bottom surfaces of the via holes 131 and 132 reach the upper surface of the buffer layer 112. As a result, the via hole 131 becomes a via hole 138, and the via hole 132 becomes a via hole 139.

When the thickness of the Si substrate 111 is approximately 150 μm, both the depth of the via hole 138 from the bottom surface of the trench 136 and the depth of the via hole 139 from the bottom surface of the bottom surface of the trench 137, which are obtained after forming the trenches 136 and 137, are approximately 55 μm.

Figure 9E:
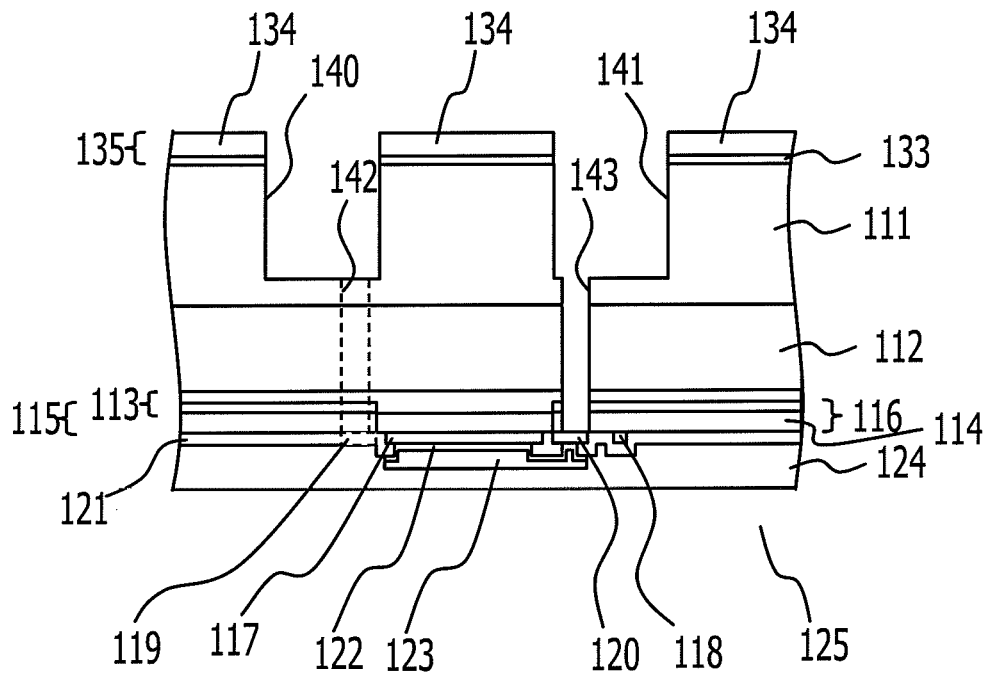

After that, as illustrated in FIG. 9E, the compound semiconductor layer exposed through the via holes 138 and 139 is dry etched using a $Cl_2$ gas for example. As a result of the dry etching, the via hole 138 becomes a via hole 142 and an etching stopper 119 serves as the bottom surface of the via hole 142, and the via hole 139 becomes a via hole 143 and an etching stopper 120 serves as the bottom surface of the via hole 143.

Due to the dry etching described above, the trenches 136 and 137 are also etched and become trenches 140 and 141, respectively. Each of the depths of the trenches 140 and 141 from the back surface of the Si substrate 111 is approximately 100 μm.

Figure 9F:
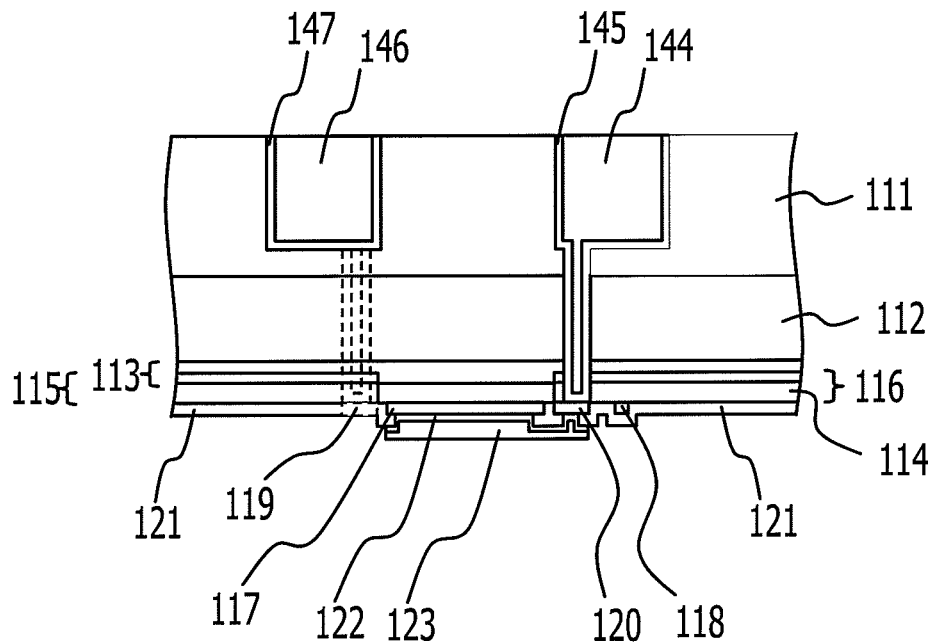

After that, as illustrated in FIG. 9F, the processes illustrated in FIGS. 3BH to 3BK, 4, 5A, and 5B of the first embodiment are used to perform the processes from the formation of a seed metal layer (not illustrated) on the metal mask 135, on the inner walls of the trenches 140 and 141, and on the inner walls of the via holes 142 and 143, to the singulation for the semiconductor device.

Thus, the semiconductor device according to the third embodiment may be manufactured.

According to the third embodiment, the manufacturing costs may be reduced by using a Si substrate cheaper than a SIC substrate, a GaN substrate, an AlN substrate, or the like. When desired, a diffusion barrier layer, such as a polycrystalline SiC layer or a SiN layer, may be formed on the Si substrate.

A fourth embodiment is described below with reference to FIGS. 10A to 10C, and 11.

In the fourth embodiment, for example, a semi-insulating SIC substrate 151 with a thickness of approximately 350 μm is prepared as a substrate.

Figure 10A:
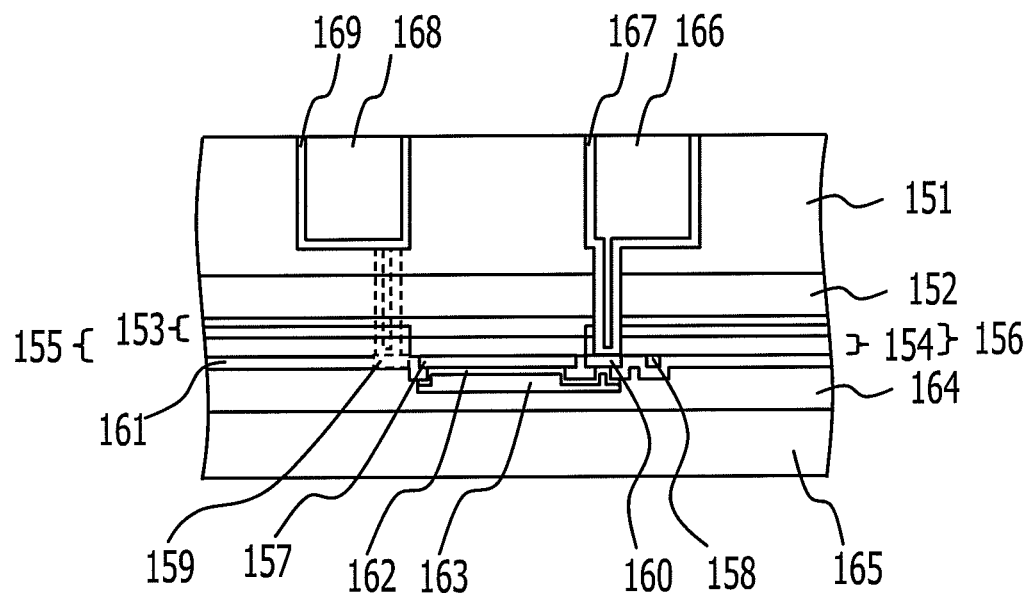
FIGS. 10A to 10C are sectional process views illustrating an example of a method of manufacturing a semiconductor device according to a fourth embodiment.

As illustrated in FIG. 10A, for example, the processes illustrated in FIGS. 3AA to 3AZ, and 3BA to 3BJ of the first embodiment are performed before the back surface of the semi-insulating SiC substrate 151, seed metal layers 167 and 169, a source common wiring line 166, and a drain common wiring line 168 are exposed.

Figure 10B:
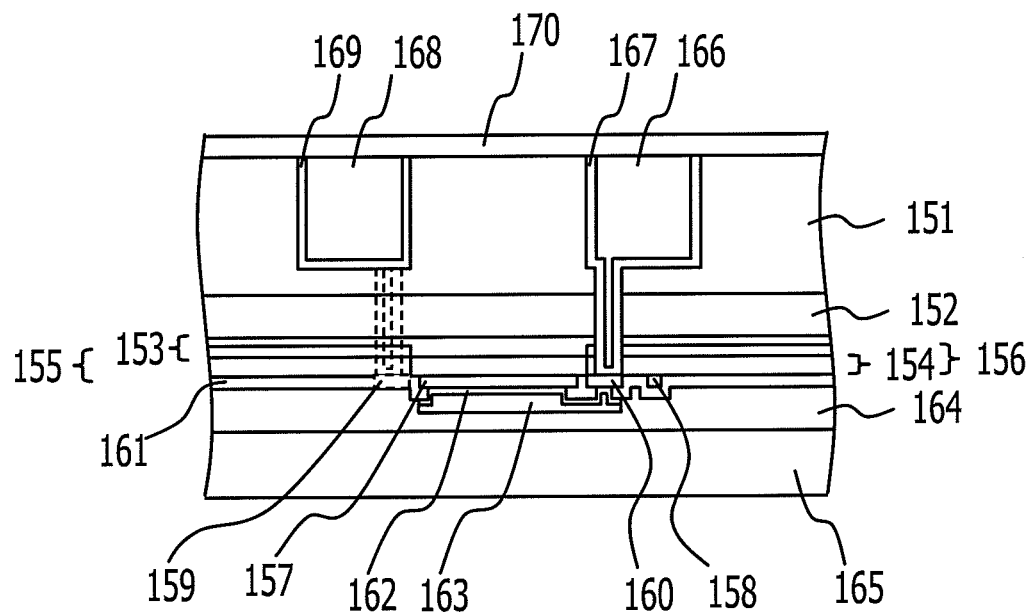

After that, as illustrated in FIG. 10B, an AlN layer is formed on the exposed surfaces as an insulation film 170 with a high thermal conductivity so that the AlN layer has a thickness of approximately 1 μm, for example. The AlN layer may be formed, for example, by sputtering. The insulation film 170 may be made from AlSiC, SiC, or the like instead of AlN. For example, SiC has a thermal conductivity higher than AlSiC or AlN and therefore has good heat release performance.

Figure 10C:
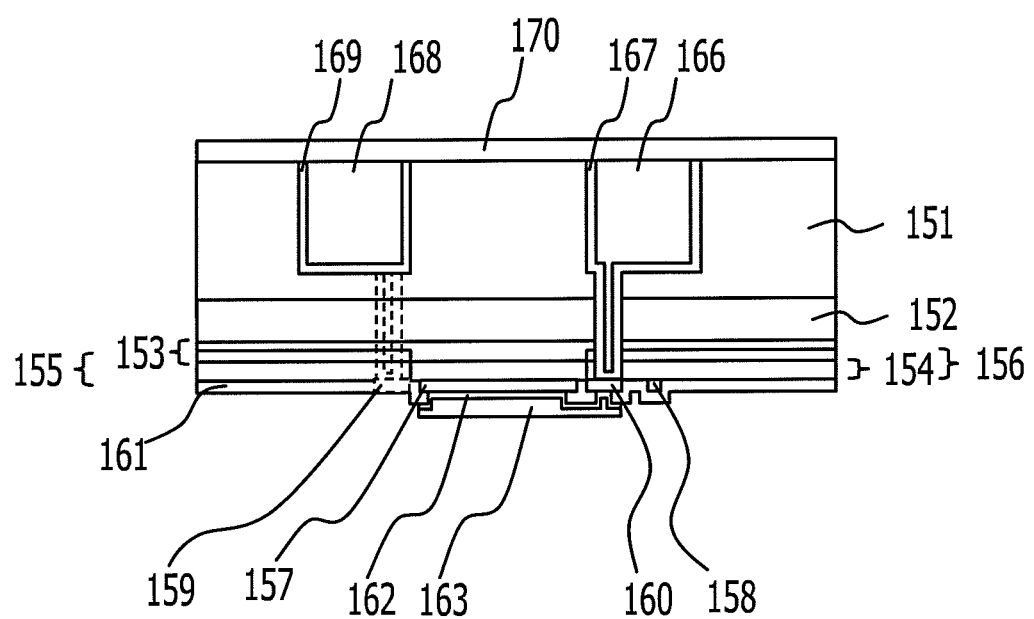

After that, as illustrated in FIG. 10C, the processes illustrated in FIGS. 3BK, 4, 5A, and 5B of the first embodiment are used to perform the processes from the separation of the semiconductor device from a support substrate 165, and the removal of the adhesive left on the separated semiconductor device to the singulation for the semiconductor device.

Thus, the semiconductor device according to the fourth embodiment may be manufactured.

In the fourth embodiment, the common source wiring line 166 and the common drain wiring line 168 are covered with the insulation film 170. This configuration may prevent the surfaces of the common source wiring line and the common drain wiring line from oxidizing, and also prevent such oxidation from causing wiring corrosion or degradation of the electric characteristics.

Since the common source wiring line 166 and the common drain wiring line 168 are insulated from outside not by an adhesive layer 164, but by the insulation film 170, flexibility in choosing materials for the adhesive layer 164 and the support substrate 165 may increase and costs may be reduced.

Figure 11:
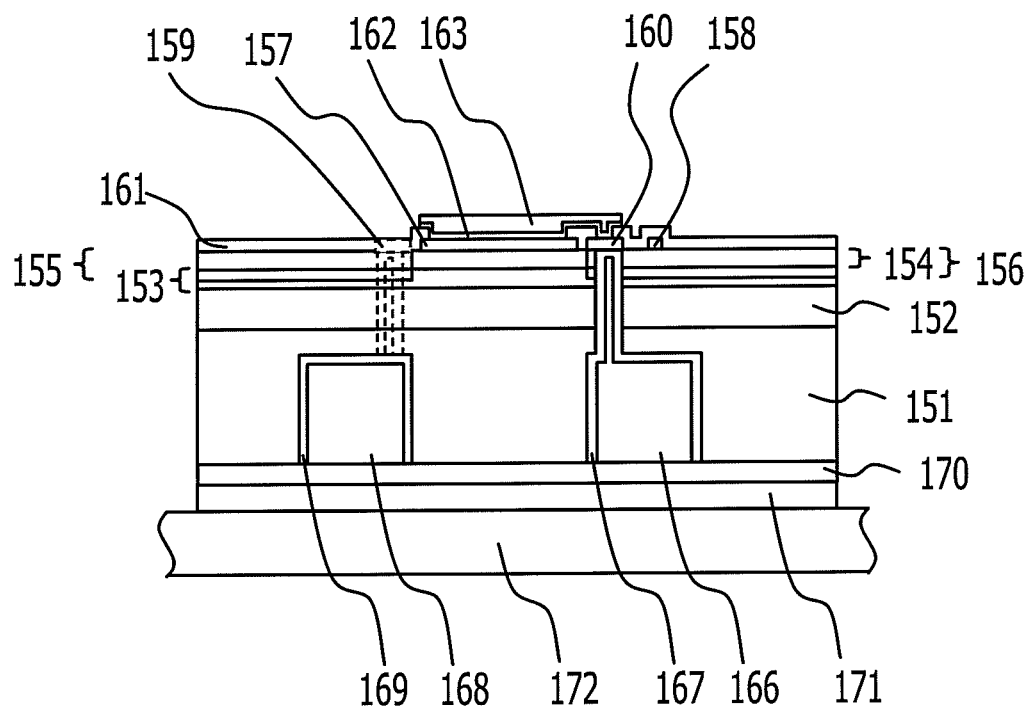
FIG. 11 is a sectional view illustrating a mounting example of the semiconductor device according to the fourth embodiment.

FIG. 11 is a sectional view illustrating a mounting example of the semiconductor device according to the fourth embodiment.

As illustrated in FIG. 11, the semiconductor device is mounted over a heat release plate 172 using an adhesive 171 located between the insulation film 170 and the heat release plate 172. The semiconductor device may be electrically coupled to the outside using electrode pads (not illustrated) formed on the device formation surface or a side of the semiconductor device. For example, the heat release plate 172 is made from a ceramic material, such as $Al_2O_3$ or AlN, or a metal material, such as Cu or Al.

A fifth embodiment is described below with reference to FIGS. 12A, 12B, 13AA to 13AZ, and 13BA to 13BL.

Figure 12A:
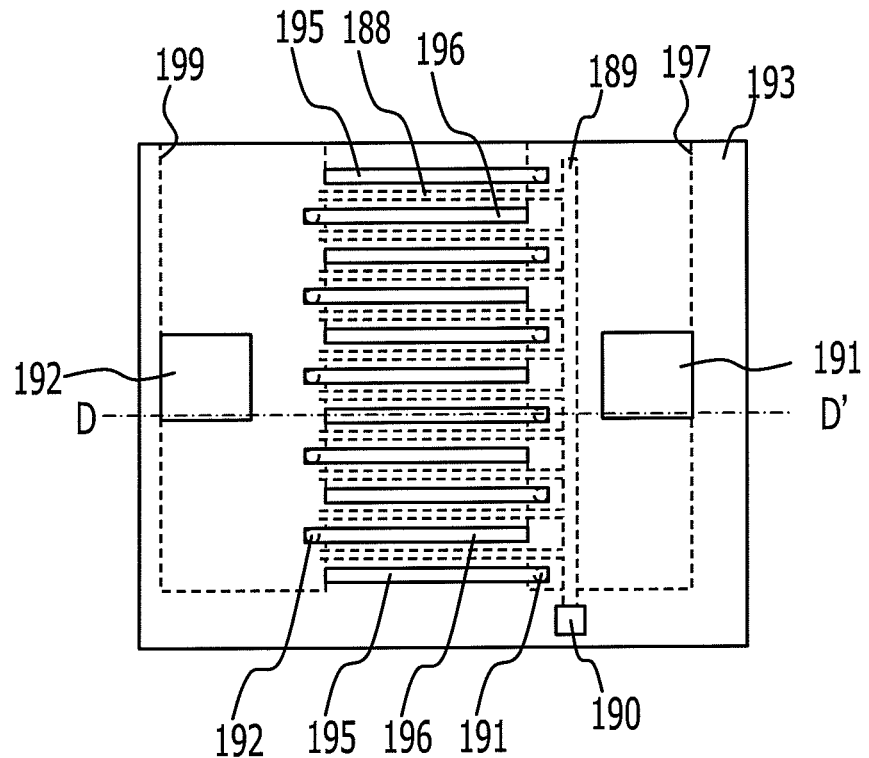
FIGS. 12A and 12B illustrate an example of a semiconductor device according to a fifth embodiment.
Figure 12B:
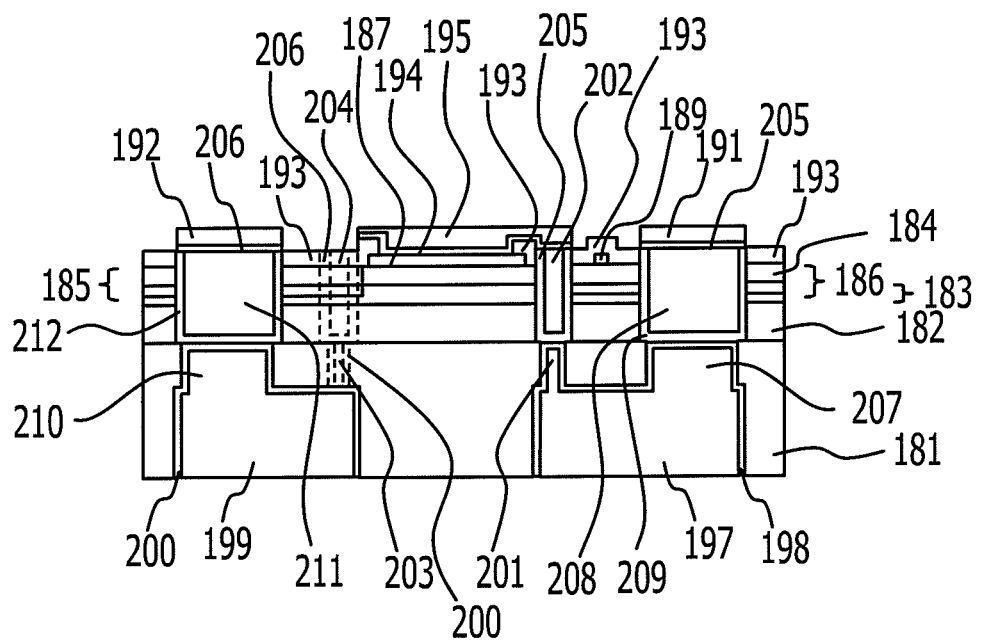

FIGS. 12A and 12B illustrate an example of a semiconductor device according to the fifth embodiment. FIG. 12A is a plane view illustrating the semiconductor device. FIG. 12B illustrates a cross section taken along a dashed-dotted line D-D' in FIG. 12A (hereinafter referred to as a section D-D'). Dashed lines in FIG. 12A indicate regions that may not be seen when looking downward from above the semiconductor device. Dashed lines in FIG. 12B indicate portions that may not appear in the section D-D'.

In the fifth embodiment, as illustrated in FIG. 12B, a buffer layer 182, a non-doped GaN layer 183, and an n-type AlGaN layer 184 are formed over a semi-insulating SiC substrate 181 with a thickness of approximately 150 μm, for example. Although the semi-insulating SiC substrate 181 is used as a substrate in the fifth embodiment, for example, a GaN substrate, an AlN substrate, or the like may be used instead. The non-doped GaN layer 183 and the n-type AlGaN layer 184 include inactive regions 185 and 186 for inactivating a 2DEG. In the fifth embodiment, the buffer layer 182, the non-doped GaN layer 183, and the n-type AlGaN layer 184 are referred to as a compound semiconductor layer.

A source electrode 187, a gate electrode 188, a drain electrode (not illustrated), a common gate wiring line 189, a gate terminal 190, a source terminal 191, and a drain terminal 192 are formed over the n-type AlGaN layer 184.

For example, a SiN layer is formed over the n-type AlGaN layer 184 as a passivation film 193. The gate electrode 188 and the common gate wiring line 189 are covered with the passivation film 193.

The source electrode 187 is electrically coupled to a source wiring line 195 through a seed metal layer 194. The drain electrode (not illustrated) is electrically coupled to a drain wiring line 196 through a seed metal layer (not illustrated). The semiconductor device according to the fifth embodiment includes a plurality of sets of the elements described above.

In the back surface of the semi-insulating SiC substrate 181, a common source wiring line 197 is formed to be buried through a seed metal layer 198, and a common drain wiring line 199 is formed to be buried through a seed metal layer 200.

The common source wiring line 197 is electrically coupled to the source wiring lines 195 and the source electrodes 187 through vias 201 and 202. The common drain wiring line 199 is electrically coupled to the drain wiring lines 196 and the drain electrodes (not illustrated) through vias 203 and 204.

The via 201 is coupled to the common source wiring line 197 and is formed in a via hole provided in the semi-insulating SiC substrate 181 so that the via 201 is buried through the seed metal layer 198. The via 202 is formed over the via 201 and in a via hole that passes through the compound semiconductor layer and the passivation film 193 so that the via 202 is buried through a seed metal layer 205.

The via 203 is coupled to the common drain wiring line 199 and is formed in a via hole provided in the semi-insulating SiC substrate 181 so that the via 203 is buried through the seed metal layer 200. The via 204 is formed over the via 203 and in a via hole that passes through the compound semiconductor layer and the passivation film 193 so that the via 204 is buried through a seed metal layer 206.

The common source wiring line 197 is coupled to the source terminal 191 through vias 207 and 208. The via 207 is coupled to the common source wiring line 197 and is formed in a via hole provided in the semi-insulating SiC substrate 181 so that the via 207 is buried through the seed metal layer 198. The via 208 is formed over the via 207 and in a via hole that passes through the compound semiconductor layer and the passivation film 193 so that the via 208 is buried through a seed metal layer 209.

The common drain wiring line 199 is coupled to the drain terminal 192 through vias 210 and 211. The via 210 is coupled to the common drain wiring line 199 and is formed in a via hole provided in the semi-insulating SiC substrate 181 so that the via 210 is buried through the seed metal layer 200. The via 211 is formed over the via 210 and in a via hole that passes through the compound semiconductor layer and the passivation film 193 so that the via 210 is buried through a seed metal layer 212.

When the vias 207 and 208 coupled to the common source wiring line 197, and the vias 210 and 211 coupled to the common drain wiring line 199 are provided, electric signals of the common source wiring line 197 and the common drain wiring line 199 may be output to the surface on which the compound semiconductor layer is formed. This configuration enables the electric signals to be readily output to the outside using a wire for example.

A method of manufacturing the semiconductor device according to the fifth embodiment is described below with reference to FIGS. 13AA to 13AZ, and 13BA to 13BL.

Figure 13A:
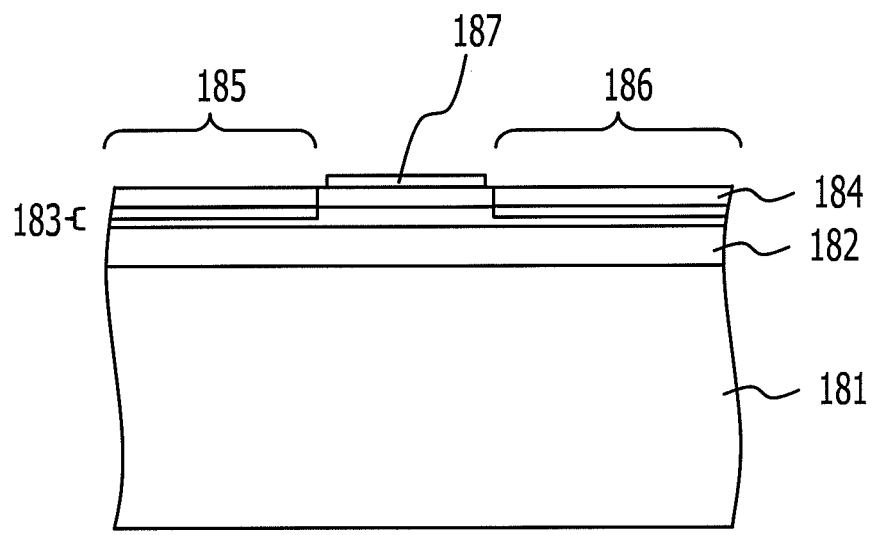
FIGS. 13AA to 13AZ, and 13BA to 13BL are sectional process views illustrating an example of a method of manufacturing the semiconductor device according to the fifth embodiment.
Figure 13A:
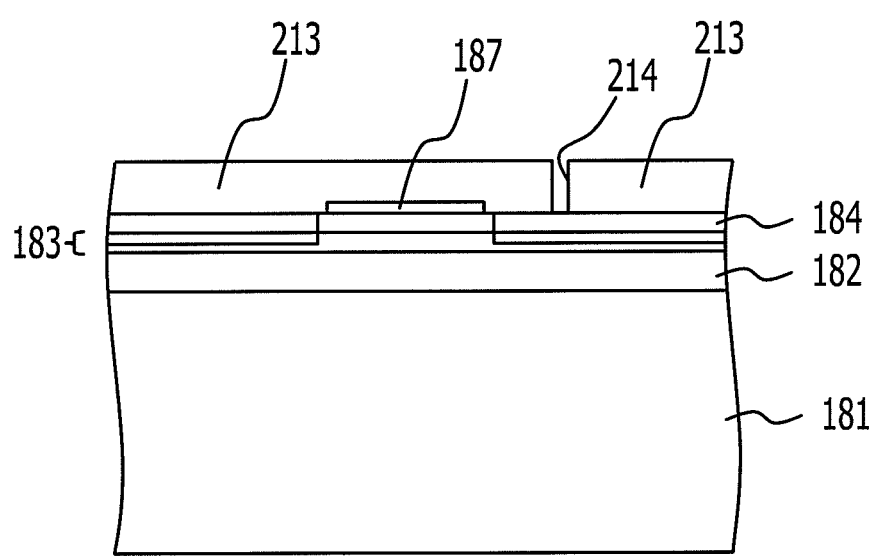
Figure 13A:
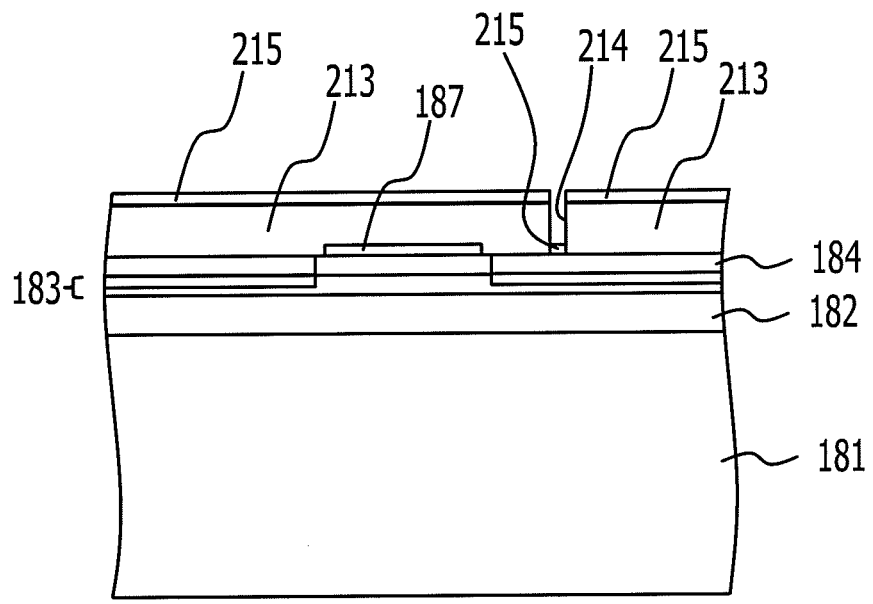
Figure 13A:
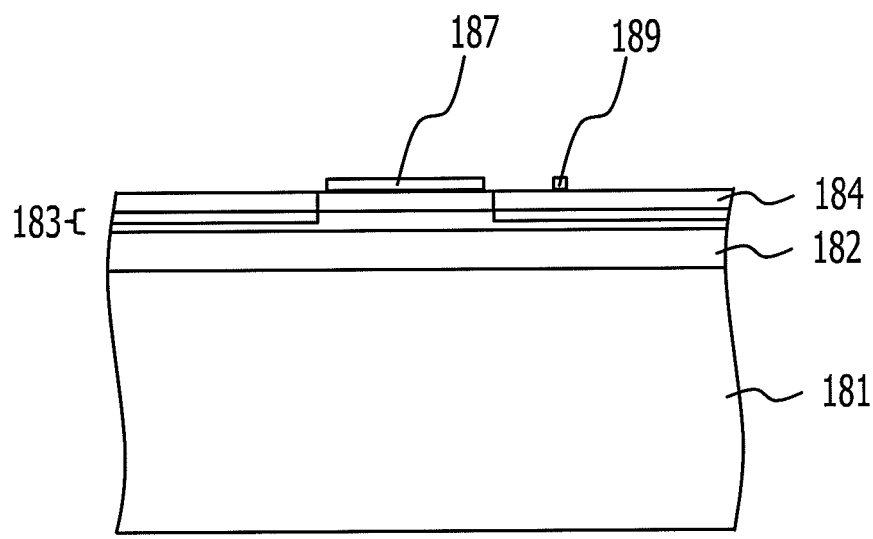
Figure 13A:
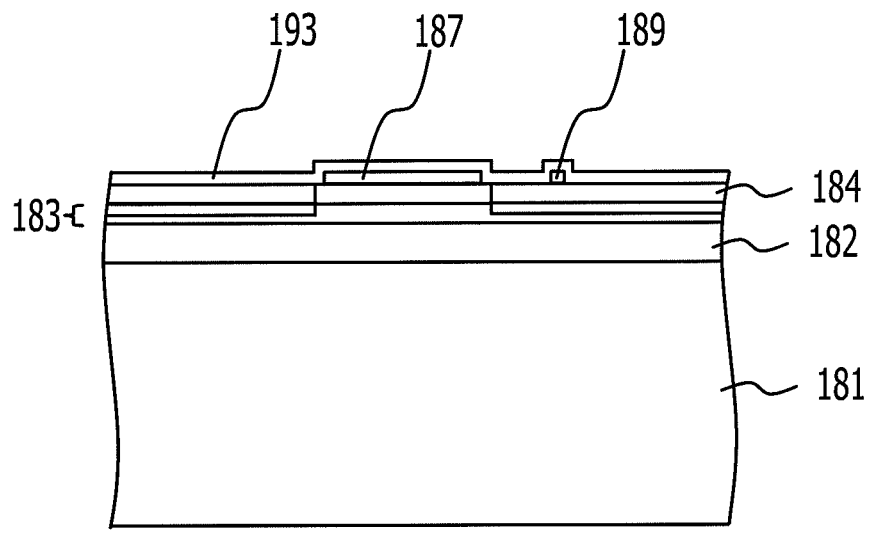
Figure 13A:
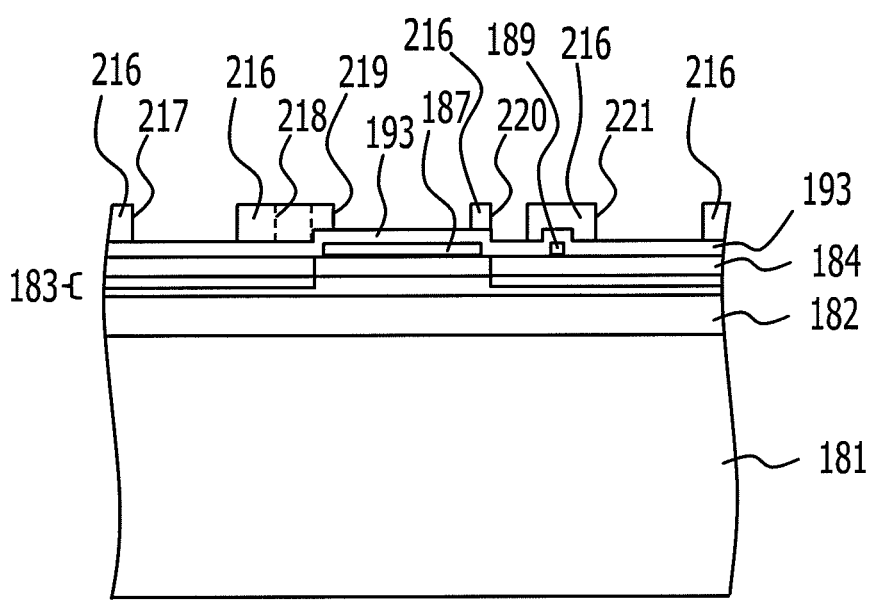
Figure 13A:
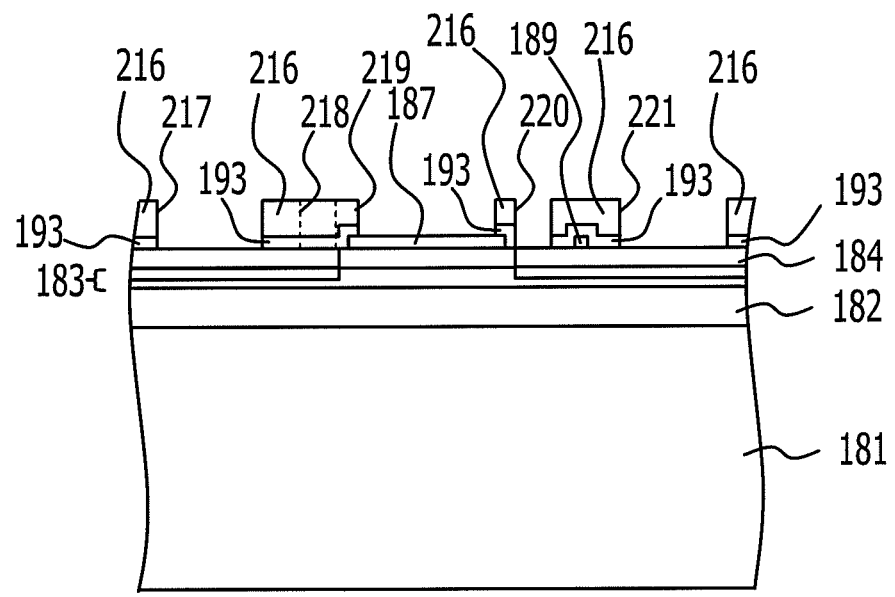
Figure 13A:
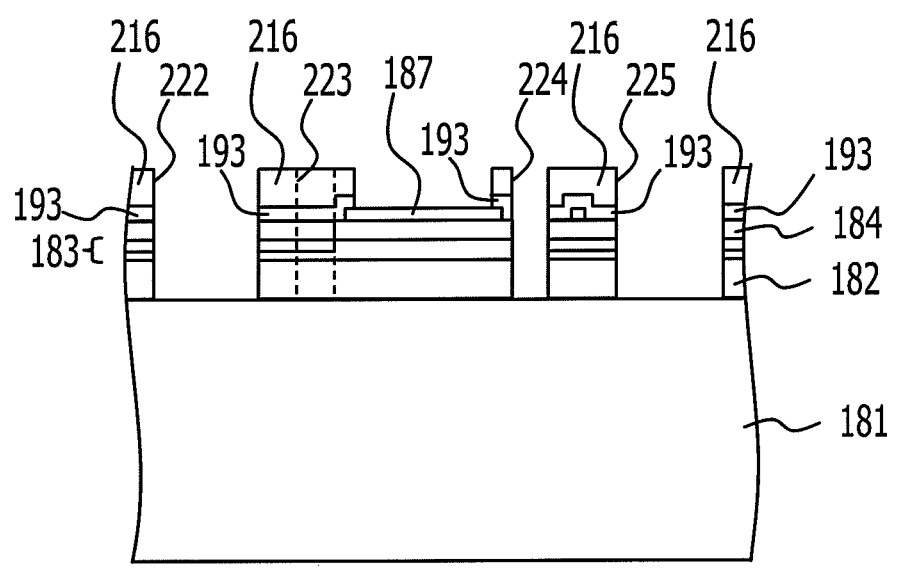
Figure 13A:
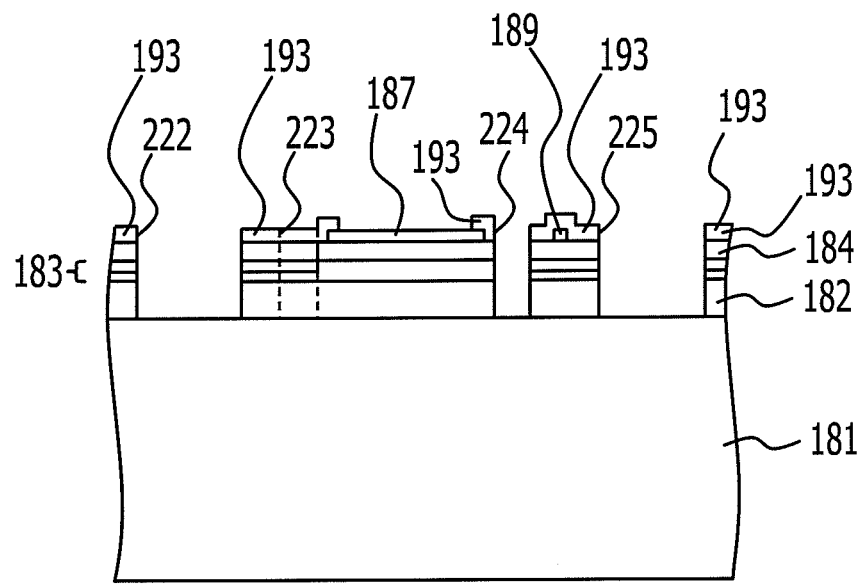
Figure 13A:
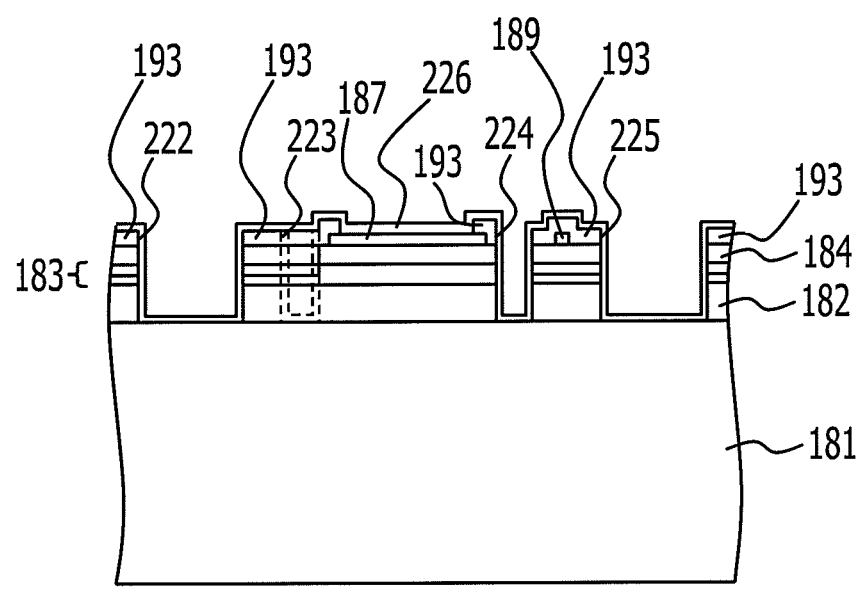
Figure 13A:
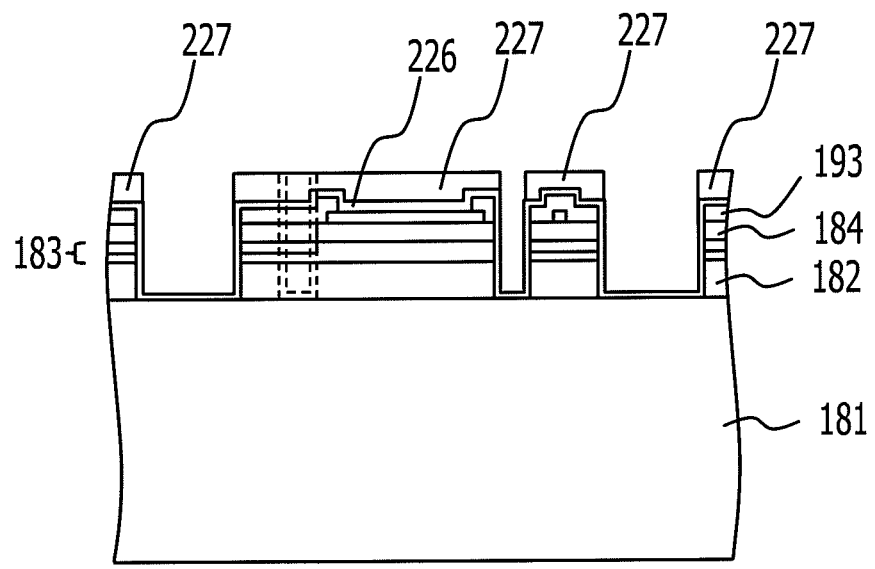
Figure 13A:
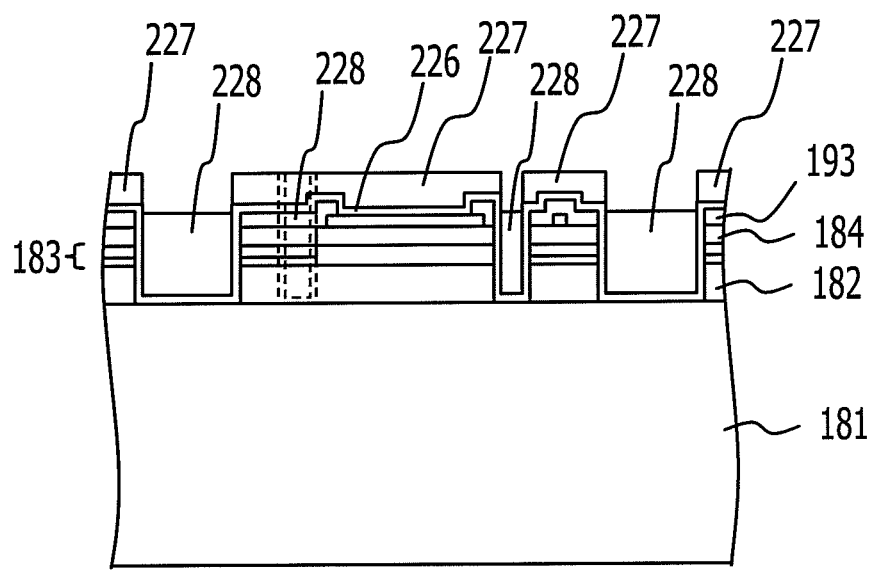
Figure 13A:
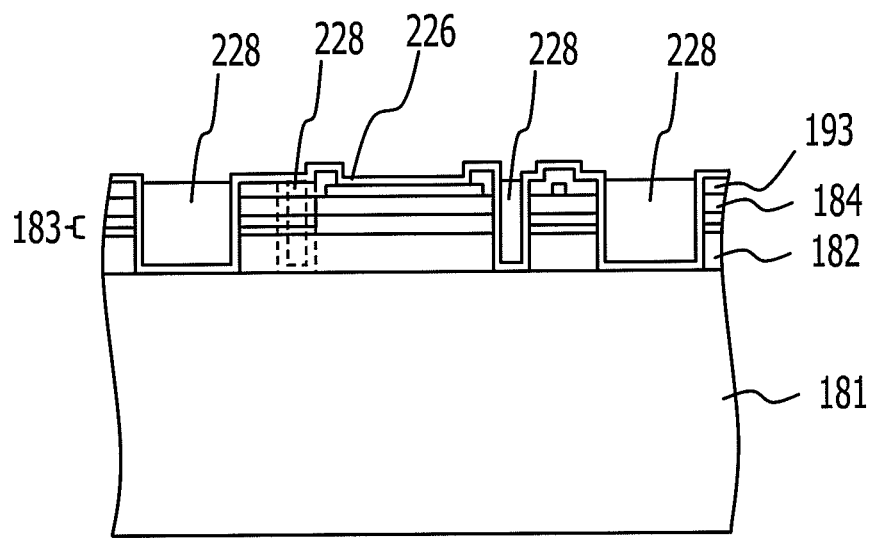
Figure 13A:
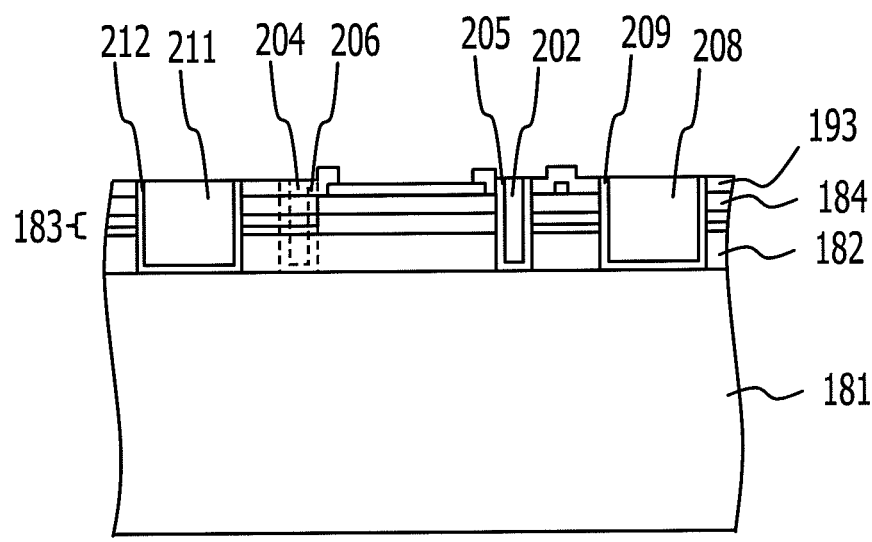
Figure 13A:
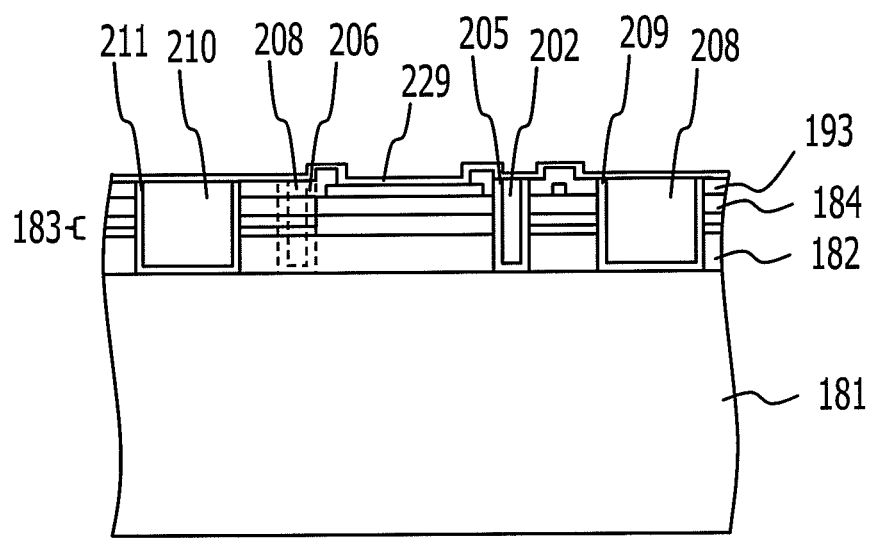
Figure 13A:
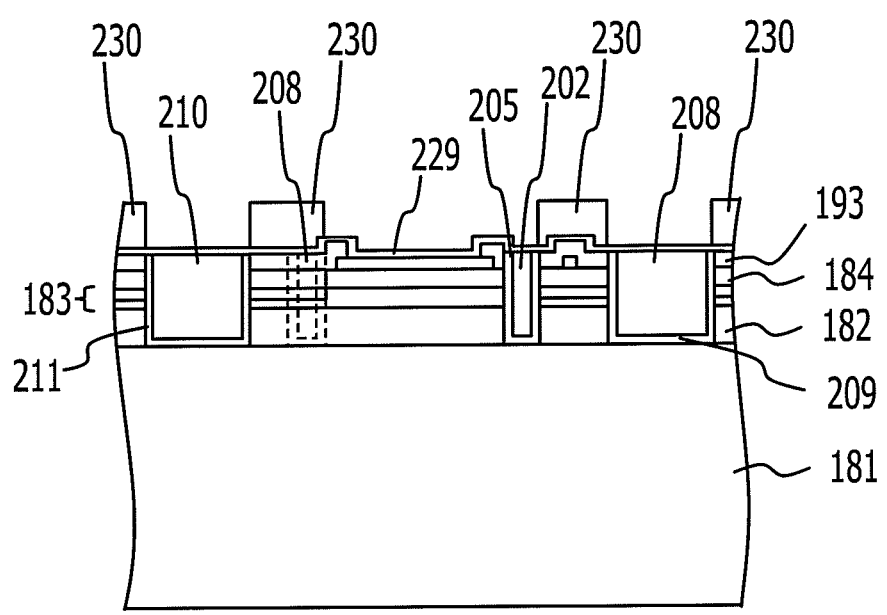
Figure 13A:
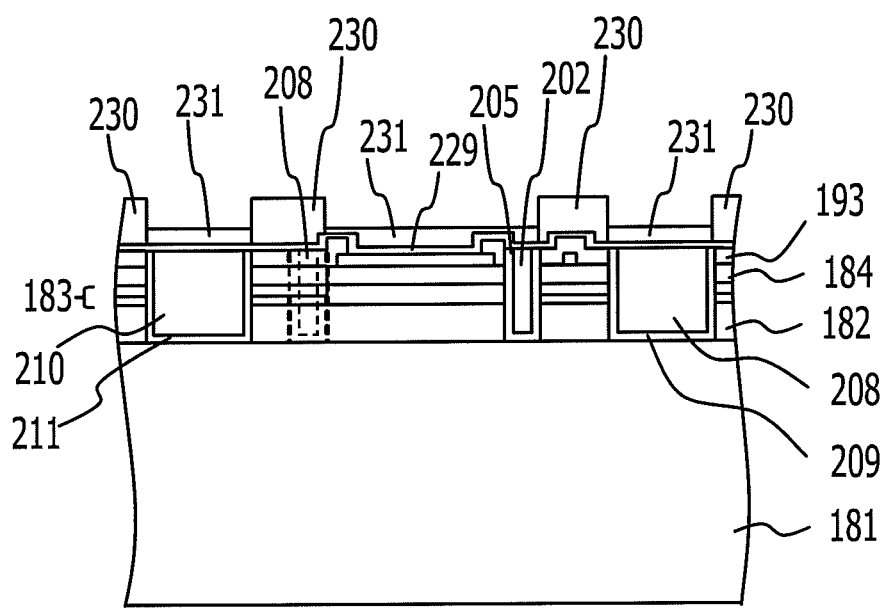
Figure 13A:
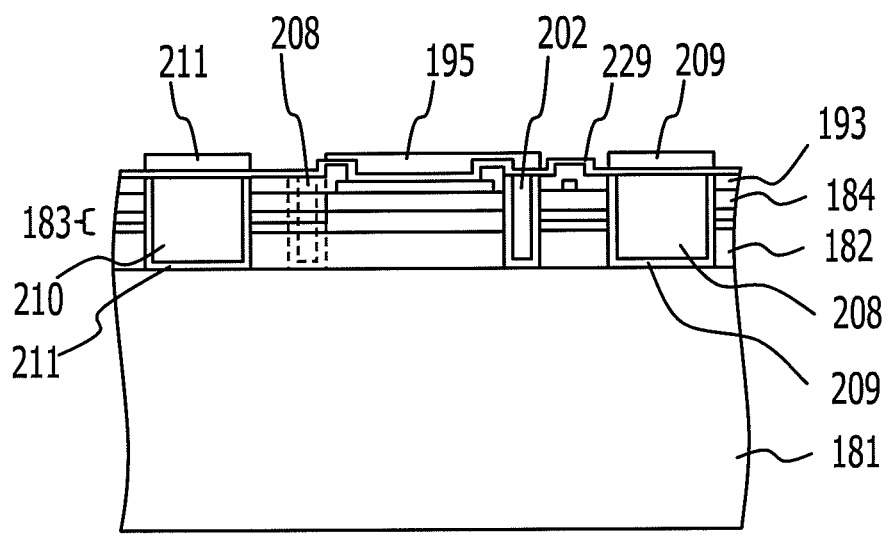
Figure 13A:
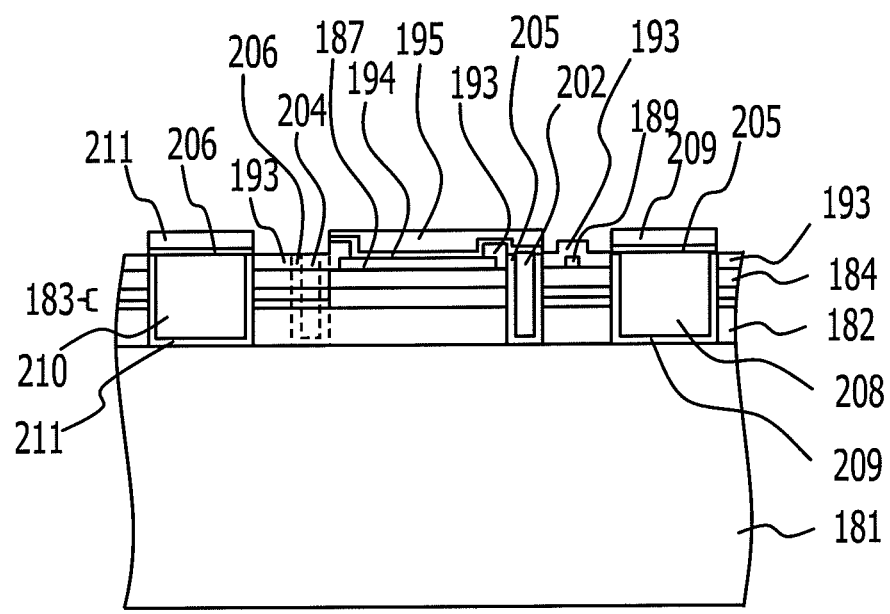
Figure 13A:
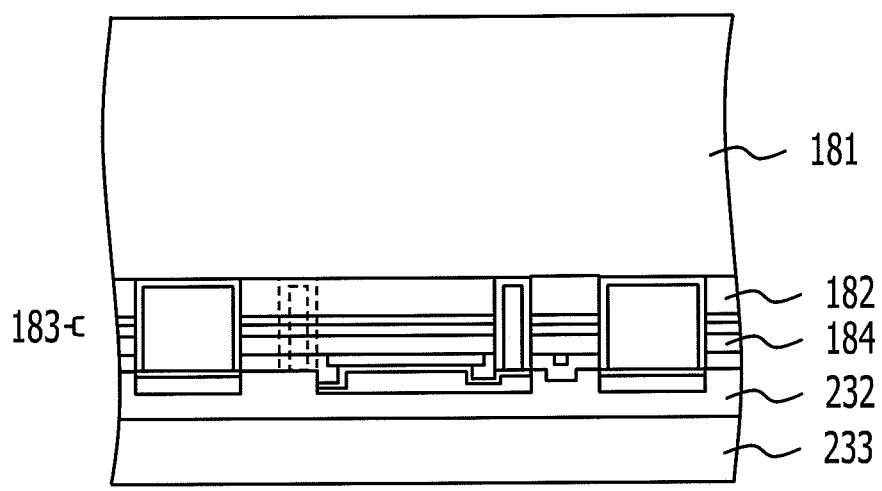
Figure 13A:
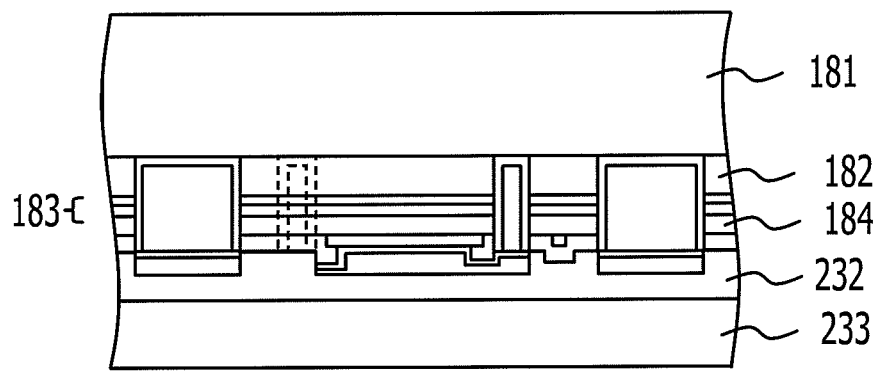
Figure 13A:
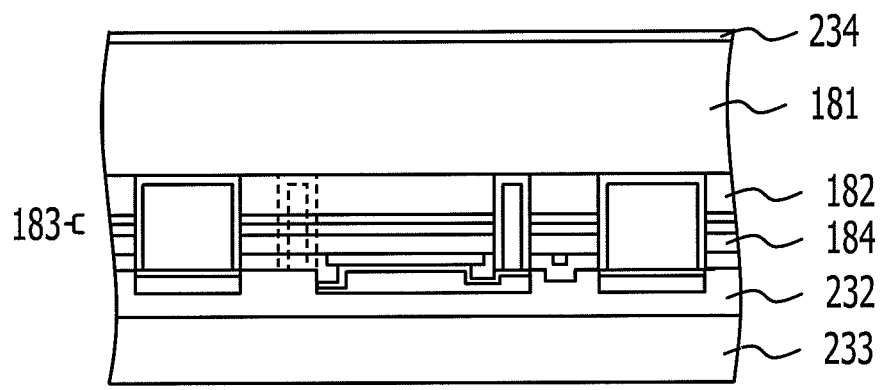
Figure 13A:
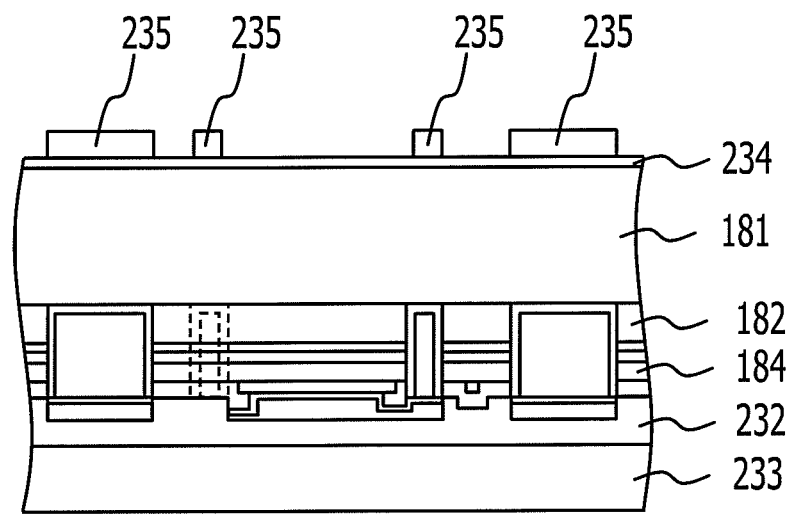
Figure 13A:
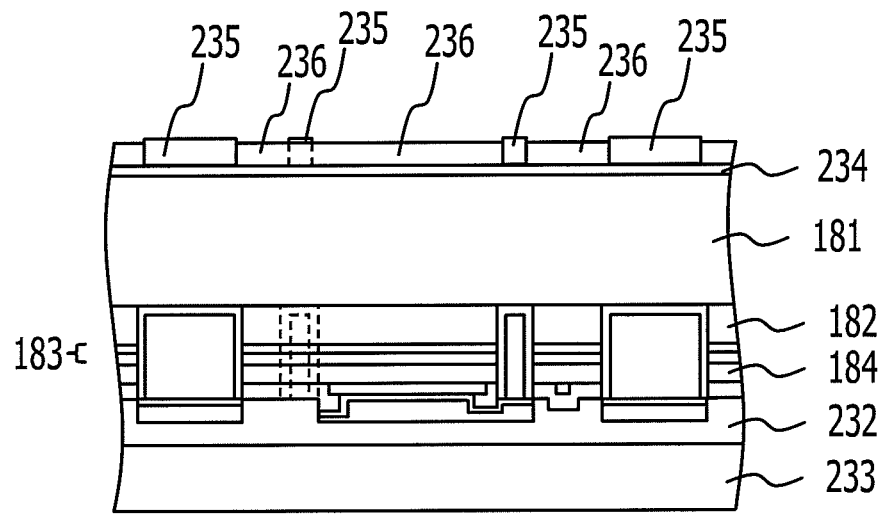
Figure 13A:
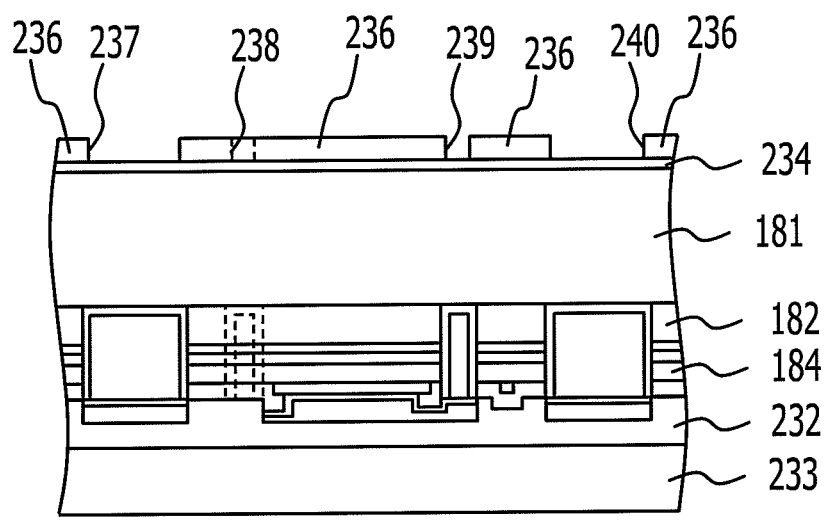
Figure 13A:
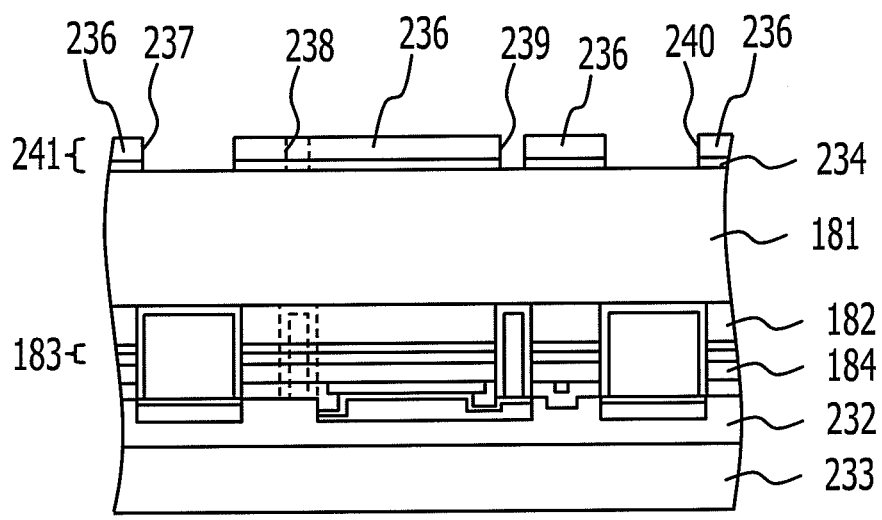

FIGS. 13AA to 13AZ, and 13BA to 13BL are illustrated based on the section D-D' in FIG. 12B. Elements that may not appear on the section D-D' due to the locations of the elements that include the gate electrode 190, the drain wiring line 196, the drain electrode, and the electrode pads, are not depicted in FIGS. 13AA to 13AZ, and 13BA to 13BL.

In the fifth embodiment, the semi-insulating SiC substrate 181 with a thickness of approximately 350 μm is prepared as a substrate.

As illustrated in FIG. 13AA, for example, the processes illustrated in FIGS. 3AA to 3AF of the first embodiment are performed before the compound semiconductor layer and the source electrode 187 are formed over the semi-insulating SiC substrate 181.

After that, as illustrated in FIG. 13AB, a resist mask 213 that includes an opening 214 is formed on the n-type AlGaN layer 184 and in locations corresponding to the gate electrode 188, the common gate wiring line 189, and the gate terminal 190. The opening 214 is provided in the location corresponding to the common gate wiring line 189.

After that, as illustrated in FIGS. 13AC and 13AD, a deposition film 215 is formed on the upper surface of a resist mask 213 and the bottom surface of the opening 214 by applying Ni and Au using deposition and lift-off techniques so that, for example the Ni layer of the deposition film 215 has a thickness of approximately 100 nm and the Au layer of the deposition film 215 has a thickness of approximately 400 nm. When the resist mask 213 is removed, the deposition film 215 formed on the bottom surface of the opening 214 is left as the gate electrode 188, the common gate wiring line 189, and the gate terminal 190.

After that, as illustrated in FIG. 13AE, a SiN layer is formed by plasma CVD on the n-type AlGaN layer 184 as the passivation film 193 so that the SiN layer has a thickness of approximately 500 nm and covers the source electrode 187, the gate electrode 188, the common gate wiring line 189, the gate terminal 190, and the drain electrode (not illustrated).

After that, as illustrated in FIG. 13AF, a resist mask 216 that includes openings 217 to 221 is formed in regions corresponding to the source electrode 187, the vias 202, 204, 208, and 210, and the drain electrode. The opening 217 is provided in the location corresponding to the via 210. The opening 218 is provided in the location corresponding to the via 204. The opening 219 is provided in the location corresponding to the source electrode 187. The opening 220 is provided in the location corresponding to the via 202. The opening 221 is provided in the location corresponding to the via 208.

After that, as illustrated in FIG. 13AG, the passivation film 193 exposed through the openings 217 to 221 is removed by dry etching using the resist mask 216 so that the n-type AlGaN layer 184, the source electrode 187, and the drain electrode are exposed.

After that, as illustrated in FIG. 13AH, the compound semiconductor layer is selectively removed by dry etching to form via holes 222 to 225. The semi-insulating SiC substrate 181 serves as the bottom surfaces of the via holes 222 to 225. For example, a $Cl_2$ gas may be used for the dry etching.

After that, the resist mask 216 is removed as illustrated in FIG. 13AI.

After that, as illustrated in FIG. 13AJ, a seed metal layer 226 is formed on the exposed surfaces of the passivation film 193, the source electrode 187, and the drain electrode and on the inner walls of the via holes 222 to 225 by applying Ti and Cu by sputtering so that the Ti layer of the seed metal layer 226 has a thickness of approximately 50 nm and the Cu layer of the seed metal layer 226 has a thickness of approximately 1 μm, for example.

After that, as illustrated in FIG. 13AK, a resist mask 227 that includes openings located in regions corresponding to the via holes 222 to 225 is formed on the seed metal layer 226.

After that, as illustrated in FIG. 13AL, a Ni layer 228 is formed on the seed metal layer 226 by plating for example so that the Ni layer 228 has a thickness of approximately 2 μm.

After that, as illustrated in FIG. 13AM, the resist mask 227 is removed. After that, as illustrated in FIG. 13AN, the seed metal layer 226 that is exposed is removed, for example, by ion milling. Thus, the vias 202, 204, 208, and 211 are formed.

After that, as illustrated in FIG. 13AO, a seed metal layer 229 is formed on the exposed surfaces of the passivation film 193, the source electrode 187, the vias 202, 204, 208, and 211, and the drain electrode by applying Ti, Pt, and Au by sputtering so that the Ti layer of the seed metal layer 229 has a thickness of approximately 10 nm, the Pt layer of the seed metal layer 229 has a thickness of approximately 50 nm, and the Au layer of the seed metal layer 229 has a thickness of approximately 200 nm, for example.

After that, as illustrated in FIG. 13AP, a resist mask 230 that includes openings located in regions corresponding to the source wiring line 195, the drain wiring line 196, and the vias 202, 204, 208, and 211 is formed on the seed metal layer 229.

After that, as illustrated in FIG. 13AQ, an Au film 231 is formed by plating, for example, so that the Au film 231 has a thickness of approximately 6 μm.

After that, as illustrated in FIG. 13AR, when the resist mask 230 is removed, the Au film 231 formed on the bottom surface of the openings of the resist mask 230 becomes the source wiring line 195, the drain wiring line 196, the source terminal 191, and the drain terminal 192.

After that, the exposed seed metal layer 229 is removed by ion milling, for example, as illustrated in FIG. 13AS.

Thus, the semi-insulating SiC substrate 181 that includes the source wiring line 195 and the drain wiring line 196 may be manufactured.

After that, as illustrated in FIG. 13AT, the semi-insulating SiC substrate 181 is attached to a support substrate 233 using, for example, an adhesive 232 so that the surface on which the compound semiconductor layer is formed faces the support substrate 233. For example, a sapphire substrate may be used as the support substrate 233. Since the semiconductor device is separated from the support substrate 233 after being manufactured, the adhesive 232 is preferably a thermoplastic adhesive.

After that, as illustrated in FIG. 13AU, the back surface of the semi-insulating SiC substrate 181, that is, the surface opposite to the surface on which the compound semiconductor layer is formed, is thinned by polishing, for example. The thickness of the thinned semi-insulating SiC substrate 181 is, for example, approximately 150 μm.

After that, as illustrated in FIG. 13AV, a seed metal layer 234 is formed on the back surface of the semi-insulating SiC substrate 181 by applying Ti and Cu by sputtering so that the Ti layer of the seed metal layer 234 has a thickness of approximately 20 nm and the Cu layer of the seed metal layer 234 has a thickness of approximately 300 nm, for example. After that, as illustrated in FIG. 13AW, a resist mask 235 is formed to cover the regions corresponding to the vias 201, 203, 207, and 210.

As illustrated in FIG. 13AX, a Ni layer 236 is formed on the seed metal layer 234 by plating, for example, so that the Ni layer 236 has a thickness of approximately 2 μm. After that, when the resist mask 235 is removed, openings 237 to 240 are formed as illustrated in FIG. 13AY.

After that, when part of the seed metal layer 234, which is exposed through the openings 237 to 240, is removed by ion milling for example, a metal mask 241 for forming via holes is formed as illustrated in FIG. 13AZ.

Figure 13B:
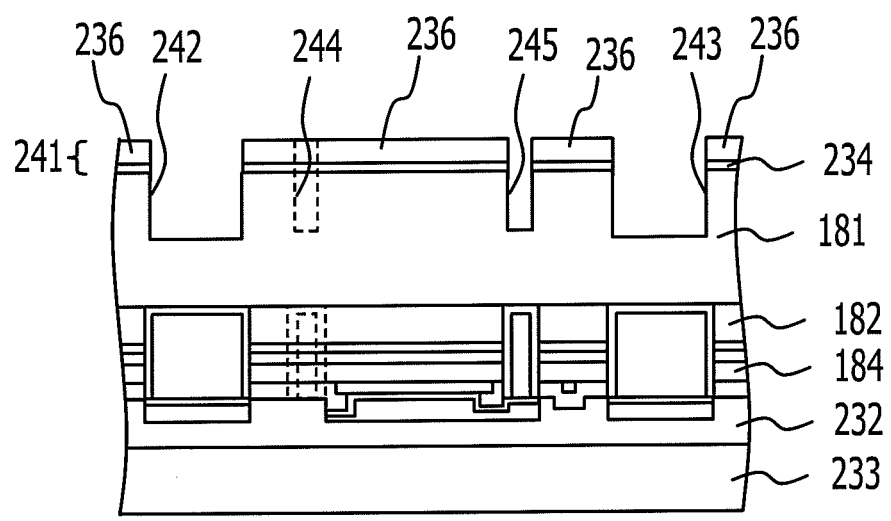
Figure 13B:
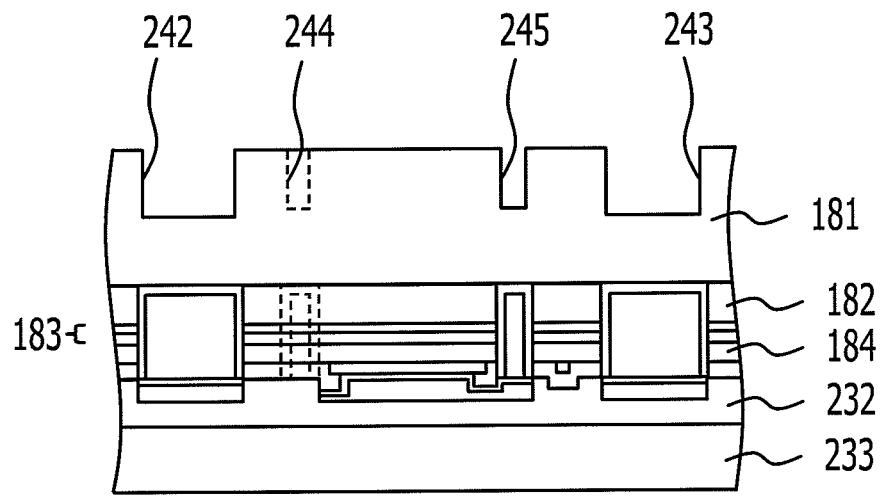
Figure 13B:
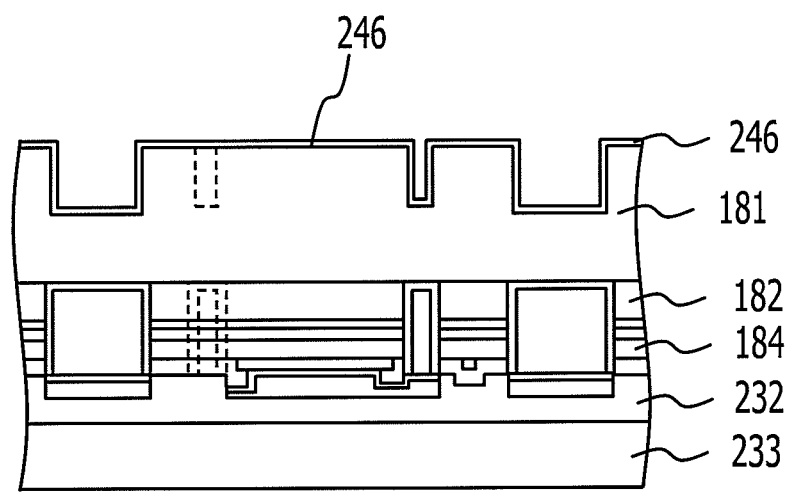
Figure 13B:
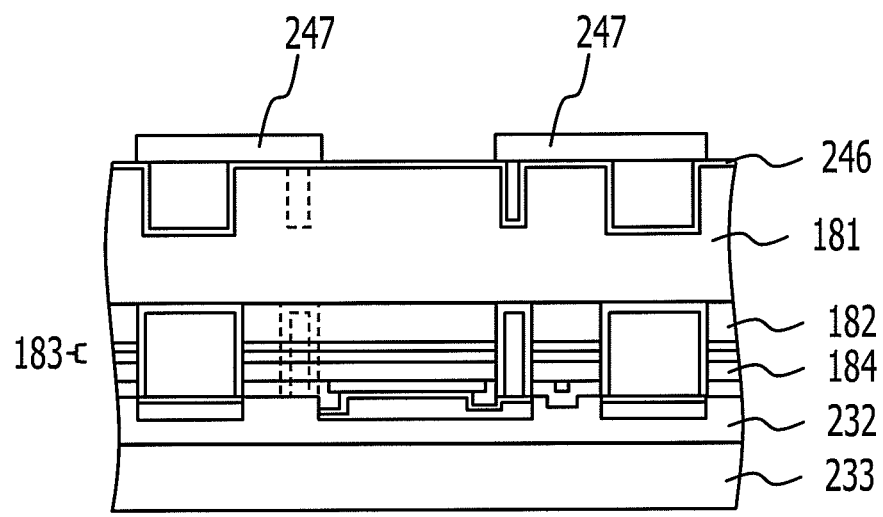
Figure 13B:
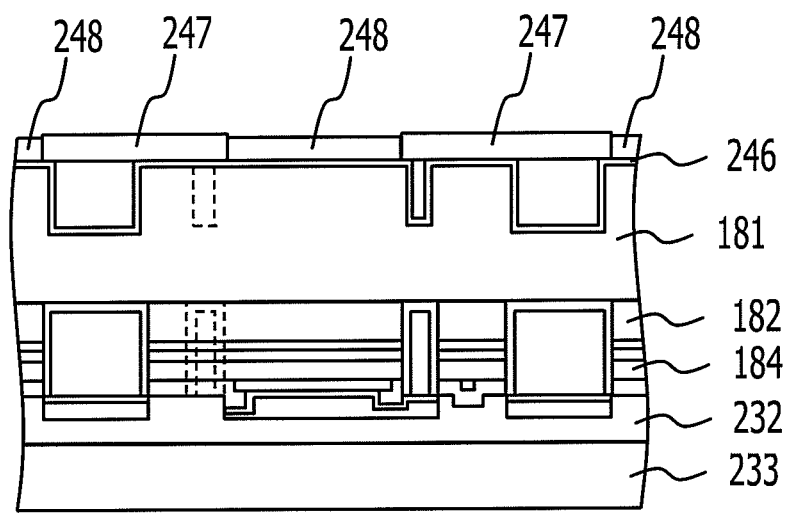
Figure 13B:
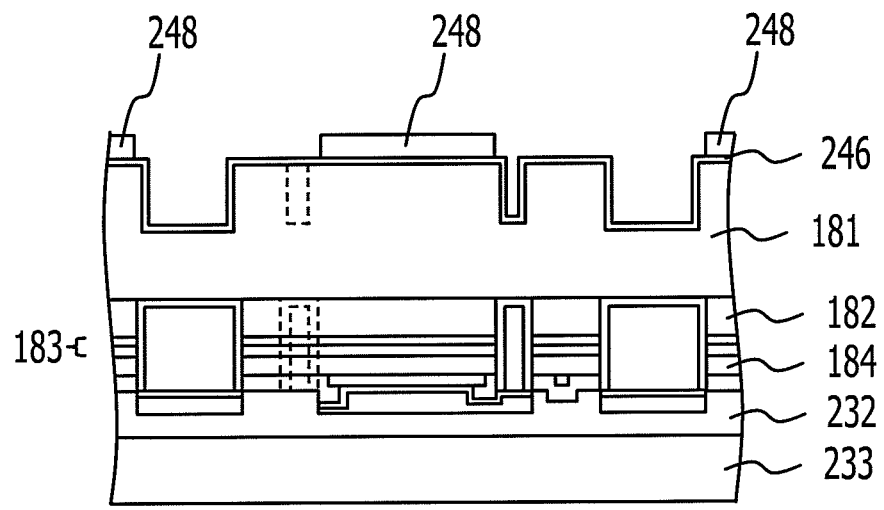
Figure 13B:
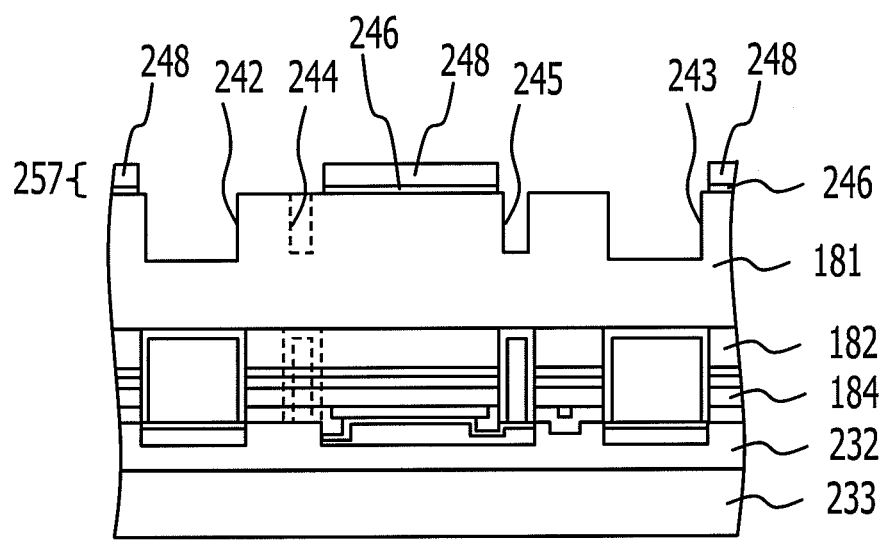
Figure 13B:
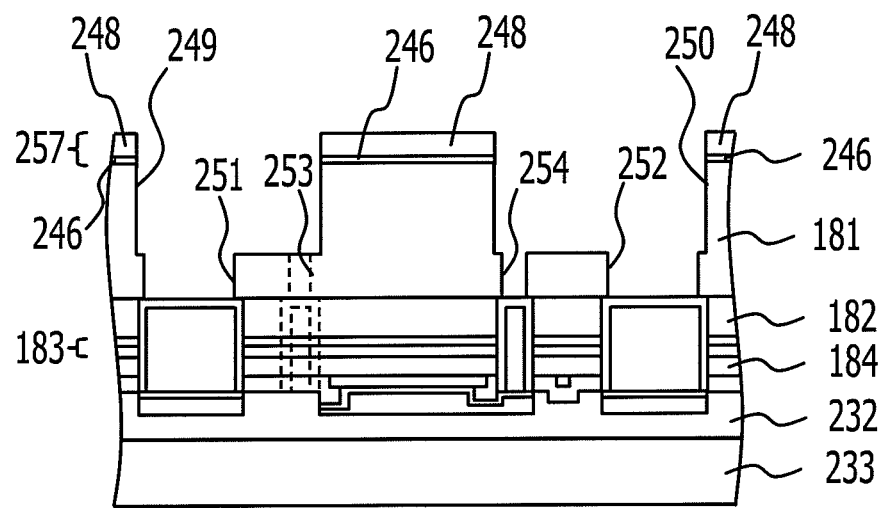
Figure 13B:
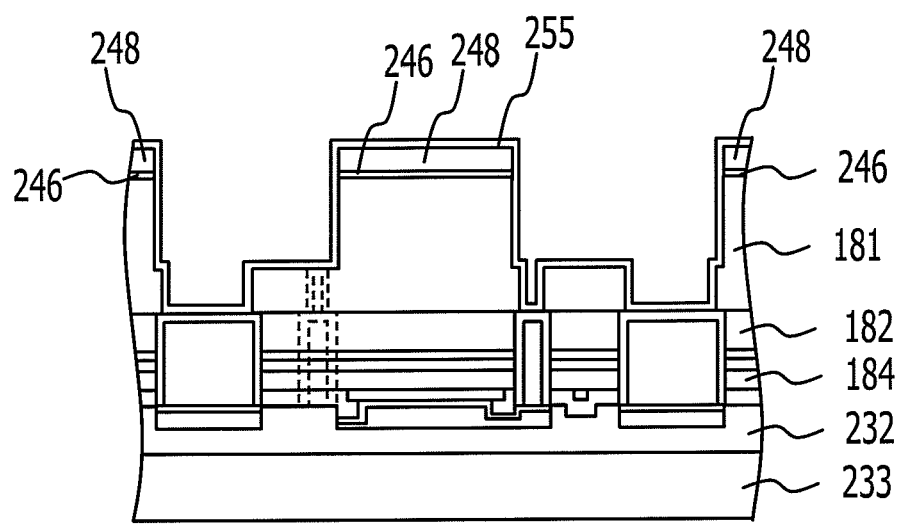
Figure 13B:
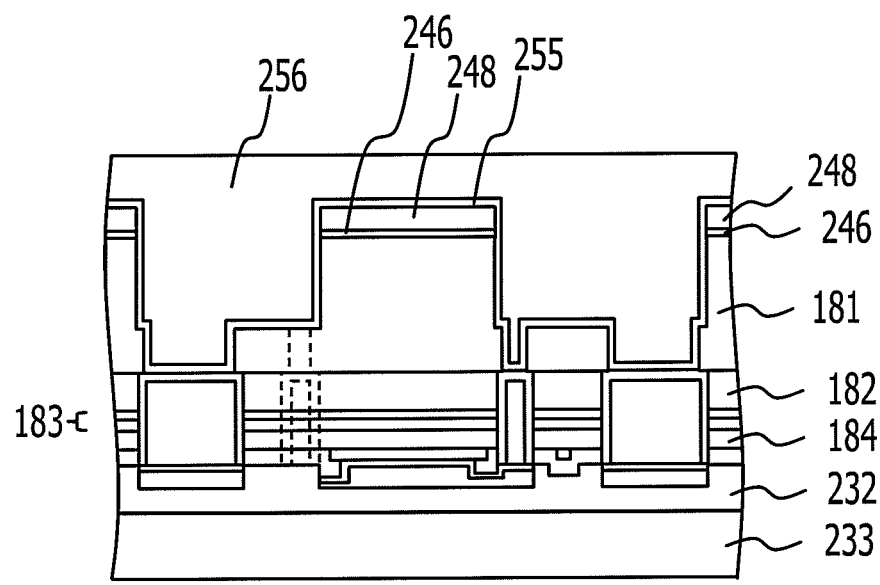
Figure 13B:
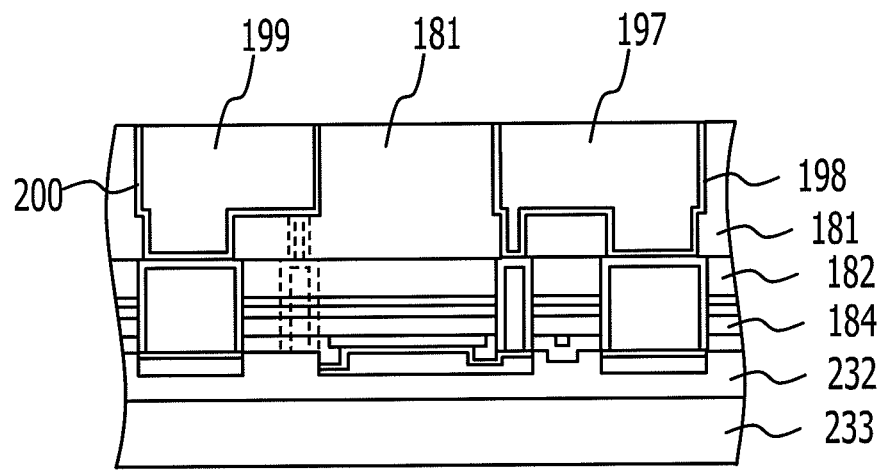
Figure 13B:
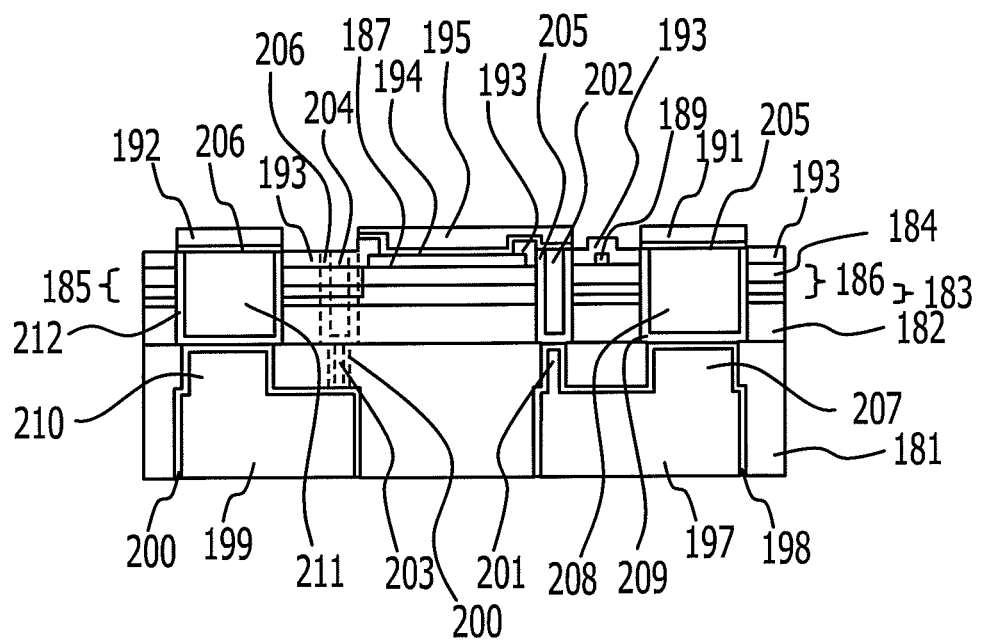

After that, as illustrated in FIG. 13BA, the metal mask 241 is used to form trenches 242 and 243, and via holes 244 and 245 by dry etching using a mixed gas of $SF_6$ and $O_2$, for example. For example, the opening size of each of the trenches 242 and 243 is approximately 100 μm×100 μm. For example, the diameter of each of the via holes 244 and 245 is approximately 20 μm. For example, each of the depths of the trenches 242 and 243 from the back surface of the semi-insulating SiC substrate 181 is approximately 70 μm. For example, each of the depths of the via holes 244 and 245 from the back surface of the semi-insulating SIC substrate 181 is approximately 60 μm.

After that, as illustrated in FIG. 13BB, the metal mask 241 is removed, for example, using a mixture of sulfuric acid and hydrogen peroxide solution.

After that, as illustrated in FIG. 13BC, a seed metal layer 246 is formed on the back surface of the semi-insulating SIC substrate 181, on the inner walls of the trenches 242 and 243, and on the inner walls of the via holes 244 and 245 by applying Ti and Cu by sputtering, for example, so that the Ti layer of the seed metal layer 246 has a thickness of approximately 20 nm and the Cu layer of the seed metal layer 246 has a thickness of approximately 300 nm.

After that, as illustrated in FIG. 13BD, a resist mask 247 is formed to cover the regions corresponding to the common drain wiring line 197 and the common source wiring line 199.

After that, as illustrated in FIG. 13BE, a Ni layer 248 is formed on the seed metal layer 246 by plating, for example, so that the Ni layer 248 has a thickness of approximately 2 μm. After that, the resist mask 247 is removed as illustrated in FIG. 13BF.

After that, the Cu layer of the seed metal layer 246 is removed by wet etching using an ammonium persulfate solution, for example. Since the solution used for the wet etching may readily permeate into the inner walls of the trenches 242 and 243 and the via holes 244 and 245, the wet etching may remove the Cu layer formed on the inner walls of the trenches 242 and 243 and the via holes 244 and 245 more effectively than by ion milling.

After that, the Ti layer of the seed metal layer 246 is removed by dry etching using, for example, a $SF_6$ gas. When the Ti layer is removed, a metal mask 257 used for forming the common drain wiring line 197 and the common source wiring line 199 is formed. Dry etching using a $SF_6$ gas may selectively remove the Ti layer while suppressing etching of the Ni layer.

After that, as illustrated in FIG. 13BH, the metal mask 257 is used to form trenches 249 and 250 by dry etching using a mixed gas of $SF_6$ and $O_2$, for example. Each of the depths of the trenches 249 and 250 from the back surface of the semi-insulating SiC substrate 181 is approximately 100 μm.

When the trenches 242 and 243 are formed, the bottom surfaces of the trenches 242 and 243, and the via holes 244 and 245, which have been formed in advance, are etched. As a result, the trench 242 becomes a via hole 251 and the via 211 serves as the bottom surface of the via hole 251, and the trench 243 becomes a via hole 252 and the via 208 serves as the bottom surface of the via hole 252. The via hole 244 becomes a via hole 253 and the via 204 serves as the bottom surface of the via hole 253, and the via hole 245 becomes a via hole 254 and the via 202 serves as the bottom surface of the via hole 254.

After that, as illustrated in FIG. 13BI, a seed metal layer 255 is formed on the metal mask 257, on the inner walls of the trenches 249 and 250, and on the inner walls of the via holes 251 to 254 by applying Ti and Cu by sputtering so that the Ti layer of the seed metal layer 255 has a thickness of approximately 50 nm and the Cu layer of the seed metal layer 255 has a thickness of approximately 1 μm for example.

After that, as illustrated in FIG. 13BJ, a Cu layer 256 is formed on the seed metal layer 255 by plating for example.

After that, as illustrated in FIG. 13BK, the surface of the semi-insulating SiC substrate 181 on which the Cu layer 256 is formed is polished by CMP for example so that the semi-insulating SiC substrate 181 is exposed. As a result of the polishing, the common drain wiring line 199 buried in the trench 249, and the common source wiring 197 buried in the trench 250 are formed in the semi-insulating SiC substrate 181.

After that, the support substrate 233 is heated and the compound semiconductor layer is separated from the support substrate 233. After that, when the support substrate 233 left on the compound semiconductor layer is removed using organic solvent, the semiconductor device illustrated in FIG. 13BL may be obtained.

Although the embodiments of the present application are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A semiconductor device comprising:
    a compound semiconductor layer provided over a substrate;
    a plurality of source electrodes and a plurality of drain electrodes provided over the compound semiconductor layer;
    a plurality of first vias each of which is configured to pass through the compound semiconductor layer and be coupled to a corresponding one of the plurality of source electrodes;
    a plurality of second vias each of which is configured to pass through the compound semiconductor layer and be coupled to a corresponding one of the plurality of drain electrodes;
    a common source wiring line configured to be coupled to the plurality of first vias and be buried in the substrate; and
    a common drain wiring line configured to be coupled to the plurality of second vias and be buried in the substrate.

2. The semiconductor device according to claim 1, wherein the substrate includes one of SiC, GaN, AlN, and Si.

3. The semiconductor device according to claim 1, wherein the compound semiconductor layer includes a nitride semiconductor.

4. The semiconductor device according to claim 1, wherein the compound semiconductor layer includes a buffer layer, a channel layer, and an electron supply layer.

5. The semiconductor device according to claim 1, wherein each of the source electrode and the drain electrode is a multilayer film that includes Ti and Al.

6. The semiconductor device according to claim 1, wherein each of the common source wiring line and the common drain wiring line includes Cu.

7. The semiconductor device according to claim 1, further comprising:
    a third via configured to pass through the compound semiconductor layer and be coupled to at least one of the common source wiring line and the common drain wiring line; and
    an extraction electrode provided over the compound semiconductor layer and configured to be coupled to the third via.

8. The semiconductor device according to claim 7, wherein the third via includes:
    a stopper configured to pass through the compound semiconductor layer and be coupled to the extraction electrode; and
    a fourth via configured to be coupled to the stopper, pass through the substrate, and be coupled to at least one of the common source wiring line and the common drain wiring line.

9. The semiconductor device according to claim 1, wherein the substrate includes a first wiring trench and a second wiring trench located away from the first wiring trench, wherein
    the common source wiring line is buried in the first wiring trench, and
    the common drain wiring line is buried in the second wiring trench.

10. The semiconductor device according to claim 1, wherein
    the source electrode is coupled to a source wiring line provided over the source electrode,
    the source wiring line is coupled to the first via,
    the drain electrode is coupled to a drain wiring line provided over the drain electrode, and
    the drain wiring line is coupled to the second via.

11. The semiconductor device according to claim 1, further comprising:
    a heat release plate configured to face the common source wiring line and the common drain wiring line.

12. The semiconductor device according to claim 11, wherein
    the heat release plate includes AlN.

13. The semiconductor device according to claim 1, further comprising:
    an insulation film configured to cover the substrate, the common source wiring line, and the common drain wiring line.

14. The semiconductor device according to claim 13, wherein
    the insulation film includes one of AlN, AlSiC, and SiC.

* * * * *